US012751291B2

(12) United States Patent
Yokomizo

(10) Patent No.: US 12,751,291 B2
(45) Date of Patent: Sep. 29, 2026

(54) SEMICONDUCTOR STRUCTURES INCLUDING AUXETIC MICROSTRUCTURES AND METHOD OF FORMING THE SAME

(71) Applicant: SANDISK TECHNOLOGIES LLC, Addison, TX (US)

(72) Inventor: Yushi Yokomizo, Yokkaichi (JP)

(73) Assignee: Sandisk Technologies, Inc., Milpitas, CA (US)

(*) Notice: Subject to any disclaimer, the term of this patent is extended or adjusted under 35 U.S.C. 154(b) by 1062 days.

(21) Appl. No.: 17/809,386

(22) Filed: Jun. 28, 2022

(65) Prior Publication Data

US 2023/0420388 A1 Dec. 28, 2023

(51) Int. Cl.

| | |
|---|---|
| ***H10B 43/27*** | (2023.01) |
| ***H10B 41/27*** | (2023.01) |
| ***H10W 42/00*** | (2026.01) |
| ***H10W 72/90*** | (2026.01) |
| ***H10W 90/00*** | (2026.01) |

(52) U.S. Cl.

CPC .......... *H10W 42/121* (2026.01); *H10B 41/27* (2023.02); *H10B 43/27* (2023.02); *H10W 90/00* (2026.01); *H10W 72/983* (2026.01); *H10W 90/792* (2026.01)

(58) Field of Classification Search

None

See application file for complete search history.

(56) References Cited

U.S. PATENT DOCUMENTS

| | | | | |
|---|---|---|---|---|
| 5,760,463 | A * | 6/1998 | Hato | H01L 23/49888 505/703 |
| 9,343,358 | B1 | 5/2016 | Xu | |
| 9,419,135 | B2 | 8/2016 | Baenninger et al. | |
| 9,455,267 | B2 | 9/2016 | Zhang et al. | |
| 9,698,223 | B2 | 7/2017 | Sharangpani et al. | |
| 9,768,192 | B1 | 9/2017 | Nakamura et al. | |
| 9,780,034 | B1 | 10/2017 | Tsutsumi et al. | |
| 9,799,671 | B2 | 10/2017 | Pachamuthu et al. | |
| 9,887,207 | B2 | 2/2018 | Zhang et al. | |
| 10,103,161 | B2 | 10/2018 | Ito et al. | |
| 10,242,994 | B2 | 3/2019 | Inomata et al. | |
| 10,355,012 | B2 | 7/2019 | Shimabukuro et al. | |
| 10,658,381 | B1 | 5/2020 | Yu et al. | |
| 10,790,296 | B1 | 9/2020 | Yamaha et al. | |
| 10,804,197 | B1 | 10/2020 | Kawasaki et al. | |
| 10,847,408 | B2 | 11/2020 | Makala et al. | |
| 10,854,513 | B2 | 12/2020 | Kawasaki et al. | |
| 10,854,573 | B2 | 12/2020 | Ji et al. | |

(Continued)

OTHER PUBLICATIONS

Yung Lee, A seamless auxetic substrate with a negative Poisson's ratio of −1, Aug. 2024, https://pubmed.ncbi.nlm.nih.gov/39169009/ , National Library of Medicine (Year: 2024).*

(Continued)

*Primary Examiner* — Jeff W Natalini
*Assistant Examiner* — Jacob Raul Marin
(74) *Attorney, Agent, or Firm* — THE MARBURY LAW GROUP PLLC

(57) ABSTRACT

A semiconductor structure includes a semiconductor device substrate, and an auxetic microstructure containing an auxetic matrix having a negative Poisson's ratio.

11 Claims, 47 Drawing Sheets

(56) References Cited

U.S. PATENT DOCUMENTS

| | | | |
|---|---|---|---|
| 11,069,631 | B2 | 7/2021 | Onuma |
| 11,114,406 | B2 | 9/2021 | Kanakamedala et al. |
| 11,199,562 | B2 | 12/2021 | Li et al. |
| 11,243,333 | B1 * | 2/2022 | Ouderkirk .......... G02B 27/0172 |
| 11,289,429 | B2 | 3/2022 | Shimamoto |
| 2012/0264273 | A1 * | 10/2012 | Kang ................... H10N 70/066 257/E21.004 |
| 2016/0049421 | A1 | 2/2016 | Zhang et al. |
| 2016/0086969 | A1 | 3/2016 | Zhang et al. |
| 2016/0141419 | A1 | 5/2016 | Baenninger et al. |
| 2016/0149002 | A1 | 5/2016 | Sharangpani et al. |
| 2016/0300848 | A1 | 10/2016 | Pachamuthu et al. |
| 2017/0148869 | A1 * | 5/2017 | Detalle .................. H10D 1/042 |
| 2017/0271261 | A1 | 9/2017 | Tsutsumi et al. |
| 2017/0271352 | A1 | 9/2017 | Nakamura |
| 2017/0316963 | A1 * | 11/2017 | Parkhe .............. H01L 21/67109 |
| 2017/0373087 | A1 | 12/2017 | Ito et al. |
| 2018/0006049 | A1 | 1/2018 | Inomata et al. |
| 2018/0374865 | A1 | 12/2018 | Shimabukuro et al. |
| 2019/0252405 | A1 * | 8/2019 | Tsutsumi ........... G11C 16/0466 |
| 2020/0071160 | A1 * | 3/2020 | Traynor .................. B32B 15/04 |
| 2020/0371382 | A1 * | 11/2020 | De Smet ............... G02F 1/1345 |
| 2020/0395407 | A1 * | 12/2020 | Takahashi ............ H10N 70/066 |
| 2020/0402992 | A1 * | 12/2020 | Otsu ...................... H10B 43/10 |
| 2021/0104472 | A1 | 4/2021 | Shimamoto |
| 2021/0272912 | A1 | 9/2021 | Wu et al. |
| 2021/0388500 | A1 | 12/2021 | Shimabukuro et al. |
| 2021/0388502 | A1 | 12/2021 | Shimabukuro et al. |

OTHER PUBLICATIONS

Czajkowski, M. et al., "Conformal elasticity of mechanism-based metamaterials," *Nature Communications*, vol. 13, No. 211, (2022); https://doi.org/10.1038/s41467-021-27825-0.

Dagdelen, J. et al. "Computational prediction of new auxetic materials," *Nat Commun*, vol. 8, No. 323, pp. 1-8, (2017); DOI:10.1038/s41467-017-00399-6.

Meena, K. et al., "A new auxetic structure with significantly reduced stress concentration effects," Materials and Design, vol. 173, pp. 1-11, (2019); DOI:10.1016/j.matdes.2019.107779.

Mir, M., et al., "Review of Mechanics and Applications of Auxetic Structures," Adv. in Materials Science and Engineering, vol. 2014, No. 753496, pp. 1-18, (2014); https://doi.org/10.1155/2014/753496.

Wang, H. et al., "A novel two-dimensional mechanical metamaterial with negative Poisson's ratio," Computational Materials Science, vol. 171, pp. 1-9, (2020); https://doi.org/10.1016/j.commatsci.2019.109232.

https://en.wikipedia.org/wiki/Miura_fold—Viewed on Jun. 28, 2022.

www.wikipedia.org/wiki/Poisson's_ratio—Viewed on Jun. 28, 2022.

https://en.wikipedia.org/wiki/Saddle_point—Viewed on Jun. 28, 2022.

U.S. Appl. No. 17/244,258, filed Apr. 29, 2021, SanDisk Technologies LLC.

U.S. Appl. No. 17/244,311, filed Apr. 29, 2021, SanDisk Technologies LLC.

U.S. Appl. No. 17/462,446, filed Aug. 31, 2022, SanDisk Technologies LLC.

U.S. Appl. No. 17/574,182, filed Jan. 12, 2022, SanDisk Technologies LLC.

U.S. Appl. No. 17/806,406, filed Jun. 10, 2022, SanDisk Technologies LLC.

U.S. Appl. No. 17/806,415, filed Jun. 10, 2022, SanDisk Technologies LLC.

U.S. Appl. No. 17/806,592, filed Jun. 13, 2022, SanDisk Technologies LLC.

* cited by examiner

SEMICONDUCTOR STRUCTURES INCLUDING AUXETIC MICROSTRUCTURES AND METHOD OF FORMING THE SAME

FIELD

The present disclosure relates generally to semiconductor structures, and particularly to semiconductor structures including auxetic microstructures and methods of manufacturing the same.

BACKGROUND

Auxetic structures refer to a structure exhibiting a negative Poission's ratio. When stretched along a first direction, an auxetic structure becomes thicker along a second direction that is perpendicular to the first direction. When compressed along the first direction, the auxetic structure becomes thinner along the second direction. The auxetic properties can be due to the internal geometry of a pattern within the auxetic structure.

FIG. 1A schematically illustrates a non-auxetic structure, and FIG. 1B schematically illustrates an auxetic structure. The non-auxetic structure illustrated in FIG. 1A has a positive Poisson's ratio. The Poisson's ratio is defined as a ratio of a negative of a linear deformation distance per unit length along a second direction to a linear deformation distance per unit length along a first direction that is perpendicular to the horizontal direction. In other words, the Poisson's ratio is the negative of the fractional length change along a second direction to the fractional length change along a first horizontal direction. The auxetic structure illustrated in FIG. 1B has a negative Poisson's ratio.

Patterns that provide auxetic properties are known in the art. Some examples of such patterns implemented in macroscopic auxetic structures are illustrated in FIGS. 1C-1E. Typical auxetic patterns are implemented in macro-scale structures such as body armor, packing materials, shock-absorbing structures such as knee pads and elbow pads, sponge mops, etc. Typical dimensions of geometries of such auxetic patterns, as measured by the pitch of a pattern repetition in auxetic structures, are on the order of 1 cm to 10 cm.

SUMMARY

According to an aspect of the present disclosure, a semiconductor structure includes a semiconductor device substrate, and an auxetic microstructure containing an auxetic matrix having a negative Poission's ratio.

According to another aspect of the present disclosure a method comprises providing a semiconductor device substrate, and forming an auxetic microstructure comprising an auxetic matrix having a negative Poission's ratio in or over the semiconductor device substrate.

DETAILED DESCRIPTION

Figure 1B:
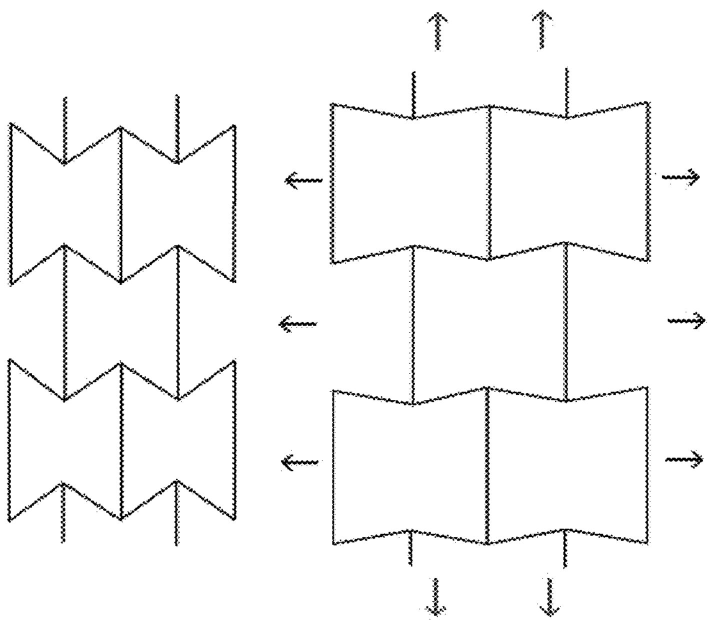
FIG. 1B (Prior Art)
FIG. 1B is a schematic view of an auxetic structure.
Figure 1A:
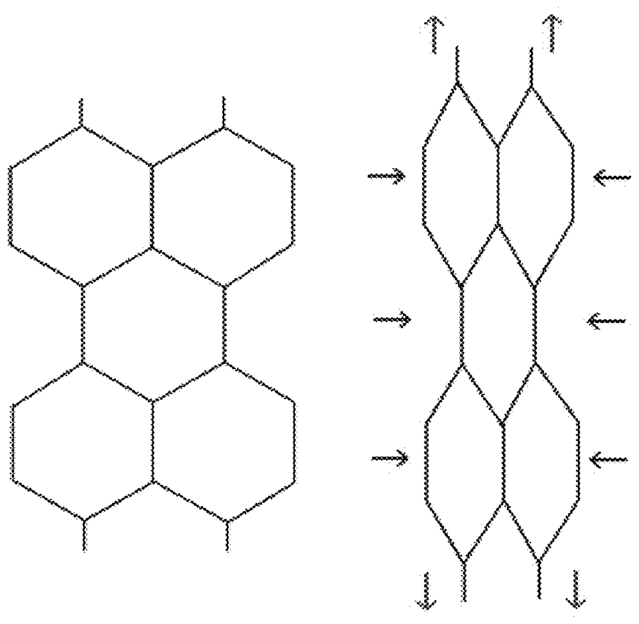
FIG. 1A (Prior Art)
FIG. 1A is a schematic view of a non-auxetic structure.
Figure 1C:
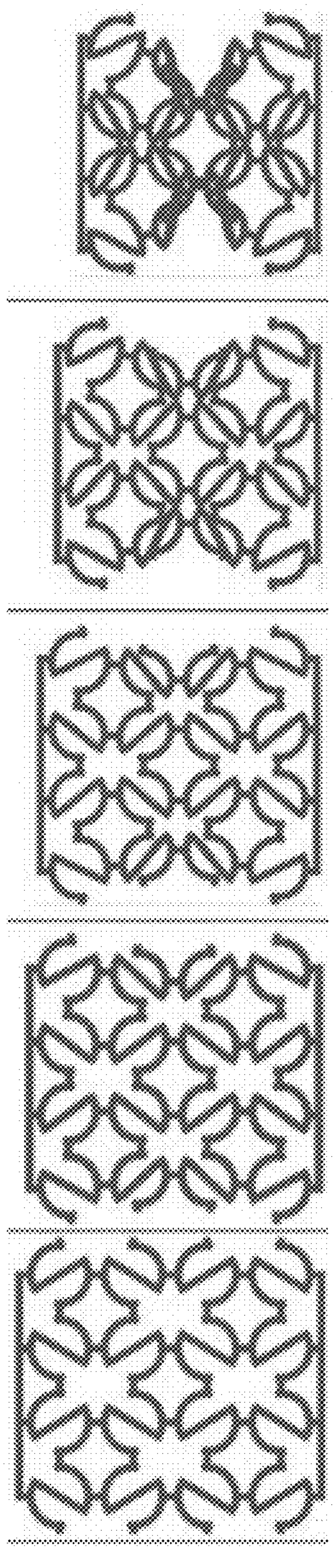
FIG. 1C (Prior Art)
FIG. 1C is a top-down view of a first macroscopic auxetic structure.
Figure 1D:
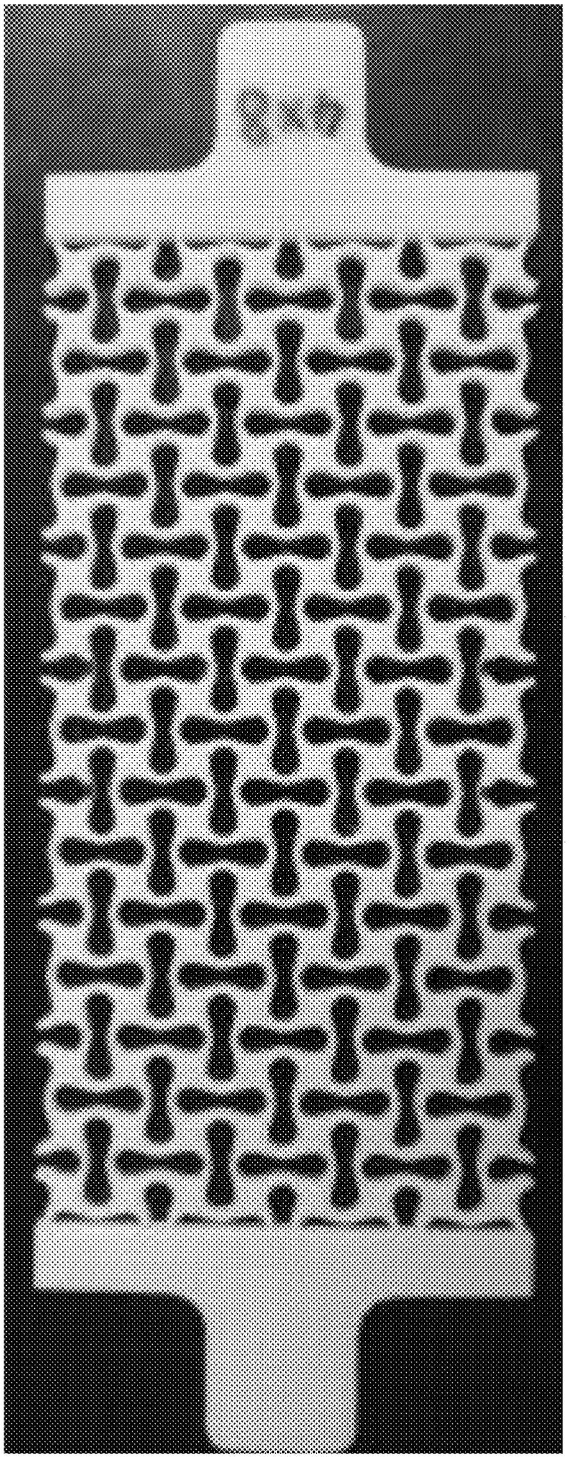
FIG. 1D (Prior Art)
FIG. 1D is a top-down view of a second exemplary macroscopic auxetic structure.
Figure 1E:
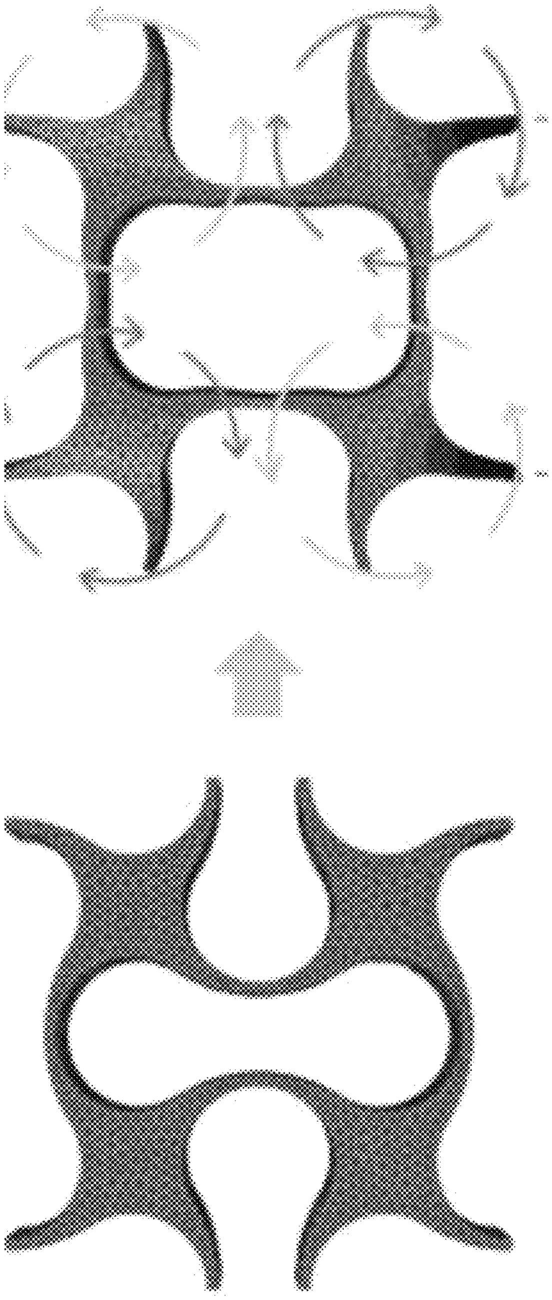
FIG. 1E (Prior Art)
FIG. 1E is a top-down view of a third exemplary macroscopic auxetic structure.

As discussed above, the embodiments of the present disclosure are directed to semiconductor structures including auxetic microstructures and methods of manufacturing the same. Auxetic microstructures of the embodiments of present disclosure may be incorporated into one or more levels of a semiconductor structure (e.g., semiconductor device) to reduce warpage of the overall semiconductor structure.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm.

In one embodiment, auxetic microstructures refer to auxetic structures in which a predominant fraction (i.e., more than 50%) of characteristic dimensions of unit structural features therein is less than 1 mm, such as 5 nm to 100 microns. However, larger dimensions may also be used. In case the auxetic microstructures comprise a periodic array of unit structures that are repeated in two different directions, the characteristic dimensions refer to the periodicities of the unit structures along the directions of repetition.

In three dimensional memory devices, the substrate may be warped into a "saddle" shape which is convex along the x-direction and concave along the y-direction. For example, such saddle shape may be caused by asymmetric stress imposed on the substrate by metal word lines which extend along one direction (e.g., word line direction) over the substrate. Substrate warpage along a vertical direction is given by $h=c\,(\sigma_{xx}+\sigma_{yy})$, in which c is a proportionality constant, $\sigma_{xx}$ is the stress along a first horizontal direction such as an x-direction, and $\sigma_{yy}$ is the stress along a second horizontal direction such as an y-direction.

In the auxetic microstructures of the embodiments of the present disclosure, the signs of $\sigma_{xx}$ and $\sigma_{yy}$ are opposite. Therefore, the magnitude of substrate warpage height, h is reduced because one of $\sigma_{xx}$ and $\sigma_{yy}$ is subtracted from the other. Therefore, the saddle shaped substrate warpage along the vertical direction can be reduced by including auxetic microstructures into the substrate and/or over the substrate. The auxetic microstructures of the embodiments of the present disclosure are generally effective for reduction of warpage along the vertical direction even if the ratio of the lateral dimensions (such as a lateral length or a lateral width) to a vertical dimension (such as a thickness) is not greater than 10, but the warpage-reducing effects of the auxetic microstructures of the embodiments present disclosure can be most effective when the ratio of the lateral dimensions to the vertical dimension is greater than 10, such as 15 to 1,000.

Figure 2A:
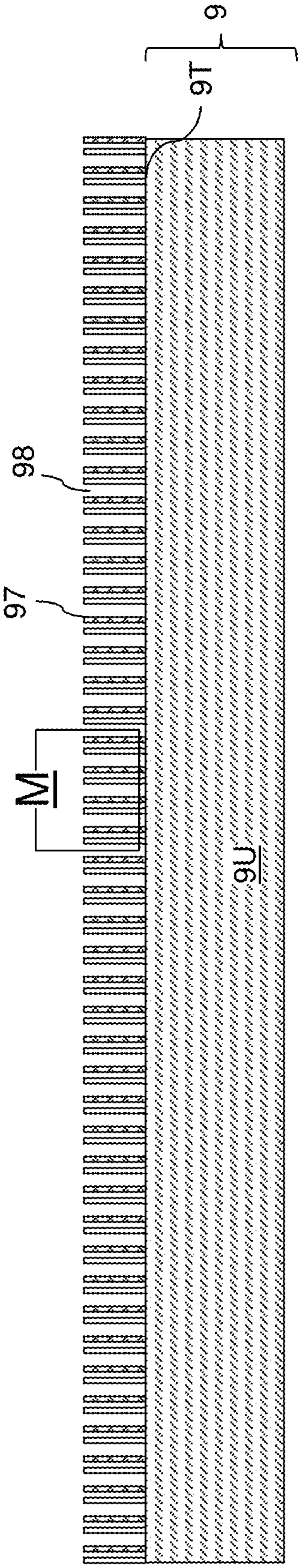
FIG. 2A is a vertical cross-sectional view of a first exemplary structure after application and patterning of a photoresist layer over a substrate according to an embodiment of the present disclosure.
Figure 2B:
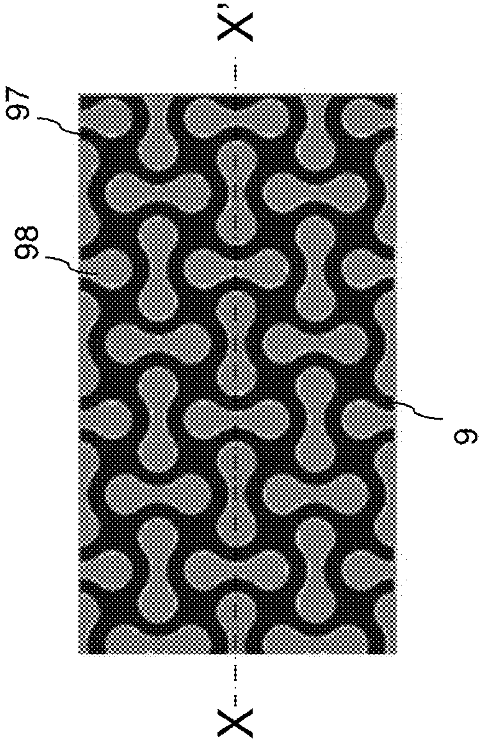
FIG. 2B is a top-down view of region M of the first exemplary structure of FIG. 2A.

Referring to FIGS. 2A and 2B, a first exemplary structure comprises an semiconductor device substrate 9. The semiconductor device substrate may comprise any suitable material, such as a semiconductor, conductive or insulating material, which is configured to support one or more semiconductor devices (e.g., logic or memory devices) thereon. In one embodiment that is described below, the semiconductor device substrate comprises a semiconductor material, such as a single crystalline silicon wafer, a III-V compound semiconductor material, a II-VI semiconductor material or another semiconductor material. Thus, the semiconductor device substrate of the embodiment below is a semiconductor substrate. The "dog bone" design of the auxetic patterns in FIGS. 2B, 2F, 3B, 15B and 16B is based on the design described in K. Meena, S. Singamneni, Materials & Design, 173 (2019). However, other auxetic pattern designs may also be used.

A patterned photoresist layer 97 is formed over the front (i.e., top) surface 9T of the unpatterned semiconductor substrate 9U. According to an embodiment of the present disclosure, the patterned photoresist layer 97 may include discrete openings 98 such that the remaining portion of the patterned photoresist layer 97 comprises a continuous photoresist material portion that has an auxetic pattern. According to an aspect of the present disclosure, the auxetic pattern may be a microauxetic pattern having a first periodicity along a first horizontal direction that is less than 1 mm and having a second periodicity along a second horizontal direction that is less than 1 mm. However, larger dimensions may also be used. Generally, any auxetic pattern, periodic or non-periodic, may be employed for the pattern in the photoresist layer 97.

Figure 2C:
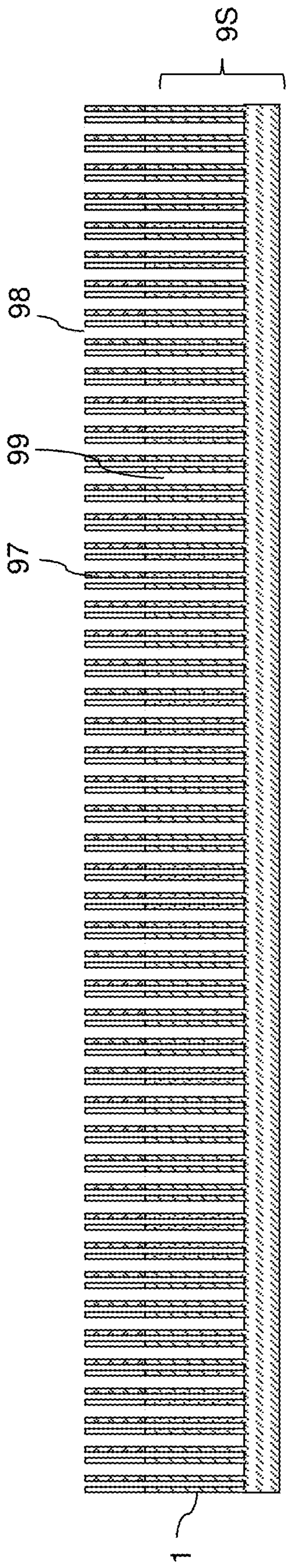
FIG. 2C is a vertical cross-sectional view of the first exemplary structure after formation of trenches into the substrate according to an embodiment of the present disclosure.

Referring to FIG. 2C, an anisotropic etch process can be performed through the openings 98 to transfer the pattern in the patterned photoresist layer 97 into the unpatterned semiconductor substrate 9U. Trenches 99 located below the openings 98 in the patterned photoresist layer 97 are formed in the unpatterned semiconductor substrate 9U to convert the unpatterned semiconductor substrate 9U into a patterned semiconductor substrate 9S containing at least one protruding portion which functions as the auxetic matrix 1 and containing the trenches 99. In one embodiment, the top (i.e., protruding) portion of the pattered semiconductor substrate 9S functions as an auxetic matrix 1. The depth of the trenches 99 in the patterned semiconductor substrate 9S may be in a range from 1% to 99%, such as from 5% to 95%, and/or from 10% to 90%, of the thickness of the patterned semiconductor substrate 9S. The patterned photoresist layer 97 can be subsequently removed, for example, by ashing.

Figure 2D:
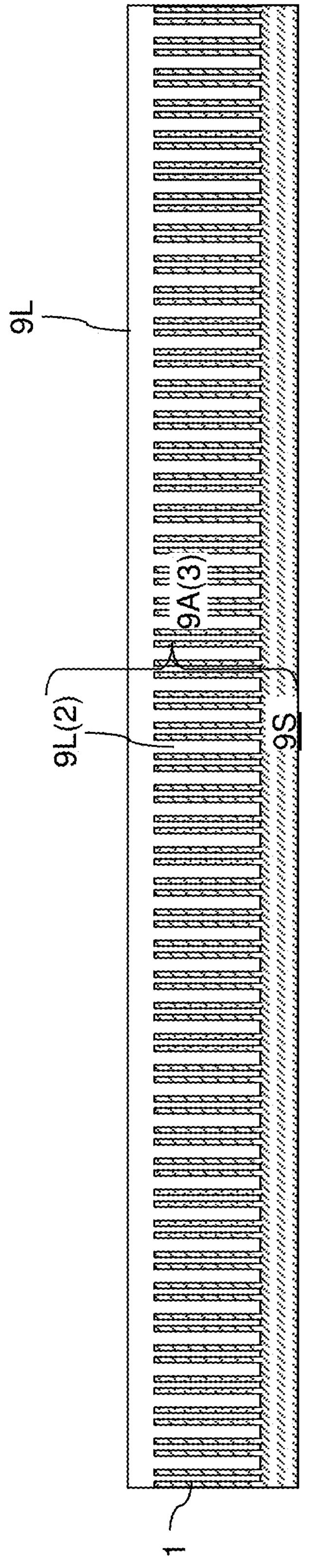
FIG. 2D is a vertical cross-sectional view of the first exemplary structure after deposition of a dielectric material layer according to an embodiment of the present disclosure.

Referring to FIG. 2D, a dielectric material can be deposited in the trenches 99 and over the front (i.e., top) surface 9T of the patterned semiconductor substrate 9S to form a dielectric material layer 9L. The dielectric material layer 9L includes a dielectric material, such as silicon oxide or silicon nitride. The thickness of the dielectric material layer 9L may be selected such that a top surface of the dielectric material layer 9L continuously extends over the front surface of the patterned semiconductor substrate 9S. Vertically-extending portions of the dielectric material layer 9L that fill the trenches 99 may function as fill material potions 2 that fill openings in the auxetic matrix 1 (which in this embodiment comprises the top portion of the patterned semiconductor substrate 9S). The combination of the patterned semiconductor substrate 9S having its top portion functioning as an auxetic matrix 1 and the dielectric material layer 9L containing fill material portions constitutes an auxetic substrate 9A, which is an auxetic microstructure 3.

Figure 2E:
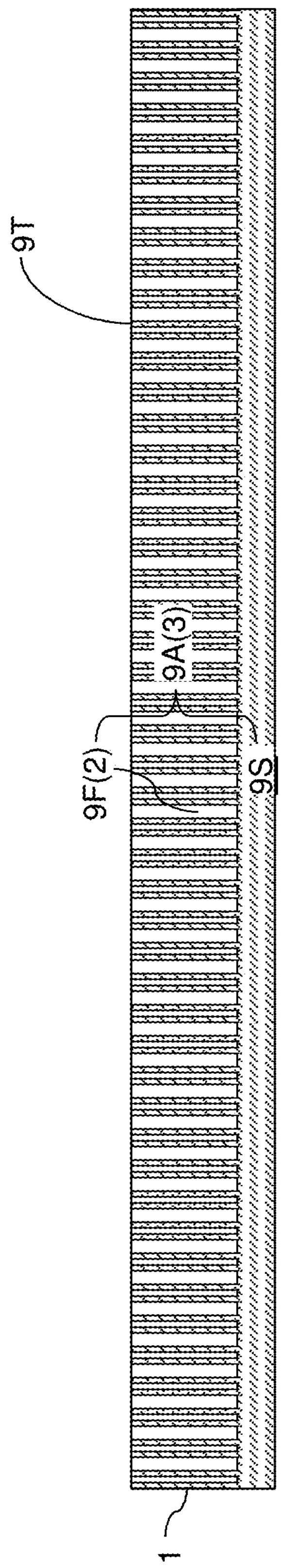
FIG. 2E is a vertical cross-sectional view of the first exemplary structure after removal of horizontally-extending portions of the dielectric material layer according to an embodiment of the present disclosure.
Figure 2F:
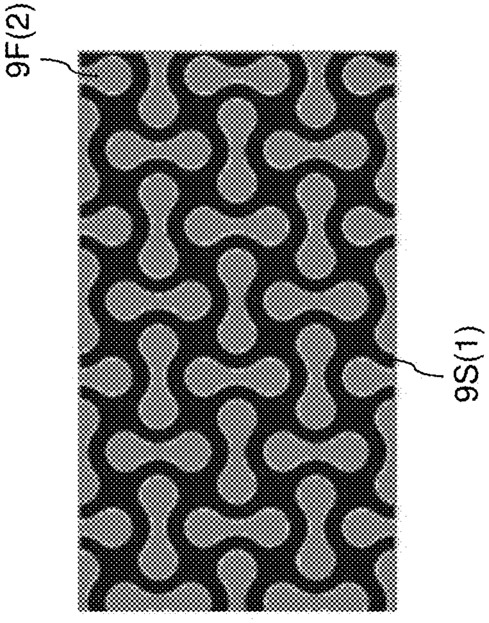
FIG. 2F is a top-down view of a region of the first exemplary structure of FIG. 2E.

Referring to FIGS. 2E and 2F, a planarization process can be optionally performed to remove portions of the dielectric material layer 9L from above the front (i.e., top) surface 9T of the patterned semiconductor substrate 9S. In this case, remaining portions of the dielectric material layer 9L comprise dielectric fill material portions 9F which function as fill material potions 2 that fill openings in the auxetic matrix 1 (which comprises the top protruding portion of the patterned semiconductor substrate 9S in this embodiment). The combination of the patterned semiconductor substrate 9S having its top portion functioning as an auxetic matrix 1 and the dielectric fill material potions 9F functioning as fill material portions 2 constitutes an auxetic substrate 9A, which is an auxetic microstructure 3. Semiconductor devices (not shown) may be subsequently formed over the top surface (i.e., the front surface) 9T of the auxetic substrate 9A. Thus, the semiconductor devices are formed on the same side of the auxetic substrate 9A as the location of the auxetic matrix 1. In one embodiment, the fill material portions 2 comprise alternating "dog bone" or "bar bell" shaped structures which extend in perpendicular directions along both rows and columns. The "dog bone" or "bar bell" shaped structures comprise two wider portions connected by a narrower portion along a horizontal axis. The horizontal axis direction alternates 90 degrees along both rows and columns.

Generally, an auxetic matrix 1 comprising a first material (such as the semiconductor material of the patterned semiconductor substrate 9S) and comprising a plurality of openings (such as the trenches 99) therethrough can be formed. In one embodiment, the auxetic matrix 1 comprises a continuously extending structure with the plurality of openings 99. A predominant fraction (i.e., more than 50%) of the plurality of openings (such as the trenches 99) may have a respective maximum lateral dimension less than 1 mm. However, larger dimensions may also be used. In the first exemplary structure, the auxetic matrix 1 is formed by patterning a substrate, such as an unpatterned semiconductor substrate 9U. A plurality of fill material portions 2 comprising a second material may be formed after formation of the auxetic matrix 1. The plurality of fill material portions 2 are embedded within the plurality of respective openings 99 in the auxetic matrix 1. A Poission's ratio for the auxetic matrix 1 as calculated by a ratio of a negative of a linear deformation distance per unit length along a second horizontal direction to a linear deformation distance per unit length along a first horizontal direction that is perpendicular to the second horizontal direction is negative.

Figure 2G:
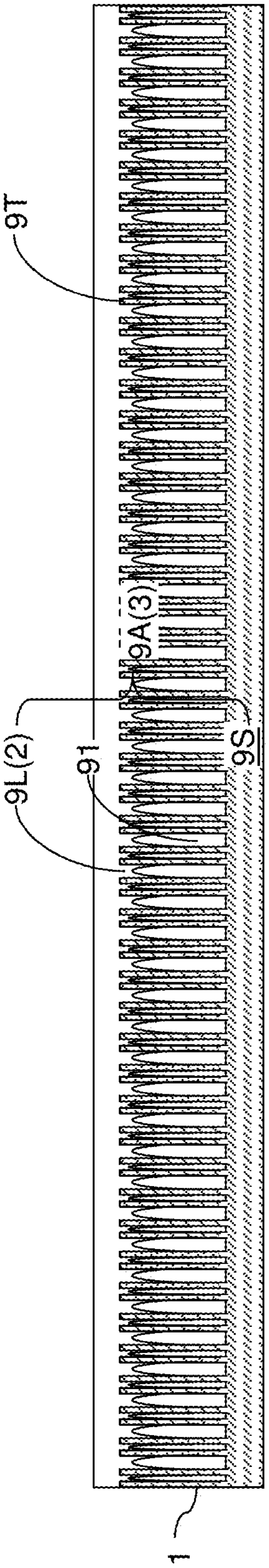
FIG. 2G is a vertical cross-sectional view of a first alternative configuration of the first exemplary structure after deposition of a dielectric material layer and formation of cavities according to an embodiment of the present disclosure.

Referring to FIG. 2G, a first alternative configuration of the first exemplary structure can be derived from the first exemplary structure illustrated in FIG. 2D by depositing a dielectric fill material such that cavities 91 are present within volumes of the trenches 99 that are not filled with the dielectric material layer 9L. In this case, the dielectric material layer 9L may be deposited by a non-conformal deposition process, such as a plasma-enhanced chemical vapor deposition (PECVD) process. Vertically-extending portions of the dielectric material layer 9L that fill the trenches 99 may function as fill material potions 2 that fill openings in the auxetic matrix 1 (which comprises the top portion of the patterned semiconductor substrate 9S in this embodiment). The combination of the patterned semiconductor substrate 9S having its top portion functioning as the auxetic matrix 1, the dielectric material layer 9L containing fill material portions 2, and the cavities 91 constitutes an auxetic substrate 9A, which is an auxetic microstructure 3. Semiconductor devices (not shown) may be subsequently formed over the top surface (i.e., the front surface) 9T of the auxetic substrate 9A.

Figure 2H:
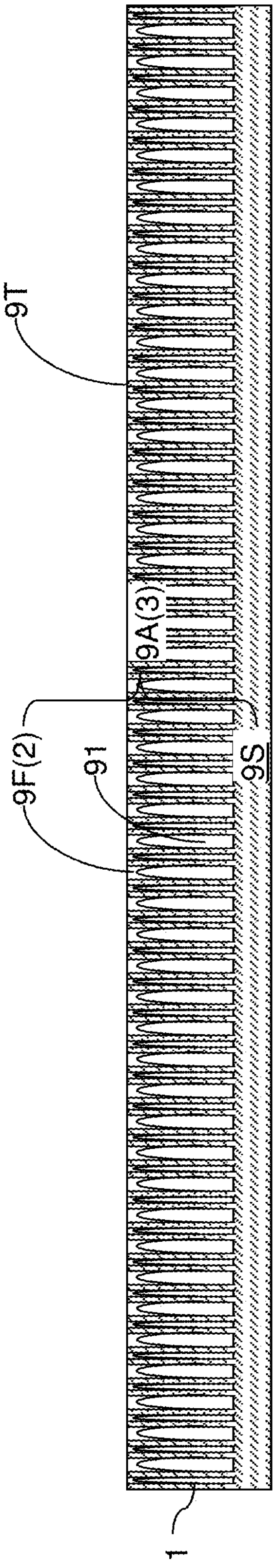
FIG. 2H is a vertical cross-sectional view of the first alternative configuration of the first exemplary structure after removal of horizontally-extending portions of the dielectric material layer according to an embodiment of the present disclosure.

Referring to FIG. 2H, a planarization process can be optionally performed to remove portions of the dielectric material layer 9L from above the front surface of the patterned semiconductor substrate 9S. In this case, remaining portions of the dielectric material layer 9L comprise dielectric fill material portions 9F which function as fill material potions 2 that partially fill openings (i.e., the trenches 99) in the auxetic matrix 1 (which comprises the patterned semiconductor substrate 9S in this embodiment). The combination of the patterned semiconductor substrate 9S having its top portion functioning as the auxetic matrix 1, the dielectric fill material potions 9F functioning as fill material portions 2, and the cavities 91 constitutes an auxetic substrate 9A, which is an auxetic microstructure 3. Semiconductor devices (not shown) may be subsequently formed over the top surface (i.e., the front surface) 9T of the auxetic substrate 9A.

Figure 3A:
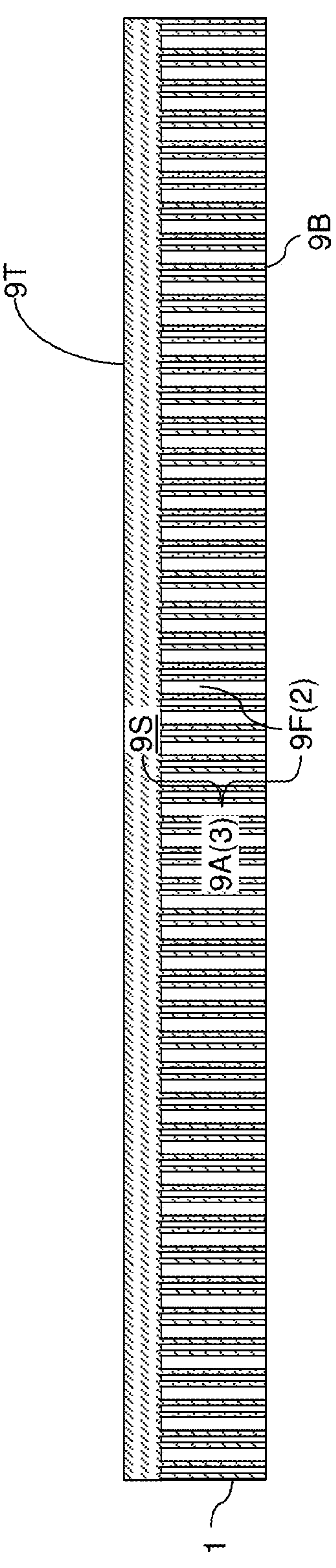
FIG. 3A is a vertical cross-sectional view of a second alternative configuration of the first exemplary structure after formation of trenches and dielectric fill material portions according to an embodiment of the present disclosure.
Figure 3B:
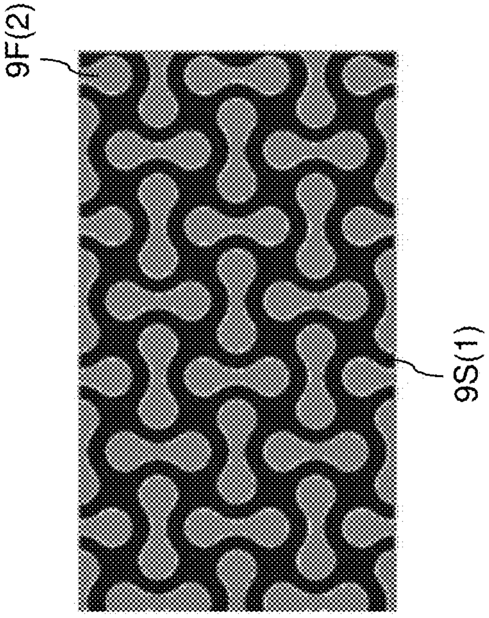
FIG. 3B is a bottom-up view of a region of the second alternative configuration of the first exemplary structure of FIG. 3A.

Referring to FIGS. 3A and 3B, a second alternative configuration of the first exemplary structure can be provided by forming the auxetic matrix 1 in the back surface (i.e., bottom side) 9B of the substrate. In this alternative configuration, the semiconductor devices (not shown) are subsequently formed over the top surface 9T of the auxetic substrate 9A, which is opposite to the back surface (i.e., bottom side) 9B containing the auxetic matrix 1. Thus, the semiconductor devices are formed on the opposite side from the auxetic substrate 9A from the location of the auxetic matrix 1. The combination of the patterned semiconductor substrate 9S having its bottom (i.e., back) protruding portion functioning as the auxetic matrix 1, the dielectric fill material potions 9F functioning as fill material portions 2, constitutes an auxetic substrate 9A, which is an auxetic microstructure 3.

Figure 3C:
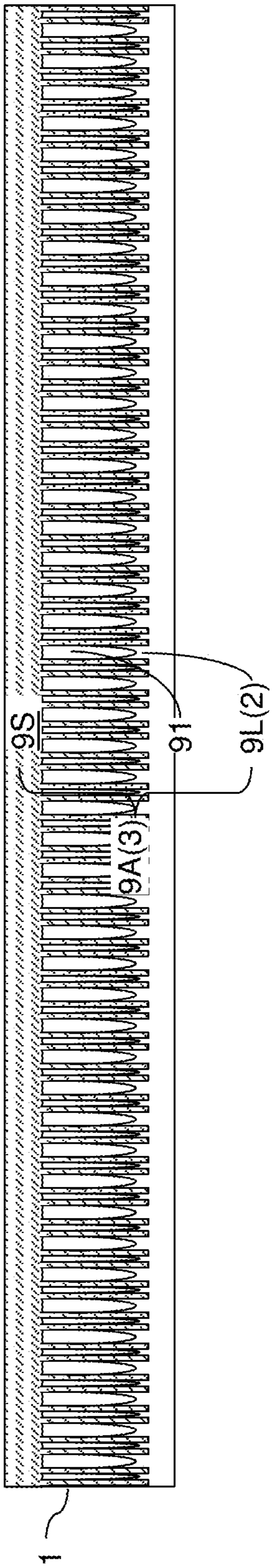
FIG. 3C is a vertical cross-sectional view of a third alternative configuration of the first exemplary structure after deposition of a dielectric material layer and formation of cavities according to an embodiment of the present disclosure.

Referring to FIG. 3C, a third alternative configuration of the first exemplary structure can be derived from the first exemplary structure illustrated in FIG. 2G by forming the auxetic matrix 1 in the back surface (i.e., bottom side) 9B of the substrate.

Figure 3D:
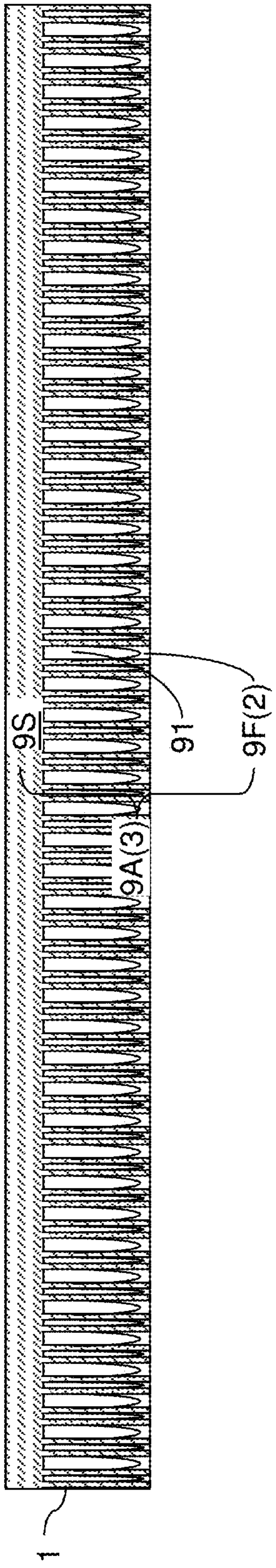
FIG. 3D is a vertical cross-sectional view of the third alternative configuration of the first exemplary structure after removal of horizontally-extending portions of the dielectric material layer according to an embodiment of the present disclosure.

Referring to FIG. 3D, an alternative of the third alternative configuration of the first exemplary structure can be derived from the first exemplary structure illustrated in FIG. 2H by forming the auxetic matrix 1 in the back surface (i.e., bottom side) 9B of the substrate. In FIGS. 3C and 3D, the combination of the patterned semiconductor substrate 9S having its bottom (i.e., back) portion functioning as the auxetic matrix 1, the dielectric fill material potions 9F functioning as fill material portions 2, and the cavities 91 constitutes an auxetic substrate 9A, which is an auxetic microstructure 3.

Figure 4:
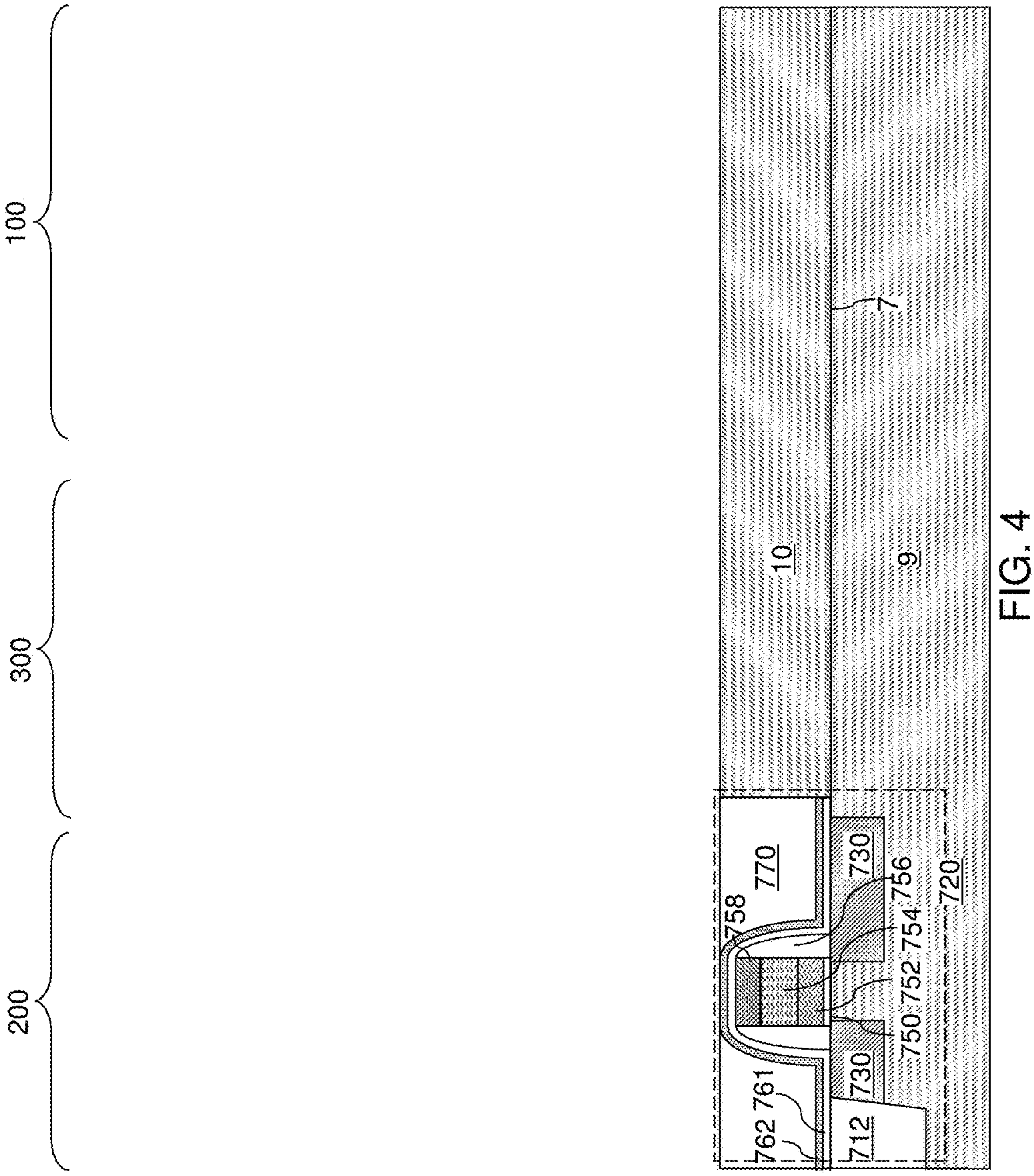
FIG. 4 is a vertical cross-sectional view of a second exemplary structure after formation of semiconductor devices on a top surface of semiconductor substrate according to an embodiment of the present disclosure.

Referring to FIG. 4, a second exemplary structure according to an embodiment of the present disclosure is illustrated. The second exemplary structure may include a semiconductor substrate 9 and an optional semiconductor material layer 10. The semiconductor substrate 9 can have a major surface 7, which can be, for example, a topmost surface of the semiconductor substrate 9. In one embodiment, the major surface 7 can be a single crystalline semiconductor surface, such as a single crystalline silicon surface, and the semiconductor substrate 9A comprises a single crystalline silicon wafer. The semiconductor material layer 10 may comprise a doped well or an epitaxial silicon layer located in or on the semiconductor substrate 9. In some embodiments, the semiconductor substrate 9 lacks an auxetic matrix 1 and is not an auxetic substate. In other embodiments, the semiconductor substrate 9 may be replaced with any of the auxetic substrates 9A described above.

At least one semiconductor device 720 for a peripheral circuitry can be formed on a portion of the semiconductor substrate 9. The at least one semiconductor device 720 can include, for example, field effect transistors. For example, at least one shallow trench isolation structure 712 can be formed by etching portions of the semiconductor substrate 9 and depositing a dielectric material therein. A gate dielectric layer, at least one gate conductor layer, and a gate cap dielectric layer can be formed over the semiconductor substrate 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the semiconductor substrate 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a topmost surface of the dielectric liners (761, 762). Subsequently, the planarization dielectric layer 770 and the dielectric liners (761, 762) can be removed from an area to physically expose a top surface of the semiconductor substrate 9. As used herein, a surface is "physically exposed" if the surface is in physical contact with vacuum, or a gas phase material (such as air). The optional semiconductor material layer 10, if present, can be formed on the top surface of the semiconductor substrate 9 prior to, or after, formation of the at least one semiconductor device 720 by deposition of a single crystalline semiconductor material, for example, by selective epitaxy. The single crystalline semiconductor material of the semiconductor material layer 10 can be in epitaxial alignment with the single crystalline structure of the semiconductor substrate 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region of the at least one semiconductor device 720 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 5:
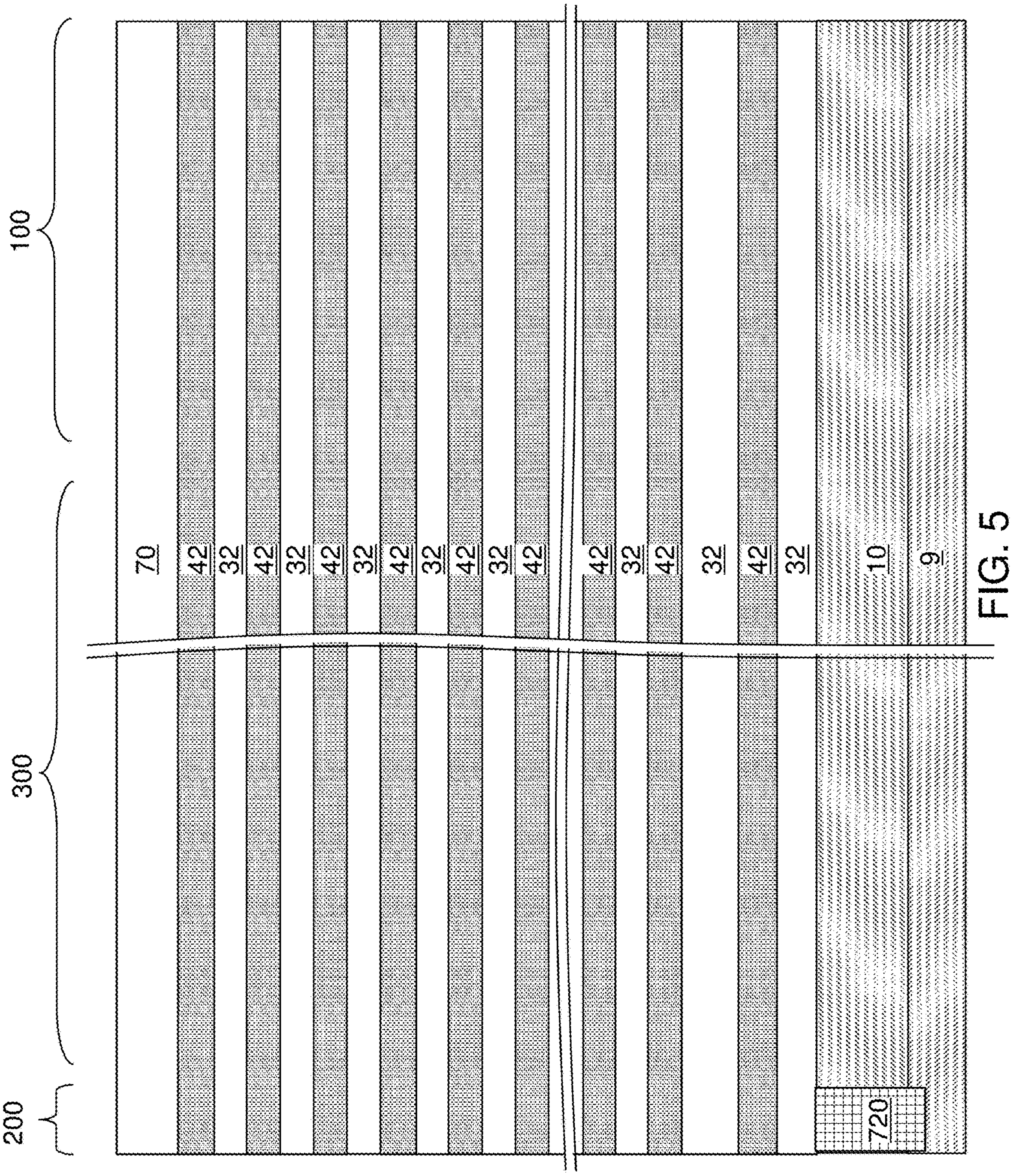
FIG. 5 is a vertical cross-sectional view of the second exemplary structure after formation of an alternating stack of insulting layers and spacer material layers according to an embodiment of the present disclosure.

Referring to FIG. 5, a stack of an alternating plurality of first material layers (which can be insulating layers 32) and second material layers (which can be sacrificial material layer 42) is formed over the semiconductor substrate 9. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes an in-process alternating stack of insulating layers 32 and sacrificial material layers 42. As used herein, a "prototype" structure or an "in-process" structure refers to a transient structure that is subsequently modified in the shape or composition of at least one component therein.

Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride, and can consist essentially of silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

While in the above embodiment the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 6:
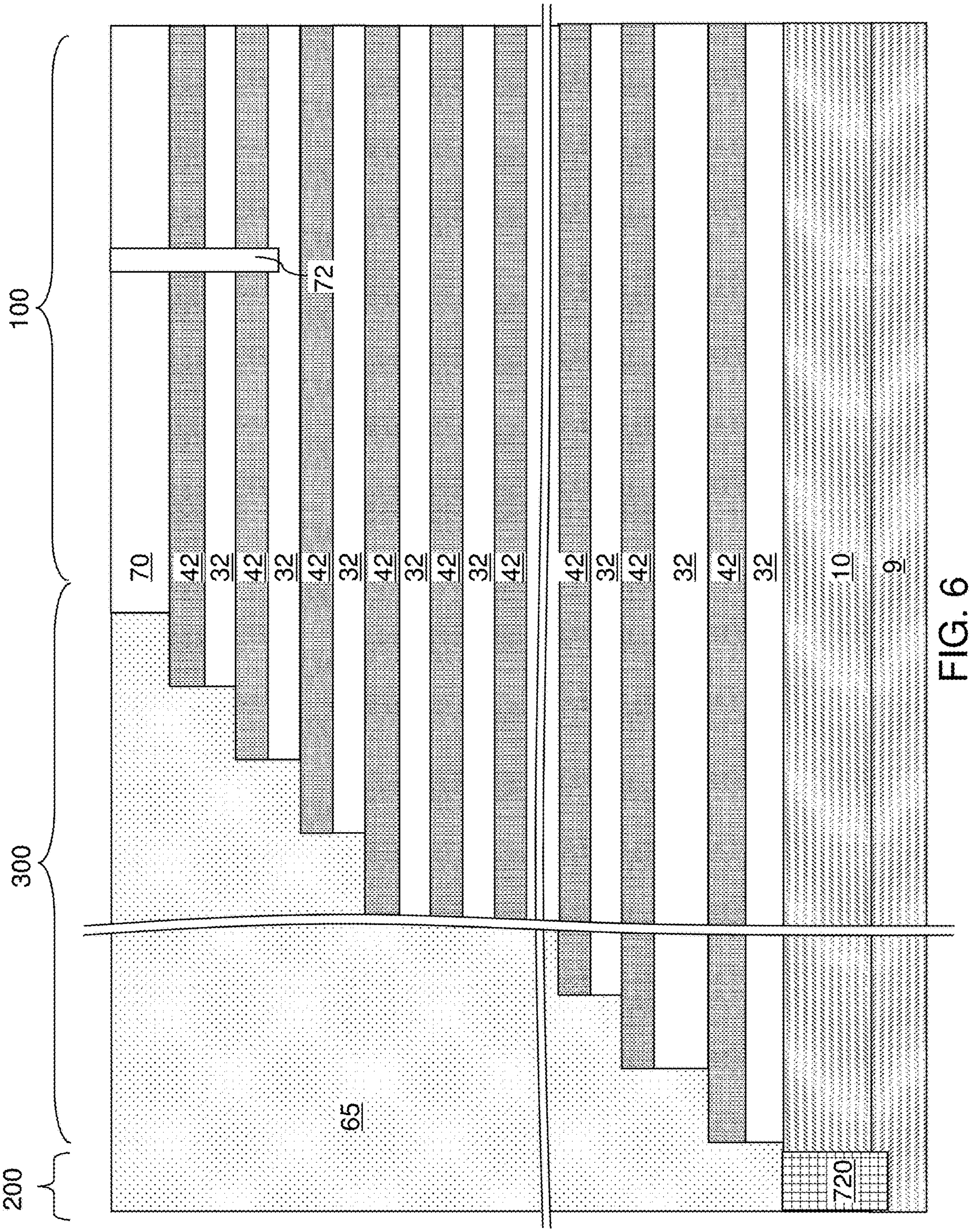
FIG. 6 is a vertical cross-sectional view of the second exemplary structure after patterning stepped surfaces and forming a retro-stepped dielectric material portion according to an embodiment of the present disclosure.

Referring to FIG. 6, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the semiconductor substrate 9. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 7A:
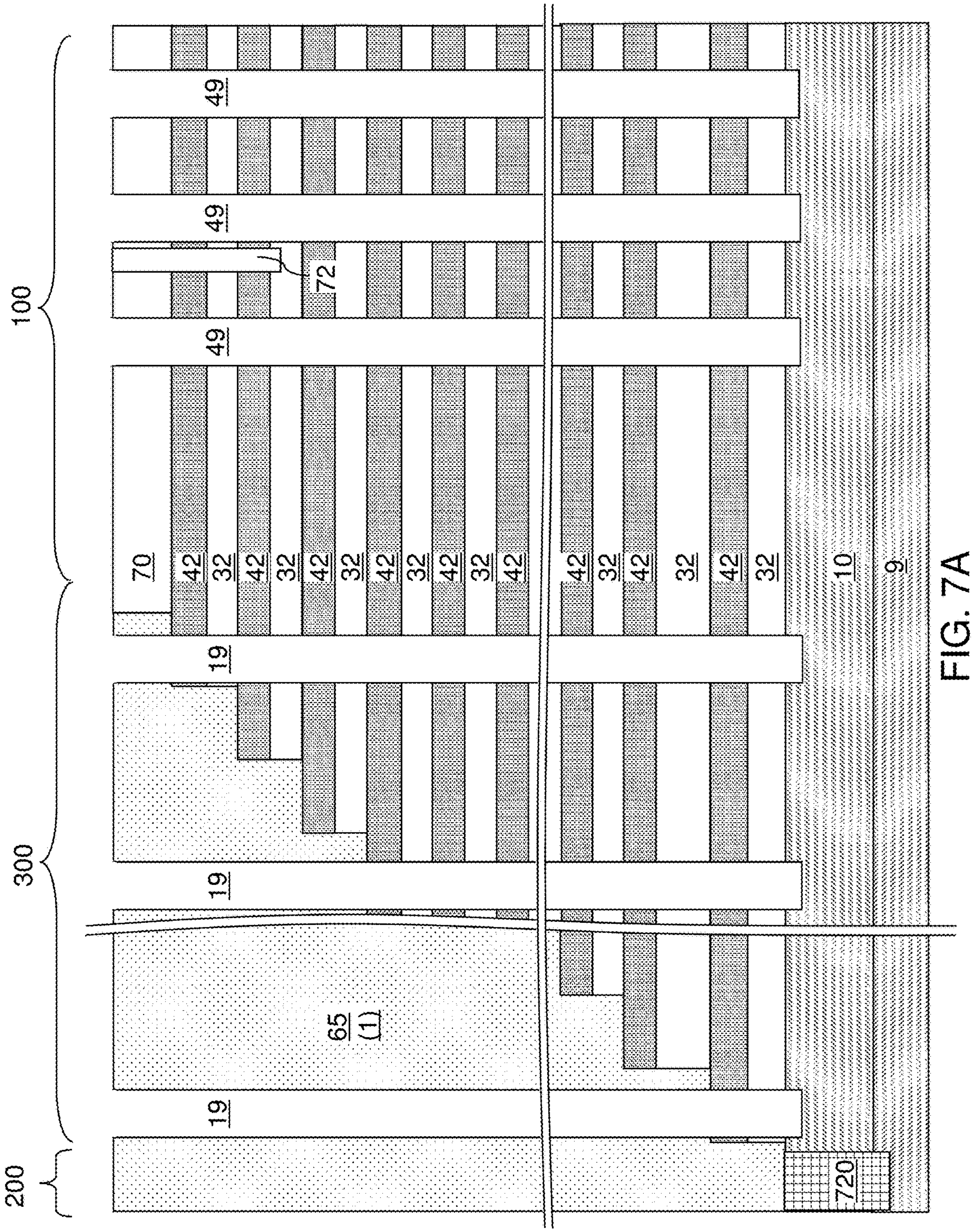
FIG. 7A is a vertical cross-sectional view of the second exemplary structure after formation of memory openings and support openings according to an embodiment of the present disclosure.
Figure 7B:
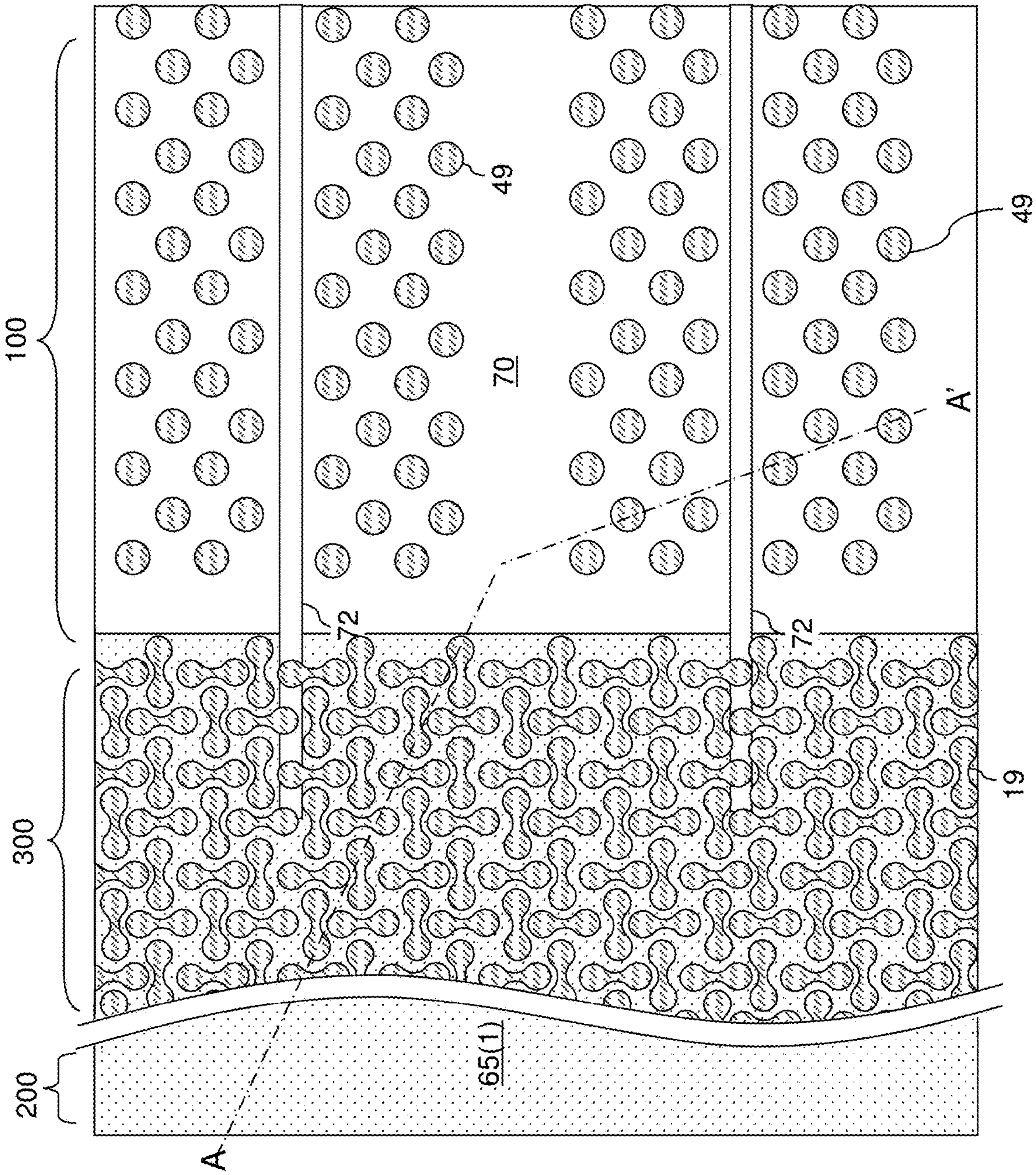
FIG. 7B is a top-down view of the second exemplary structure of FIG. 7A. The hinged vertical plane A-A' corresponds to the plane of the vertical cross-sectional view of FIG. 7A.

Referring to FIGS. 7A and 7B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed, but is not used to store data. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300. The retro-stepped dielectric material portion 65 becomes a perforated retro-stepped dielectric material portion 65.

According to an embodiment of the present disclosure, the support openings 19 are formed as discrete openings such that the remaining portion of the retro-stepped dielectric material portion 65 comprises a continuous material portion that has an auxetic pattern. Further, portions of the sacrificial material layers 42 that laterally surround the support openings 19 comprises a continuous material portion that has an auxetic pattern. According to an aspect of the present disclosure, the auxetic pattern may be a microauxetic pattern having a first periodicity along a first horizontal direction that is less than 1 mm and having a second periodicity along a second horizontal direction that is less than 1 mm. Generally, any auxetic pattern, periodic or non-periodic, may be employed for the pattern in the perforated retro-stepped dielectric material portion 65. In one embodiment, the perforated retro-stepped dielectric material portion 65 is continuous and that the characteristic dimensions of the pattern are less than 1 mm. Further, any auxetic pattern, periodic or non-periodic, may be employed for the pattern in the remaining portions of the insulating layers 32 and the sacrificial material layers 42. In one embodiment, provided that each remaining portions of the insulating layers 32 and the sacrificial material layers 42 is continuous and that the characteristic dimensions of the pattern are less than 1 mm. According to an aspect of the present disclosure, the perforated retro-stepped dielectric material portion 65 may be an auxetic matrix 1. Furthermore, the remaining portions of the insulating layers 32 and the sacrificial material layers 42 in the contact region 300 may also comprise portions of the auxetic matrix 1, Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. In some embodiments, the semiconductor material layer 10 may be omitted, and the memory openings 49 and the support openings 19 can be extend to a top surface of the semiconductor substrate 9.

FIGS. 8A-8H illustrate structural changes in a support openings 19 or in a memory opening 49 in the second exemplary structure of FIGS. 7A and 7B during formation of a support pillar structure 20 or during formation of a memory opening fill structure 58. The same structural change occurs simultaneously in each of the other memory openings 49 and in each support opening 19.

Figure 8A:
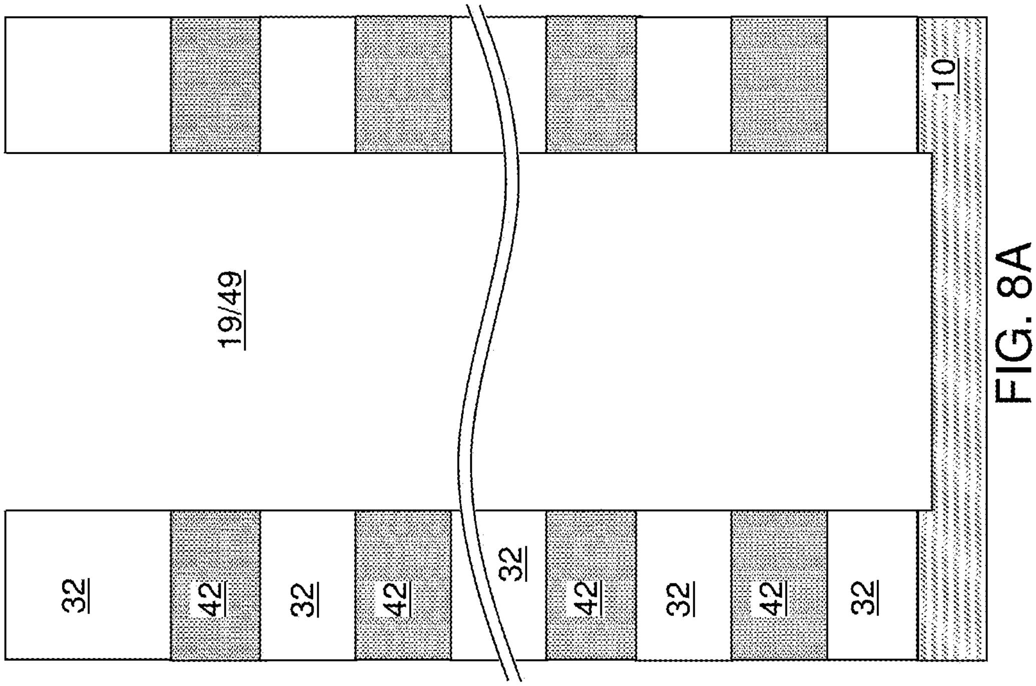
FIGS. 8A-8H are sequential schematic vertical cross-sectional views of a memory opening within the second exemplary structure during formation of a memory opening fill structure according to an embodiment of the present disclosure.

Referring to FIG. 8A, a support opening 19 or a memory opening 49 in the second exemplary device structure of FIGS. 7A and 7B is illustrated. The support opening 19 or the memory opening 49 extends through the insulating cap layer 70, the alternating stack (32, 42), and optionally into an upper portion of the semiconductor material layer 10.

Figure 8B:
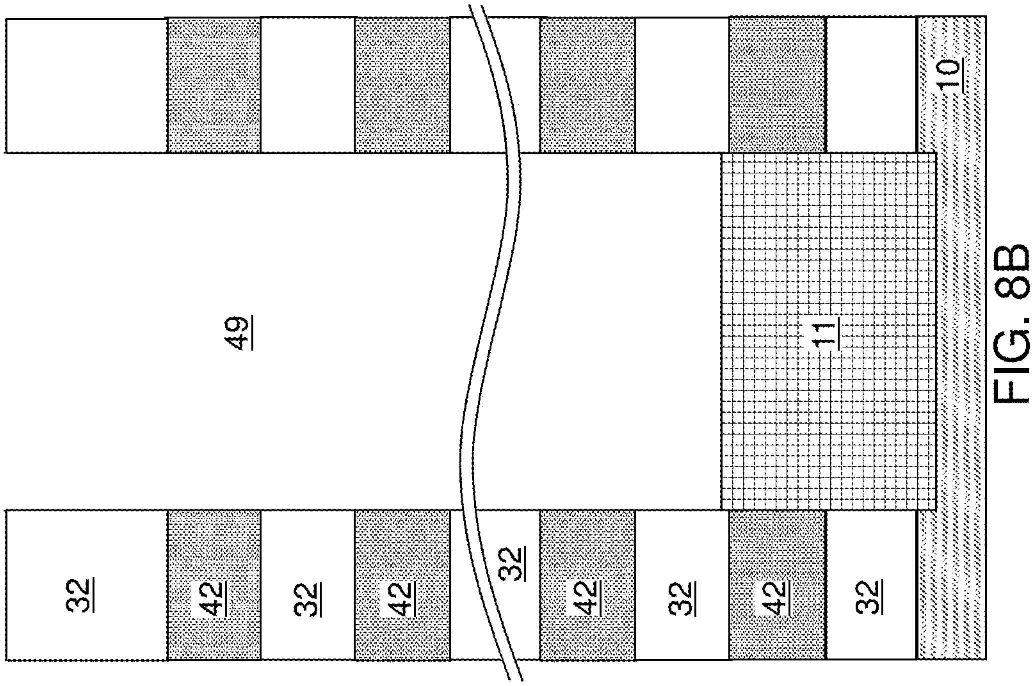

Referring to FIG. 8B, an optional pedestal channel portion 11 can be formed at the bottom portion of each memory opening 49 and each support openings 19, for example, by selective epitaxy.

Figure 8D:
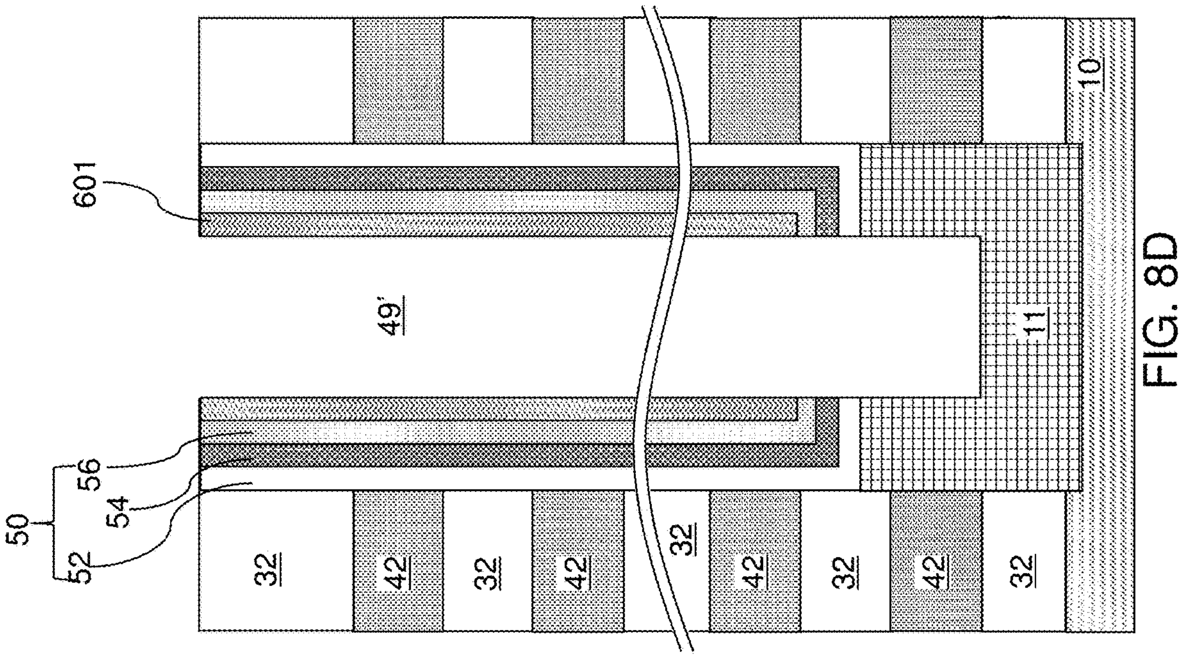
Figure 8C:
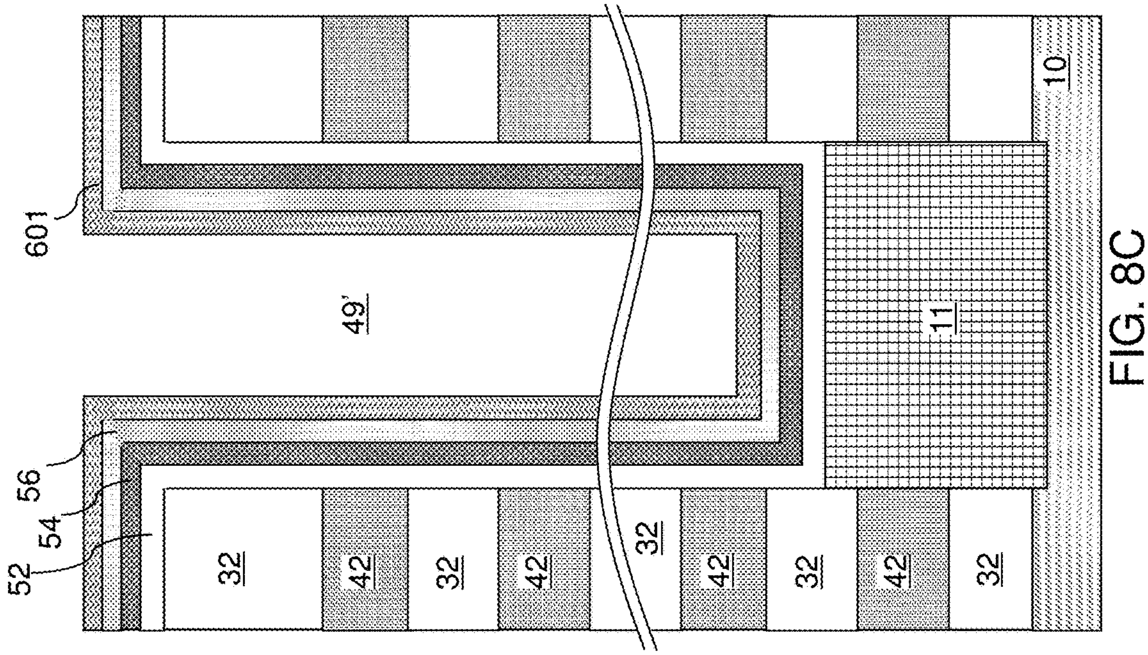

Referring to FIG. 8C, a stack of layers including an optional blocking dielectric layer (e.g., silicon oxide layer) 52, a memory material layer 54, a dielectric material liner 56, and an optional sacrificial cover material layer 601 can be sequentially deposited in the memory openings 49 by a respective conformal deposition process.

Generally, the memory material layer may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer and the dielectric material liner 56 comprises a tunneling dielectric layer (e.g., a silicon oxide layer or a stack of silicon oxide/nitride/oxide layers). In one embodiment, the sacrificial material layers 42 and the insulating layers 32 can have vertically coincident sidewalls, and the memory material layer 54 can be formed as a single continuous layer. The thickness of the memory material layer 54 can be in a range from 2 nm to 20 nm, although lesser and greater thicknesses can also be employed.

Referring to FIG. 8D, horizontally-extending portions of the optional sacrificial cover material layer 601, the dielectric material liner 56, the memory material layer 54, and the blocking dielectric layer 52 are anisotropically etched employing at least one anisotropic etch process. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers. The sacrificial cover material layer 601 can be subsequently removed selective to the material of the dielectric material liner 56.

Figure 8F:
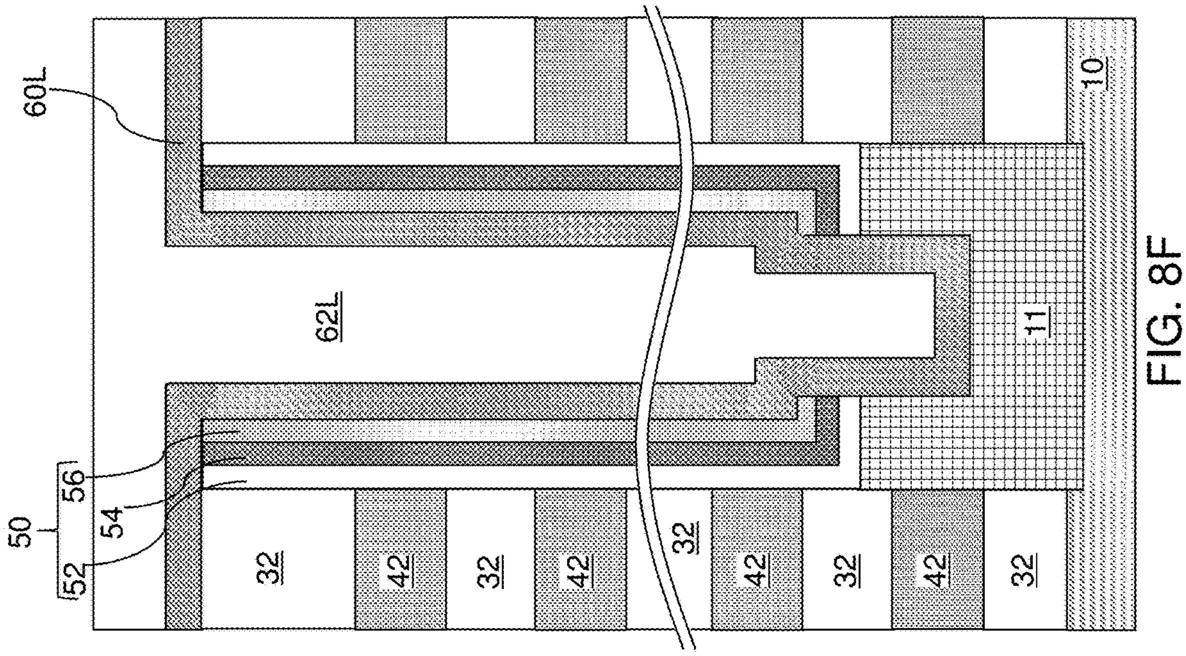
Figure 8E:
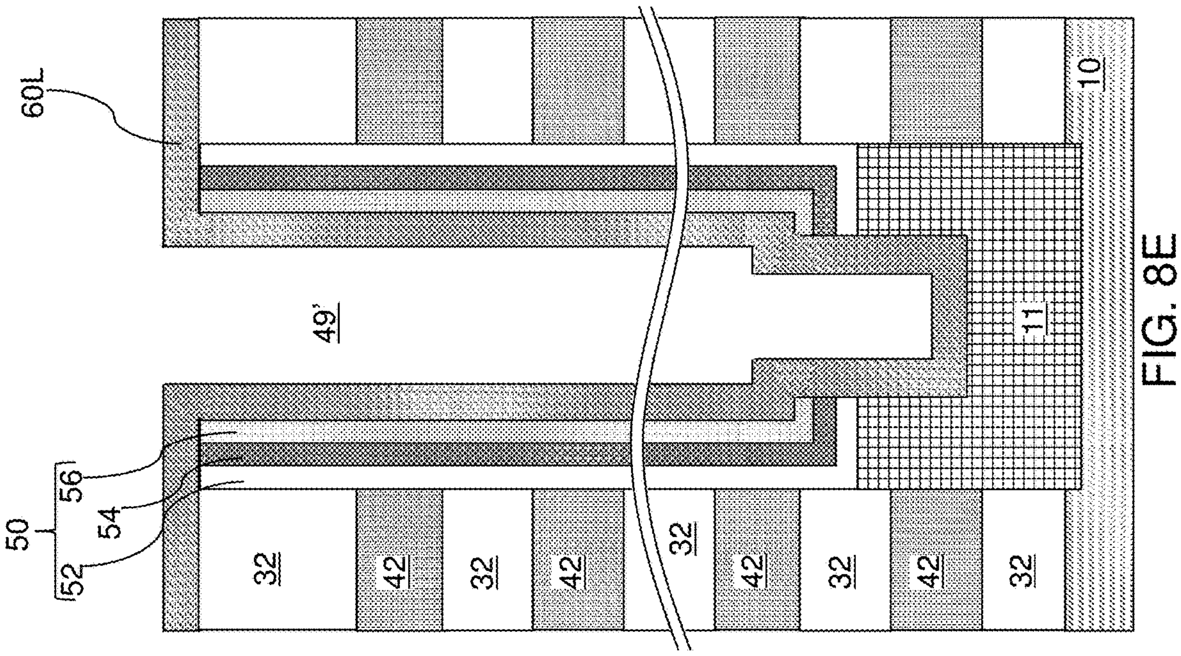

Referring to FIG. 8E, a semiconductor channel layer 60L can be deposited directly on the semiconductor surface of the pedestal channel portion 11 or the semiconductor material layer 10 if the pedestal channel portion 11 is omitted, and directly on the dielectric material liner 56.

Referring to FIG. 8F, in case the memory cavity 49' in each memory opening is not completely filled by the semiconductor channel layer 60L, a dielectric core layer 62L can be deposited.

Figures 8G, 8H:
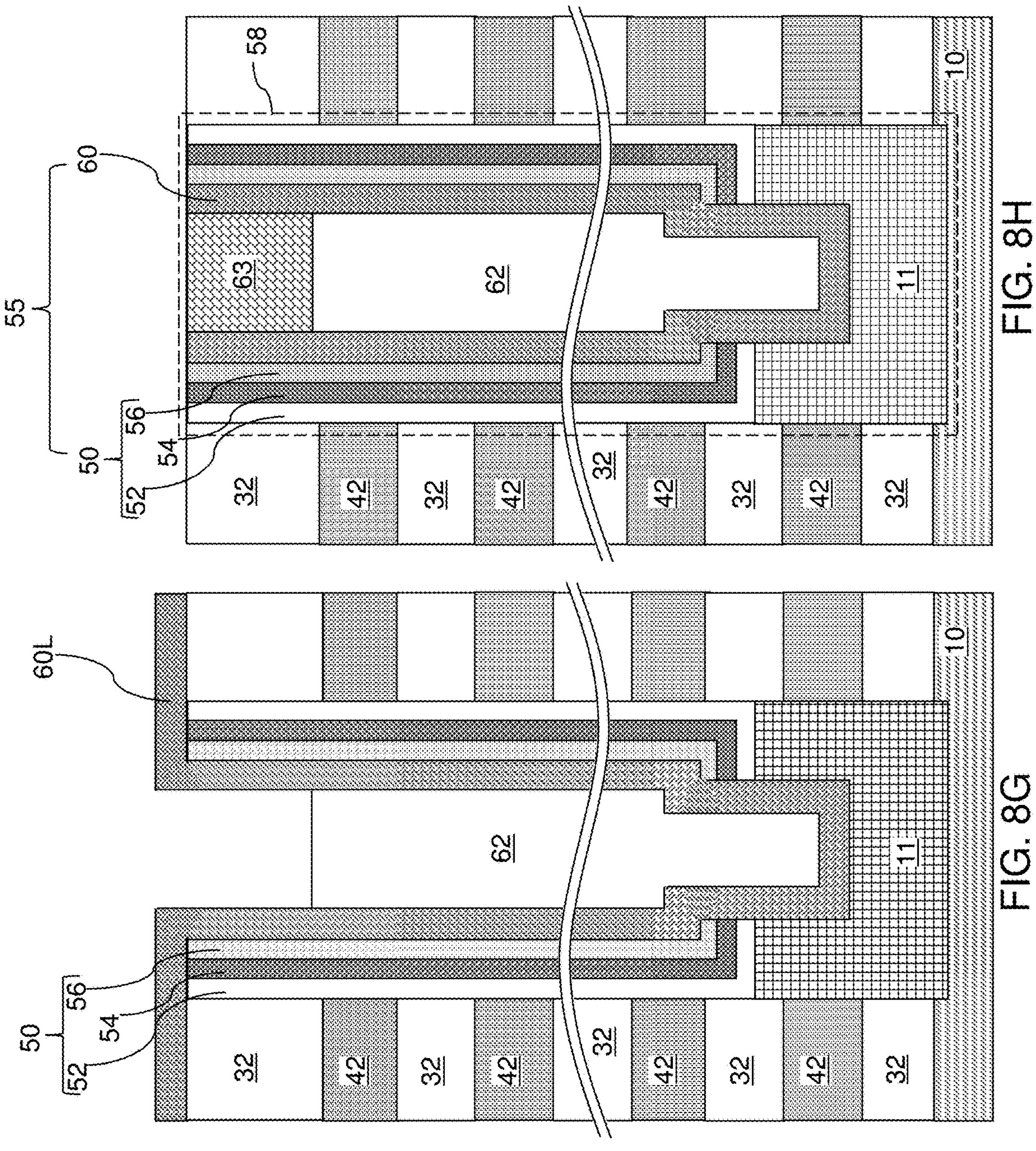

Referring to FIG. 8G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 8H, a doped semiconductor material having a doping of a second conductivity type can be deposited within each recessed region above the dielectric cores 62. The deposited semiconductor material can have a doping of a second conductivity type that is the opposite of the first conductivity type. Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each combination of a memory film 50 and a vertical semiconductor channel 60 within a memory opening 49 constitutes a memory stack structure 55. An entire set of material portions that fills a memory opening 49 is herein referred to as a memory opening fill structure 58. An entire set of material portions that fills a support opening 19 constitutes a support pillar structure 20.

Figure 9:
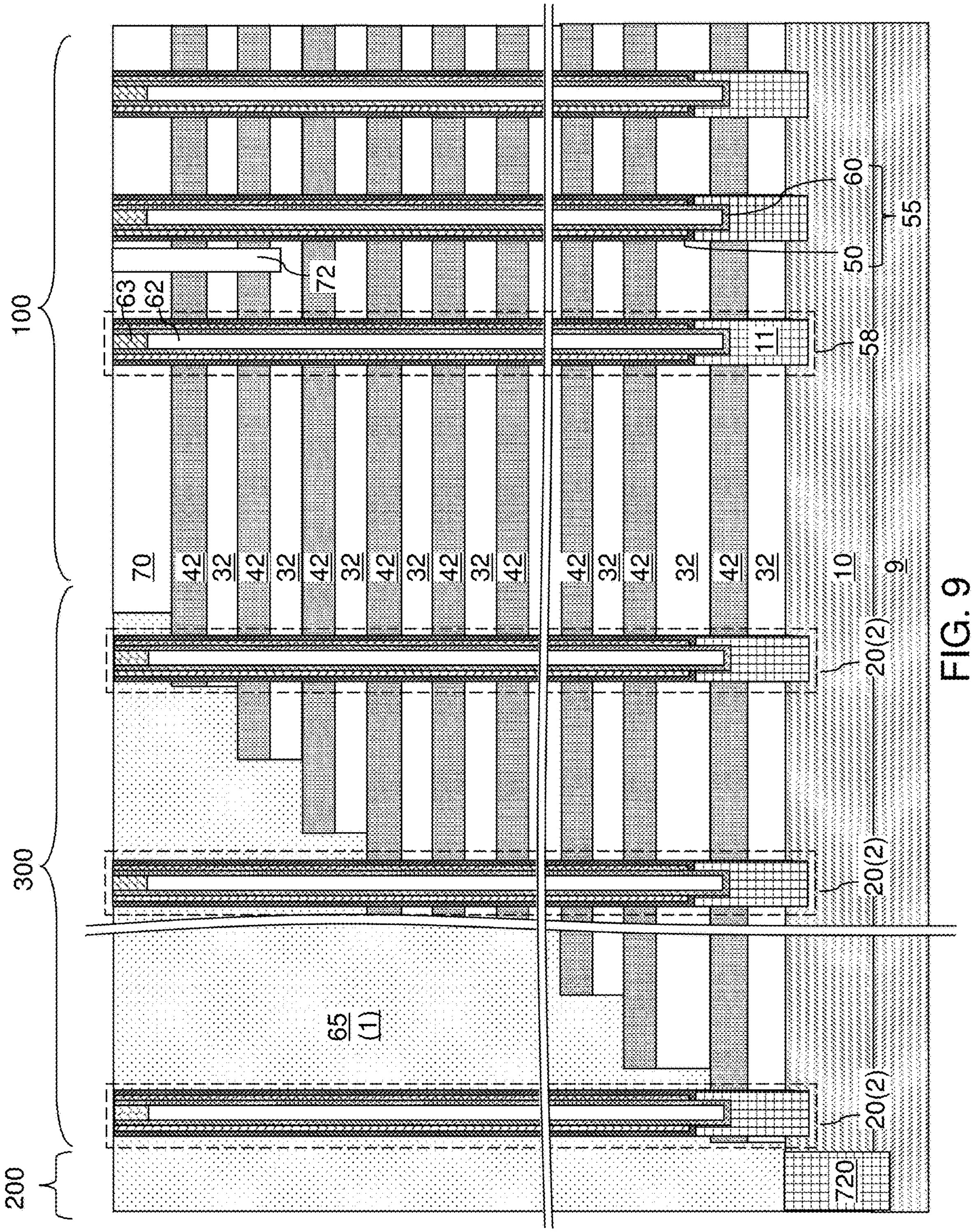
FIG. 9 is a schematic vertical cross-sectional view of a first configuration of the second exemplary structure after formation of memory opening fill structures and support pillar structures according to the second embodiment of the present disclosure.

Referring to FIG. 9, the second exemplary structure is illustrated after formation of memory opening fill structures 58 and support pillar structure 20 within the memory openings 49 and the support openings 19, respectively. An instance of a memory opening fill structure 58 can be formed within each memory opening 49. An instance of the support pillar structure 20 can be formed within each support opening 19. The support pillar structures 20 can function as fill material portions 2 that fill the openings in the perforated retro-stepped dielectric material portion 65 that functions as an auxetic matrix 1.

In this embodiment, the auxetic matrix 1 includes the perforated retro-stepped dielectric material portion 65 and comprises a first material. The auxetic matrix 1 may comprise a continuously extending structure with a plurality of openings (such as support openings 19) therethrough. A predominant fraction (i.e., more than 50%), and/or each, of the plurality of openings has a respective maximum lateral dimension less than 1 mm. A plurality of fill material portions 2 (such as the support pillar structures 20) comprising a second material (which may be any material of the support pillar structures 20) can be embedded within a respective one of the plurality of openings 19 in the auxetic matrix 1. A semiconductor substrate 9 underlies the auxetic matrix 1. A Poission's ratio for the auxetic matrix 1 as calculated by a ratio of a negative of a linear deformation distance per unit length along a second horizontal direction to a linear deformation distance per unit length along a first horizontal direction that is perpendicular to the second horizontal direction is negative.

Figure 10A:
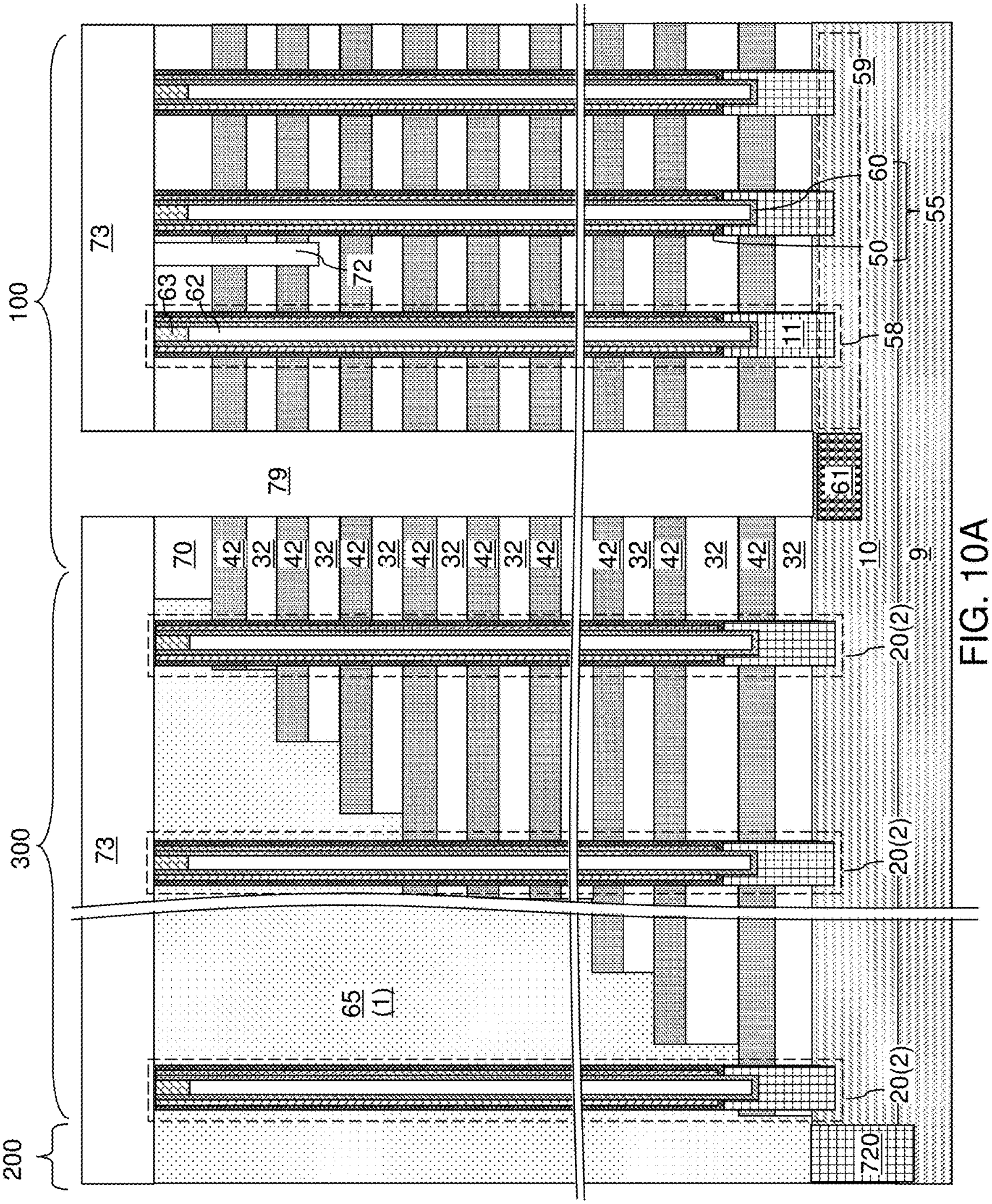
FIG. 10A is a schematic vertical cross-sectional view of the second exemplary structure after formation of a contact-level dielectric layer and backside trenches according to an embodiment of the present disclosure.
Figure 10B:
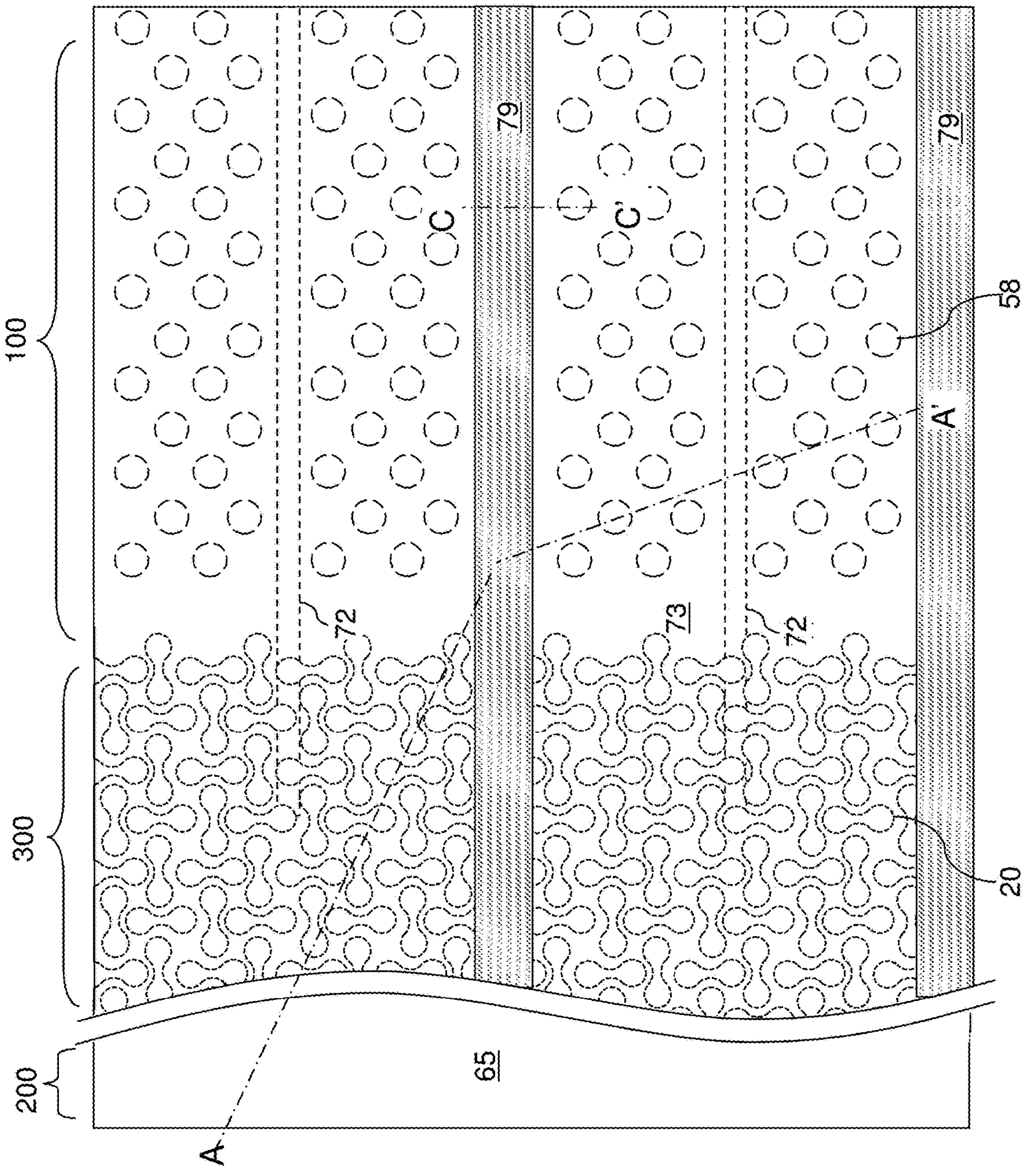
FIG. 10B is a top-down view of the exemplary configuration of FIG. 10A.

Referring to FIGS. 10A and 10B, a contact-level dielectric layer 73 can be formed over the alternating stack (32, 42) and over the memory opening fill structures 58 and the support pillar structures 20. A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the semiconductor material layer 10 or to the top surface of the semiconductor substrate 9 (in case the semiconductor material layer 10 is omitted), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 11:
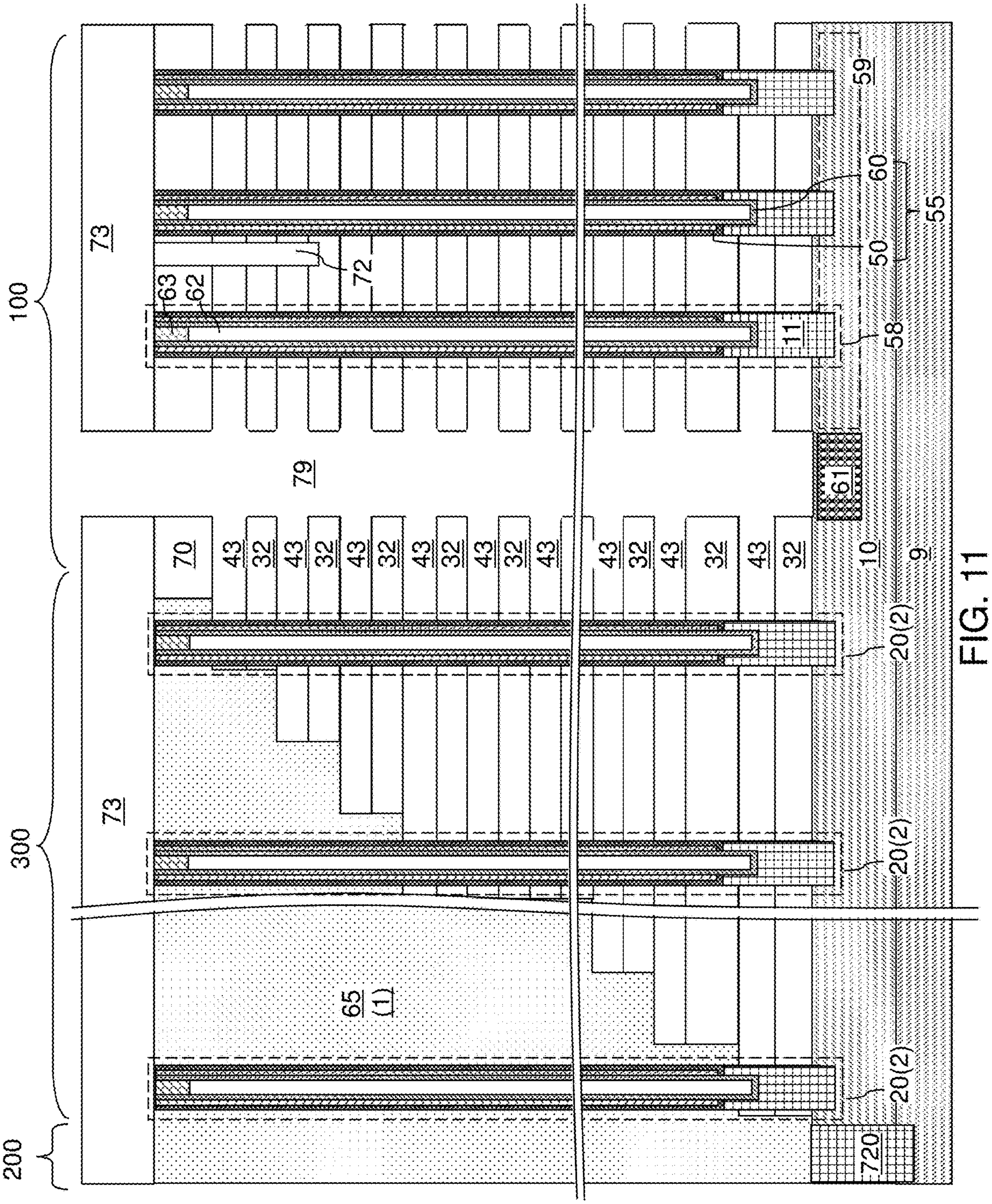
FIG. 11 is a schematic vertical cross-sectional view of the second exemplary structure after formation of backside recesses according to an embodiment of the present disclosure.

Referring to FIG. 11, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. Each backside recess 43 can be a laterally extending cavity having a lateral dimension that is greater than the vertical extent of the cavity. A plurality of backside recesses 43 can be formed in the volumes from which the second material of the sacrificial material layers 42 is removed.

Figure 12:
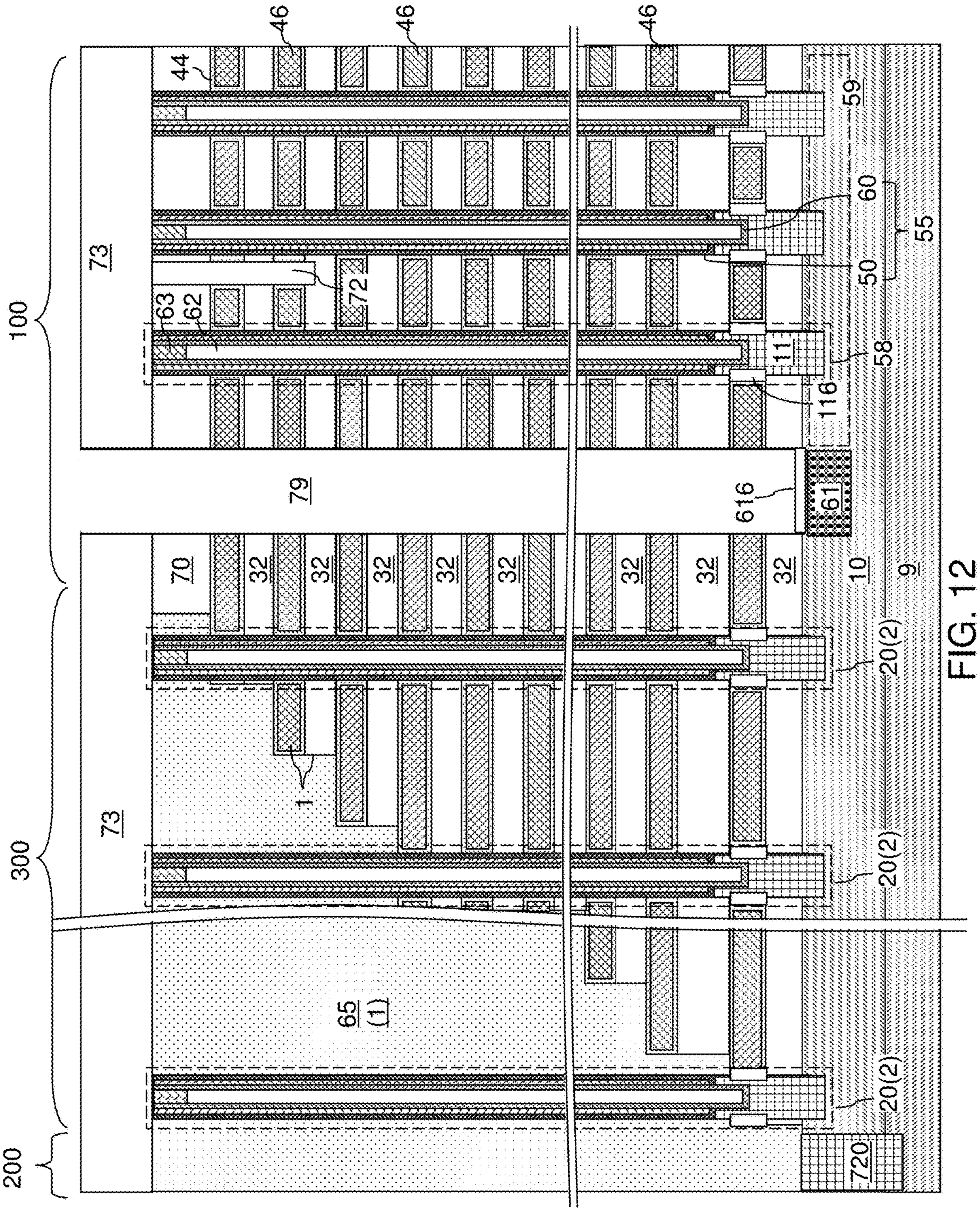
FIG. 12 is a schematic vertical cross-sectional view of the second exemplary structure after formation of electrically conductive layers according to an embodiment of the present disclosure.

Referring to FIG. 12, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616.

A backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

At least one metallic fill material can be deposited in the backside recesses 43. For example, a combination of a metallic barrier layer and a metal fill material is deposited in the plurality of backside recesses 43, on the sidewalls of the at least one the backside trench 79, and over the top surface of the contact-level dielectric layer 73. Each of the at least one metallic material can be deposited by a conformal deposition method, which can be, for example, chemical vapor deposition (CVD), atomic layer deposition (ALD), electroless plating, electroplating, or a combination thereof.

A plurality of electrically conductive layers 46 can be formed in the plurality of backside recesses 43, and a continuous metallic material layer (not shown) can be formed on the sidewalls of each backside trench 79 and over the contact-level dielectric layer 73. Each sacrificial material layer 42 can be replaced with an electrically conductive layer 46. The deposited metallic material of the continuous electrically conductive material layer is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

In this embodiment, the auxetic matrix 1 may also include portions of the electrically conductive layers 46 and the insulating layers 32 located in the contact region 300 and laterally surrounding the support pillar structures 20 in addition to including the perforated retro-stepped dielectric material portion 65. The auxetic matrix 1 is formed by forming and patterning at least one first material layer over the semiconductor substrate 9. A plurality of fill material portions 2 (which comprise the support pillar structures 20 in this embodiment) comprising a second material (which may be any material of the support pillar structures 20) can be formed after formation of the auxetic matrix 1. The plurality of fill material portions 2 is embedded within a respective one of the plurality of openings in the auxetic matrix 1. A Poission's ratio for the auxetic matrix 1 as calculated by a ratio of a negative of a linear deformation distance per unit length along a second horizontal direction to a linear deformation distance per unit length along a first horizontal direction that is perpendicular to the second horizontal direction is negative.

Figure 13:
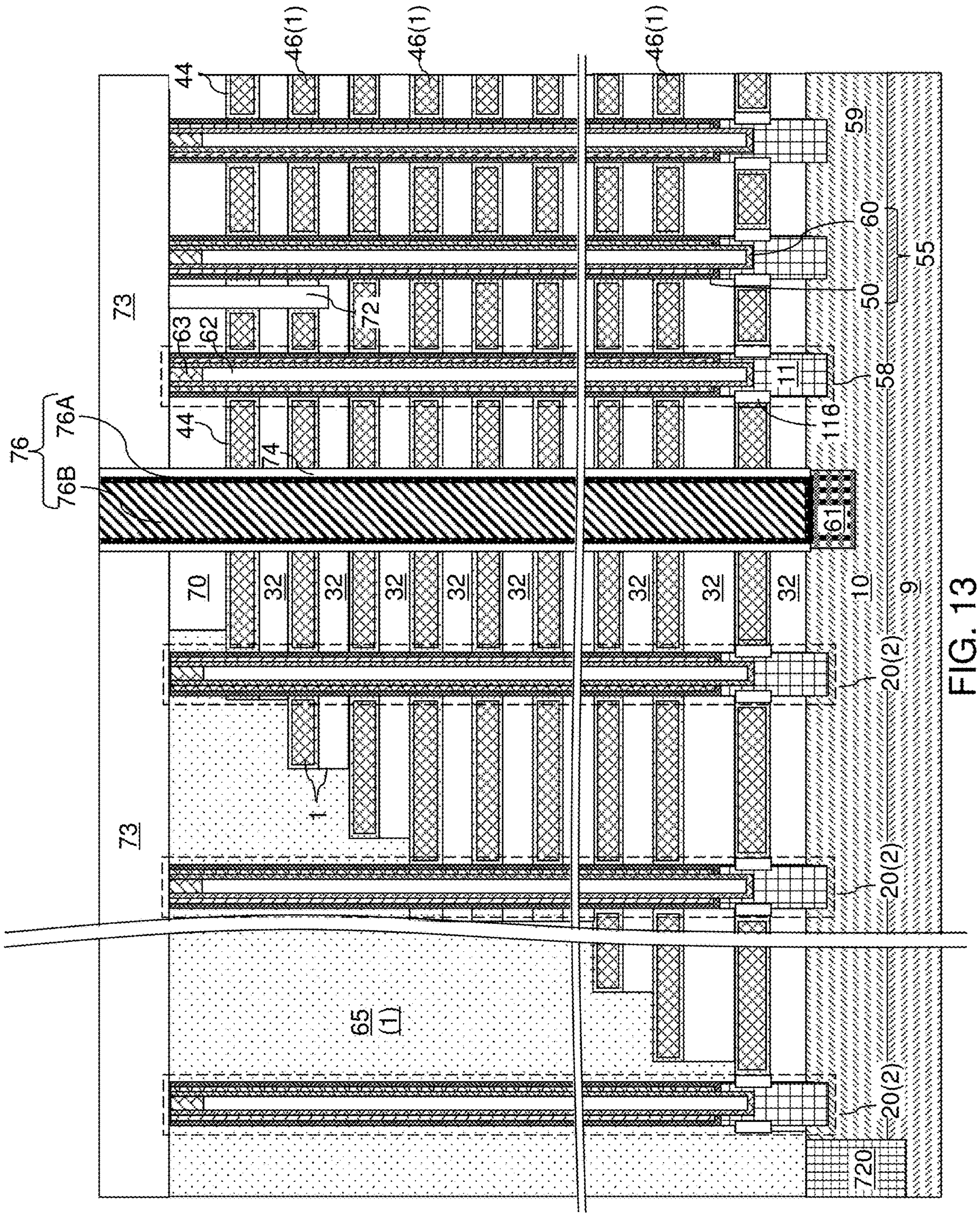
FIG. 13 is a schematic vertical cross-sectional view of the second exemplary structure after formation of backside trench fill structures according to an embodiment of the present disclosure.

Referring to FIG. 13, an insulating material layer can be formed in the backside trenches 79 and over the contact-level dielectric layer 73 by a conformal deposition process. Second exemplary conformal deposition processes include, but are not limited to, chemical vapor deposition and atomic layer deposition. An anisotropic etch is performed to remove horizontal portions of the insulating material layer and the planar dielectric portion 616 (if present) from above the contact-level dielectric layer 73 and at the bottom of each backside trench 79. Each remaining portion of the insulating material layer constitutes an insulating spacer 74.

A backside contact via structure 76 can be formed by depositing at least one conductive material in the remaining unfilled volume (i.e., a backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 14A:
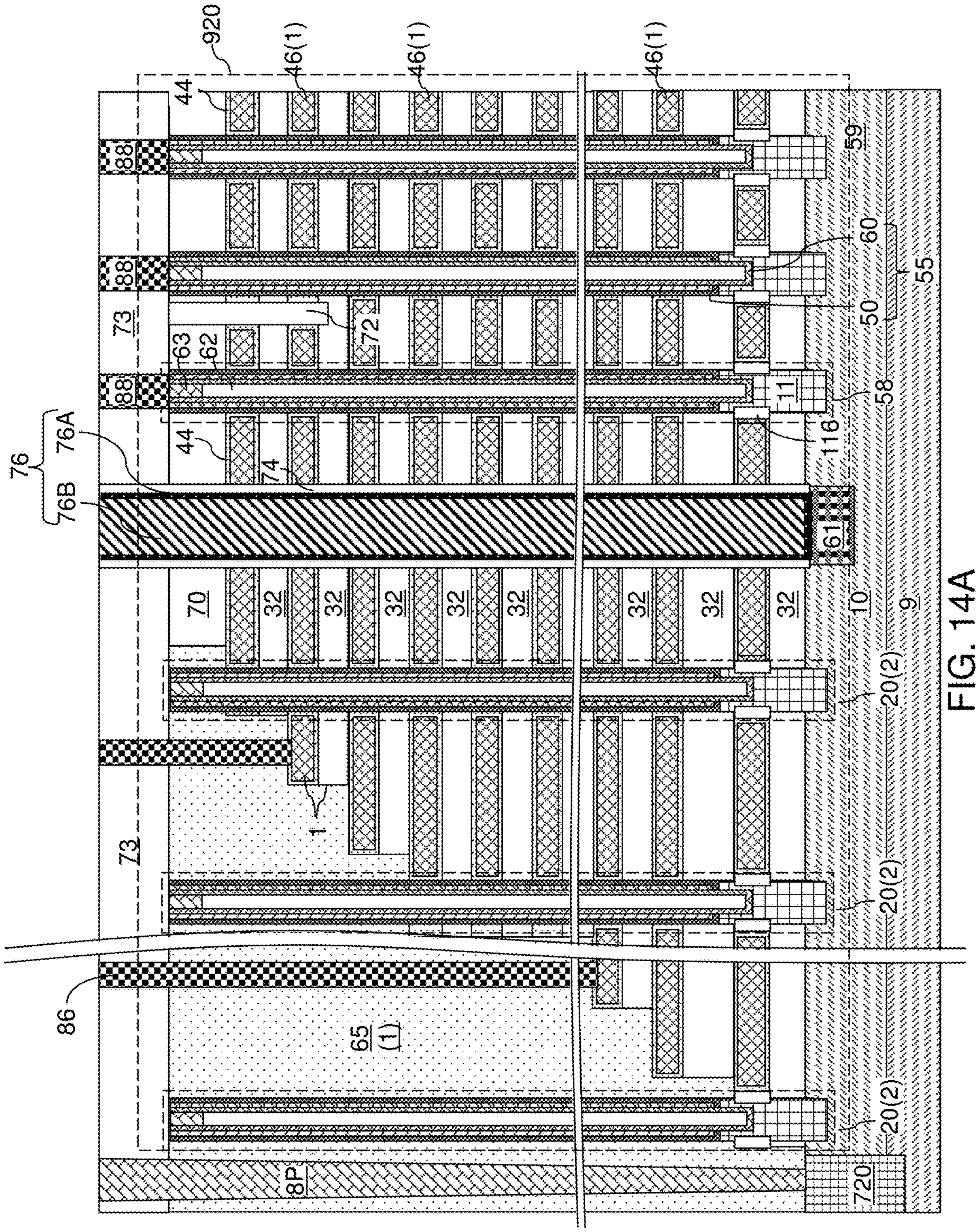
FIG. 14A is a schematic vertical cross-sectional view of the second exemplary structure after formation of contact via structures according to the first embodiment of the present disclosure.
Figure 14B:
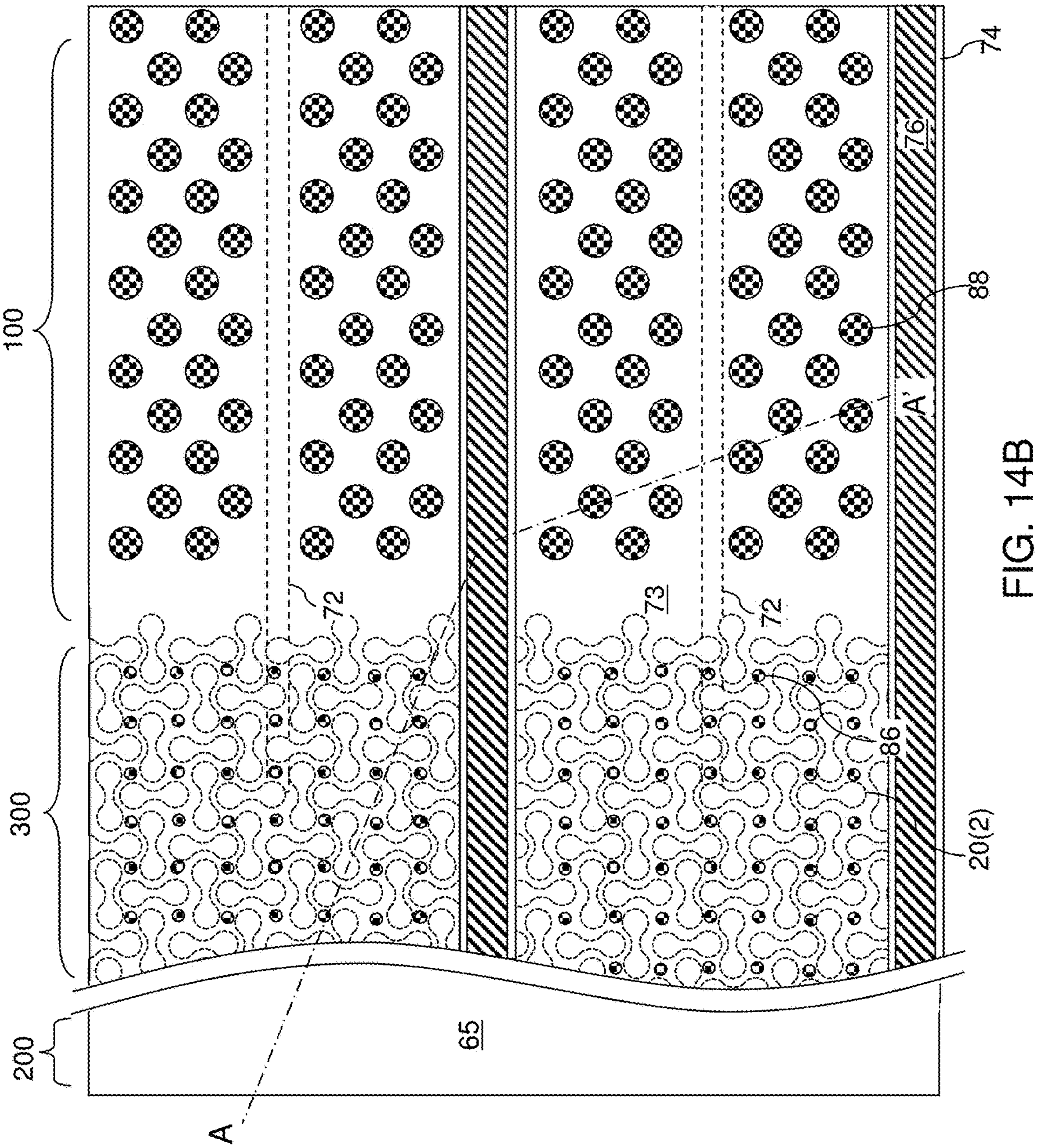
FIG. 14B is a top-down view of the second exemplary structure of FIG. 14A.

Referring to FIGS. 14A and 14B, additional contact via structures (88, 86, 8P) can be formed through the contact-level dielectric layer 73, and optionally through the retro-stepped dielectric material portion 65 of the three-dimensional memory device 920. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices 720.

Figure 15B:
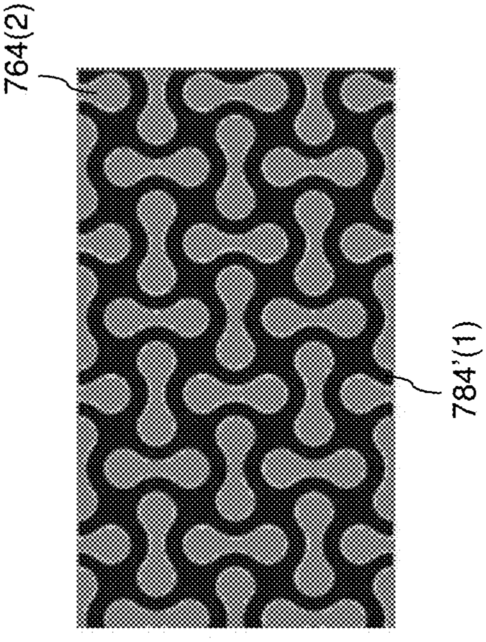
FIG. 15B is a horizontal cross-sectional view of a region of the third exemplary structure along the horizontal plane X-X' of FIG. 15A.
Figure 15A:
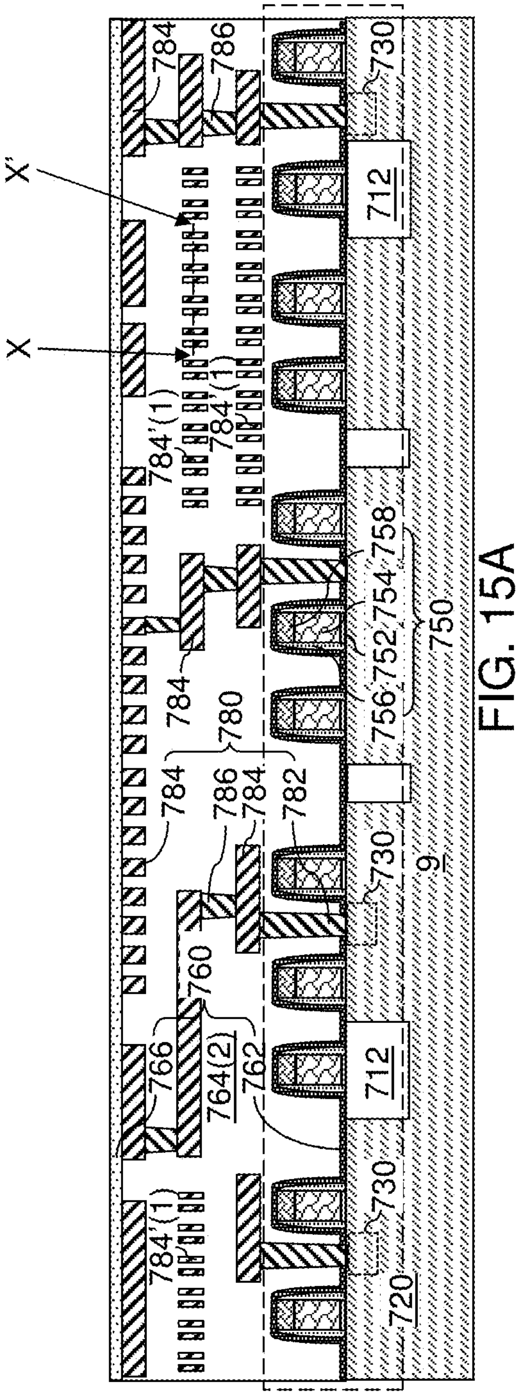
FIG. 15A is a vertical cross-sectional view of a third exemplary structure including auxetic dummy metal structures according to an embodiment of the present disclosure.
Figure 16B:
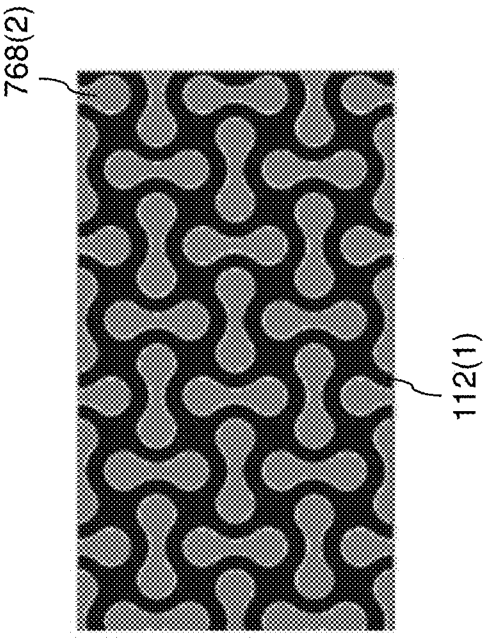
FIG. 16B is a horizontal cross-sectional view of a region of the third exemplary structure along the horizontal plane Y-Y' of FIG. 16A.
Figure 16A:
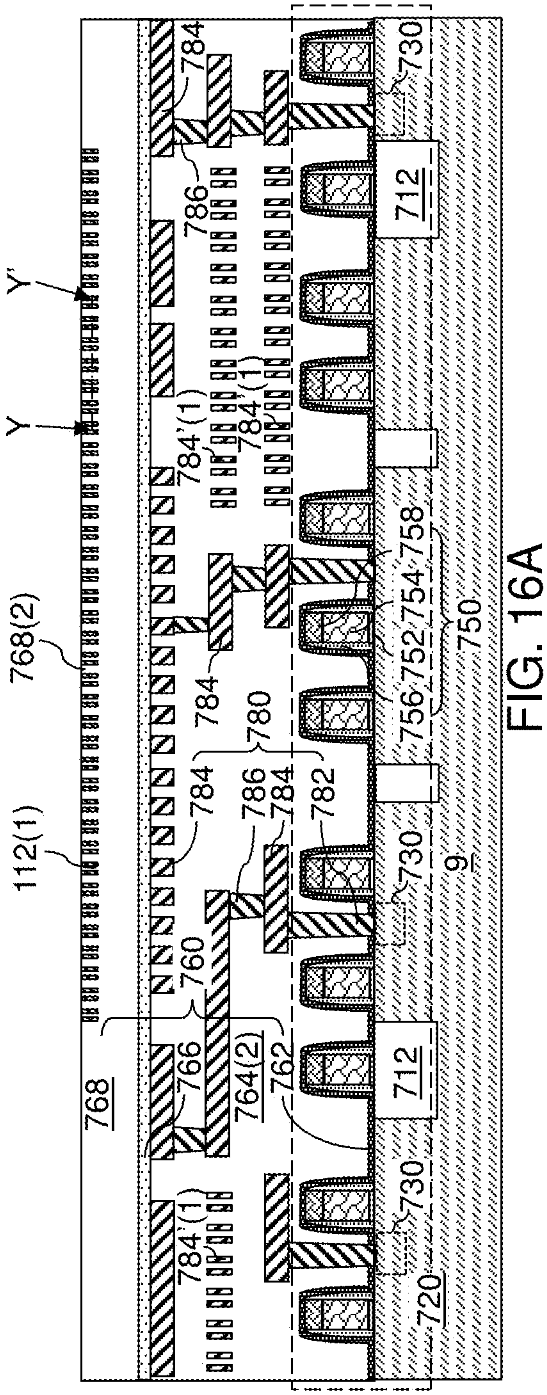
FIG. 16A is a vertical cross-sectional view of a fourth exemplary structure after formation of an auxetic lower source-level semiconductor layer according to an embodiment of the present disclosure.
Figure 16C:
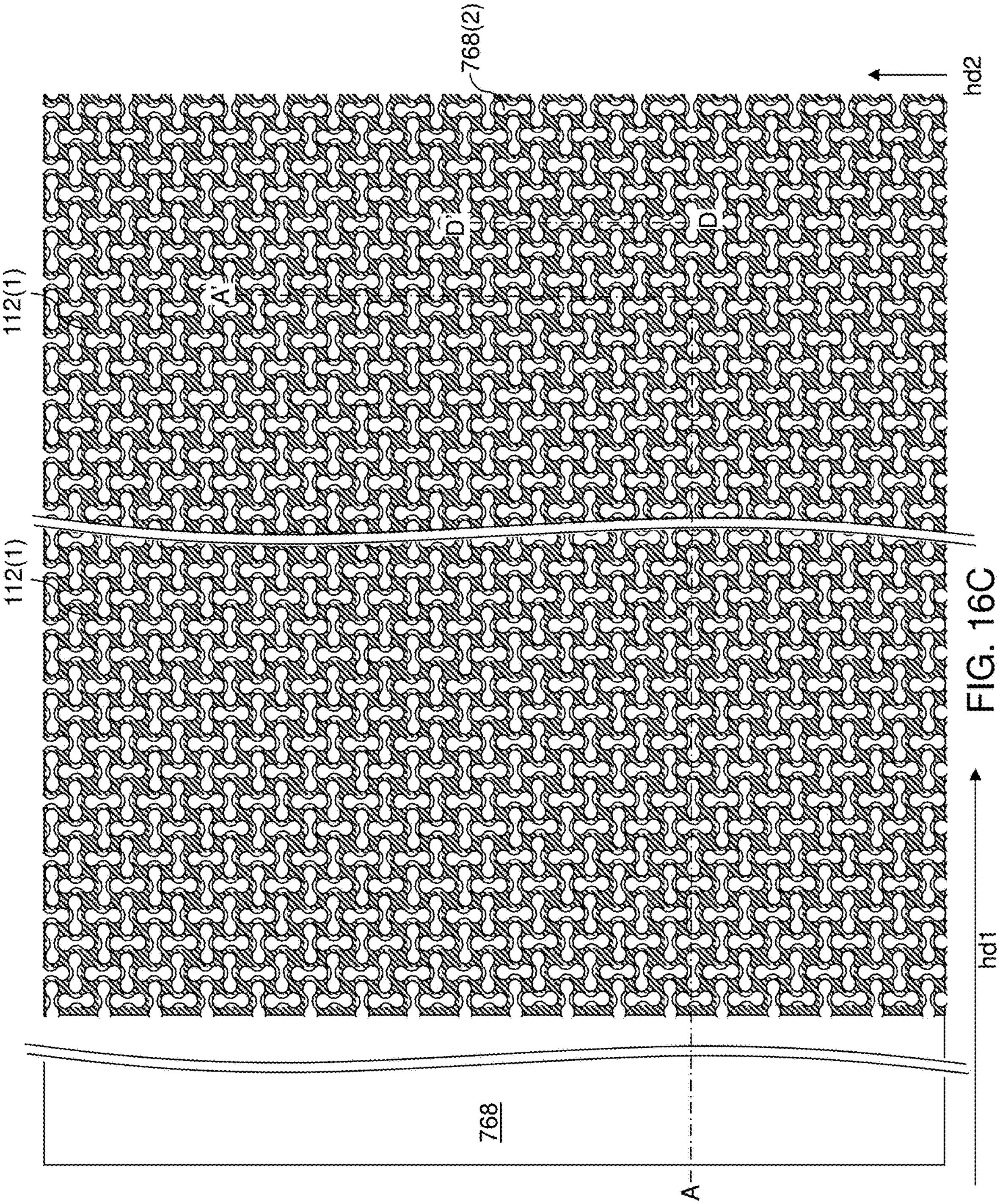
FIG. 16C is a top-down view of the fourth exemplary structure of FIG. 16A.
Figure 16D:
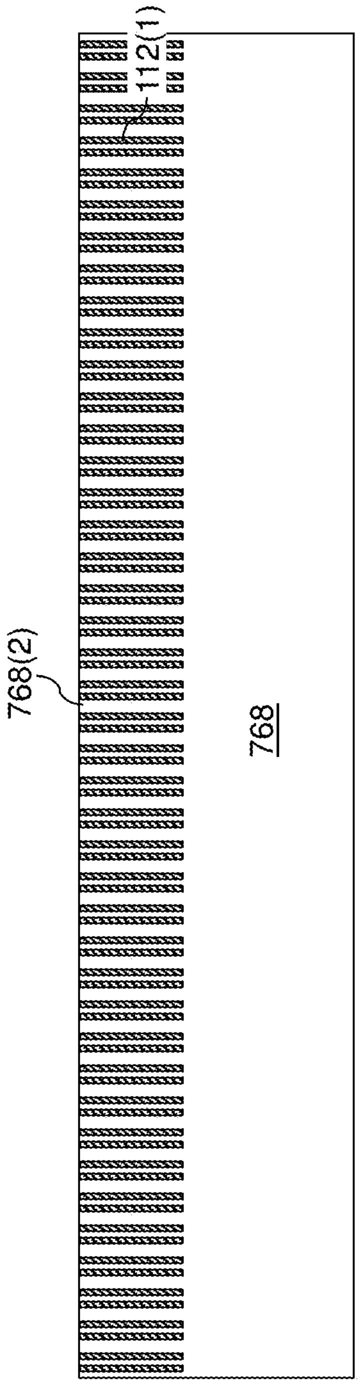
FIG. 16D is a magnified vertical cross-sectional view of a region of the fourth exemplary structure of FIG. 16A.

Referring to FIGS. 15A and 15B, a third exemplary structure including auxetic dummy metal structures 784' as an auxetic matrix 1 is illustrated according to an embodiment of the present disclosure. The third exemplary structure may be derived from the second exemplary structure illustrated in FIG. 4 by forming additional dielectric material layers (764, 766) and metal interconnect structures 780. Generally, semiconductor devices 720 can be formed over a substrate, which may be any of the auxetic substrates 9A described above, or any other type of a semiconductor substrate 9. The semiconductor devices may comprise active regions 730 and gate structures 750 that are components of field effect transistors. In one embodiment, the semiconductor devices may be formed over an entire area of the substrate 9.

Generally, dielectric material layers are formed over the semiconductor devices 720, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, and a silicon nitride layer (e.g., hydrogen diffusion barrier) 766 that overlies the first dielectric material layers 764.

The dielectric layer stack including the lower-level dielectric material layers 760 functions as a matrix for lower-level metal interconnect structures 780 that provide electrical wiring to and from the various nodes of the semiconductor devices 720 and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), lower-level metal line structures 784 (which are also referred to as metal lines), and lower-level metal via structures 786 (which are also referred to as metal via structures).

According to an embodiment of the present disclosure, at least one perforated metal plate 784' may be formed in any of the metal line levels, i.e., at the same vertical distance as a respective one of the lower-level metal line structures 784. Each of the at least one perforated metal plate 784' comprise openings such that each perforated metal plate 784' has an auxetic pattern. As such, each perforated metal plate 784' comprises the auxetic matrix 1 having an auxetic pattern. In one embodiment, the each perforated metal plate 784' comprises a continuous material portion. According to an aspect of the present disclosure, the auxetic pattern may be a microauxetic pattern having a first periodicity along a first horizontal direction that is less than 1 mm and having a second periodicity along a second horizontal direction that is less than 1 mm. However, larger dimensions may also be used. Generally, any auxetic pattern, periodic or non-periodic, may be employed for the pattern in each perforated metal plate 784'. The perforated metal plates 784' may have a same material composition as, and may have the same vertical thickness as, the metal lines located at a same level. In this case, portions of the first dielectric material layers 764 that fill the openings in the perforated metal plates 784' constitute the fill material portions 2.

In this embodiment, the auxetic matrix 1 comprising the perforated metal plate 784' with a plurality of openings therethrough can be formed over the substrate 9. The auxetic matrix 1 comprises a first material (such as an electrically conductive material) and may comprise a continuously extending structure (such as the perforated metal plate 784'). A predominant fraction (i.e., more than 50%) of the plurality of openings has a respective maximum lateral dimension less than 1 mm. However, larger dimensions may also be used. The auxetic matrix 1 is formed by depositing and patterning a material layer (e.g., by depositing and patterning a metal layer) over the substrate 9. A plurality of fill material portions 2 (comprising the vertically-extending portions of the first dielectric material layers 764 in this embodiment) comprising a second material (such as a dielectric material) can be formed after or prior to formation of the auxetic matrix 1. The plurality of fill material portions 2 are embedded within a respective one of the plurality of openings in the auxetic matrix 1. A Poission's ratio for the auxetic matrix 1 as calculated by a ratio of a negative of a linear deformation distance per unit length along a second horizontal direction to a linear deformation distance per unit length along a first horizontal direction that is perpendicular to the second horizontal direction is negative.

Referring to FIGS. 16A-16D, a fourth exemplary structure may be derived from the third exemplary structure illustrated in FIGS. 15A and 15B, the second exemplary structure illustrated in FIG. 4, or the first exemplary structures described above, by forming a dielectric material layer and an auxetic lower source-level semiconductor layer 112, i.e., a lower source-level semiconductor layer that is formed with an auxetic pattern and functions as an auxetic matrix 1. In other words, a buried source line of a three-dimensional memory device in a CMOS under memory array type device functions as the auxetic matrix 1. The auxetic lower source-level semiconductor layer 112 is also referred to as a perforated doped semiconductor material layer 112. In this case, vertically-extending portions of the dielectric material layer constitute fill material portions 2. In case the dielectric material layer that embeds the auxetic lower source-level semiconductor layer 112 is formed over the first dielectric material layers 764, the dielectric material layer is herein referred to as a second dielectric material layer 768.

In one embodiment, the second dielectric material layer 768 can be formed over the substrate 9, and a continuous trench can be formed in the second dielectric material layer 768. The continuous trench laterally encloses a plurality of unetched portions of the second dielectric material layer 768 which comprise the plurality of fill material portions 2. A doped semiconductor material may be deposited in the continuous trench, and may be subsequently planarized to form the perforated doped semiconductor material layer 112. Alternatively, the perforated doped semiconductor material layer 112 is formed first by deposition and patterning, followed by depositing the second dielectric material layer 768 in the openings in the perforated doped semiconductor material layer 112. The second dielectric material layer 768 may then be planarized with the top of the perforated doped semiconductor material layer 112.

Figure 17A:
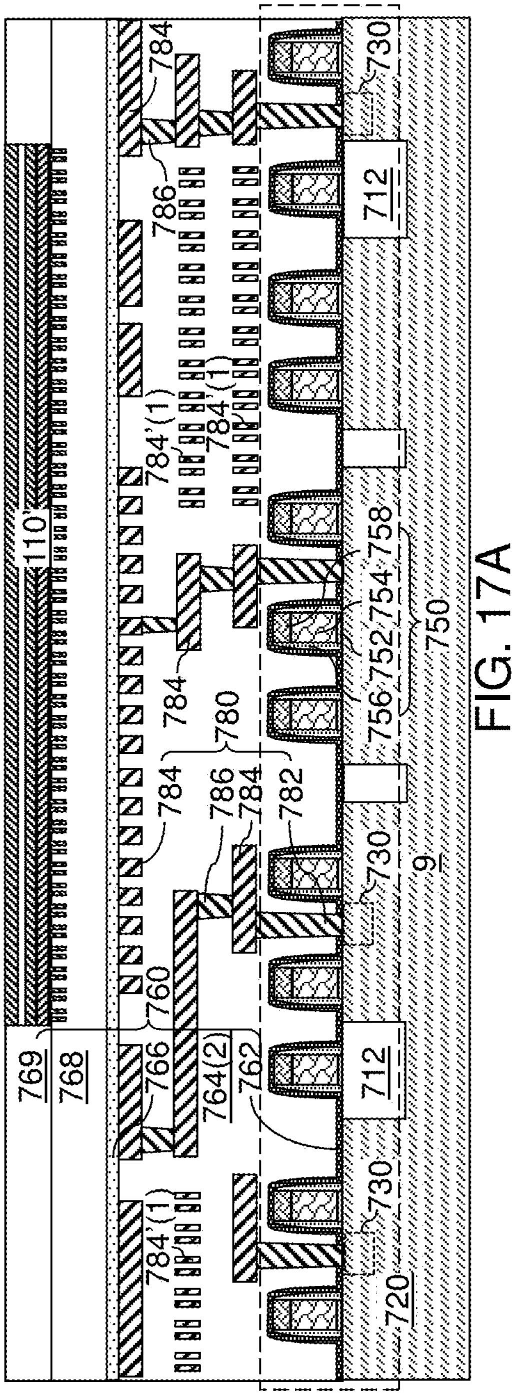
FIG. 17A is a vertical cross-sectional view of the fourth exemplary structure after formation of source-level material layers according to an embodiment of the present disclosure.
Figure 17B:
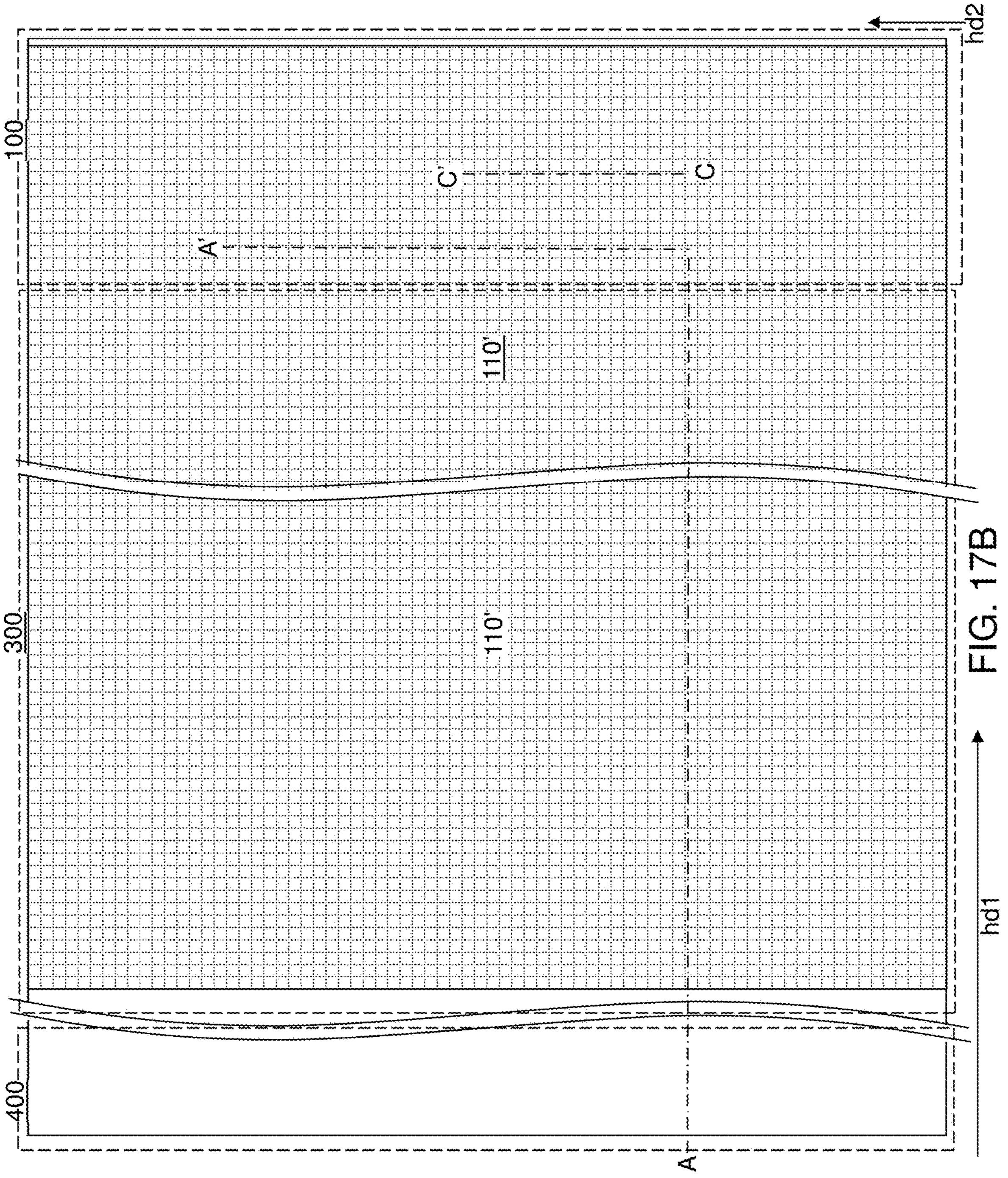
FIG. 17B is a top-down view of the fourth exemplary structure of FIG. 17A
Figure 17C:
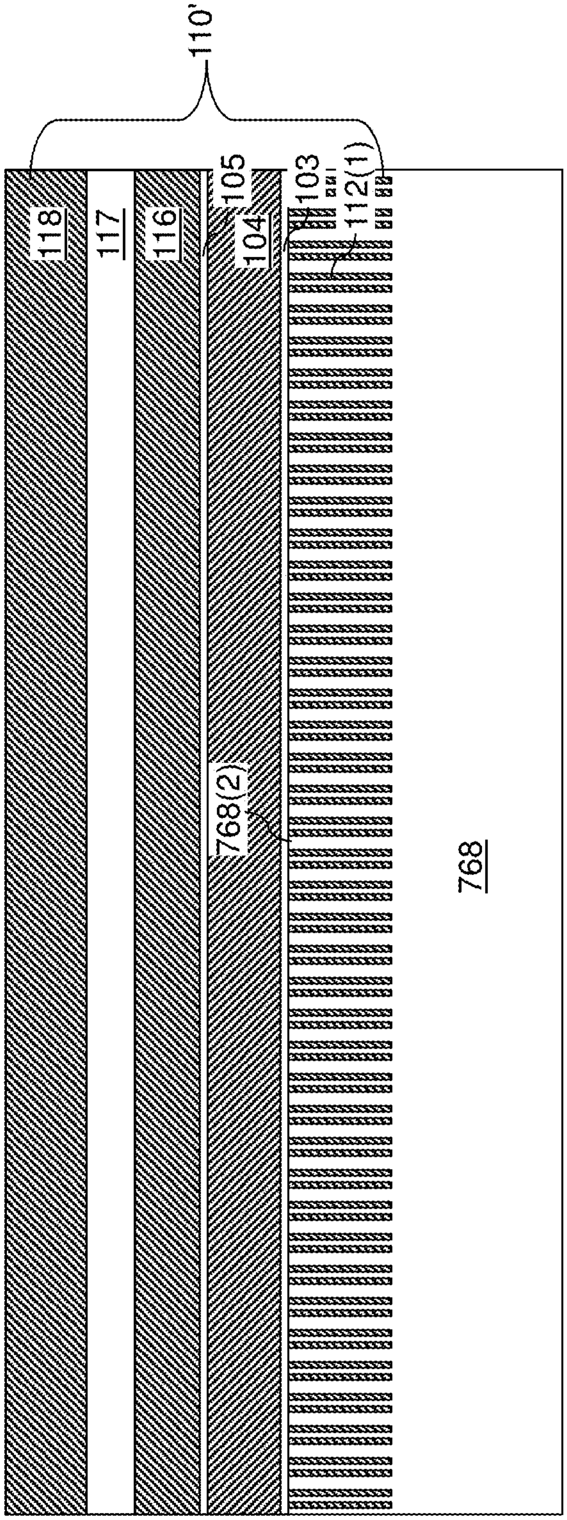
FIG. 17C is a magnified vertical cross-sectional view of a region of the fourth exemplary structure of FIG. 17A.

Referring to FIGS. 17A-17C, additional material layers can be deposited to form in-process source-level material layers 10'. The additional material layers may include, for example, a lower sacrificial liner 103, a source-level sacrificial layer 104, an upper sacrificial liner 105, an upper source-level semiconductor layer 116, a source-level insulating layer 117, and an optional source-select-level conductive layer 118. The combination of the auxetic lower source-level semiconductor layer 112 (which is a perforated doped semiconductor material layer), the lower sacrificial liner 103, the source-level sacrificial layer 104, the upper sacrificial liner 105, the upper source-level semiconductor layer 116, the source-level insulating layer 117, and the optional source-select-level conductive layer 118 constitutes the in-process source-level material layers 110'. The in-process source-level material layers 110' may be patterned, and a third dielectric material layer 769 can be formed around the in-process source-level material layers 110'. The second dielectric material layer 768 and the third dielectric material layer 769 can be incorporated into the lower-level dielectric material layers 760.

Figure 18:
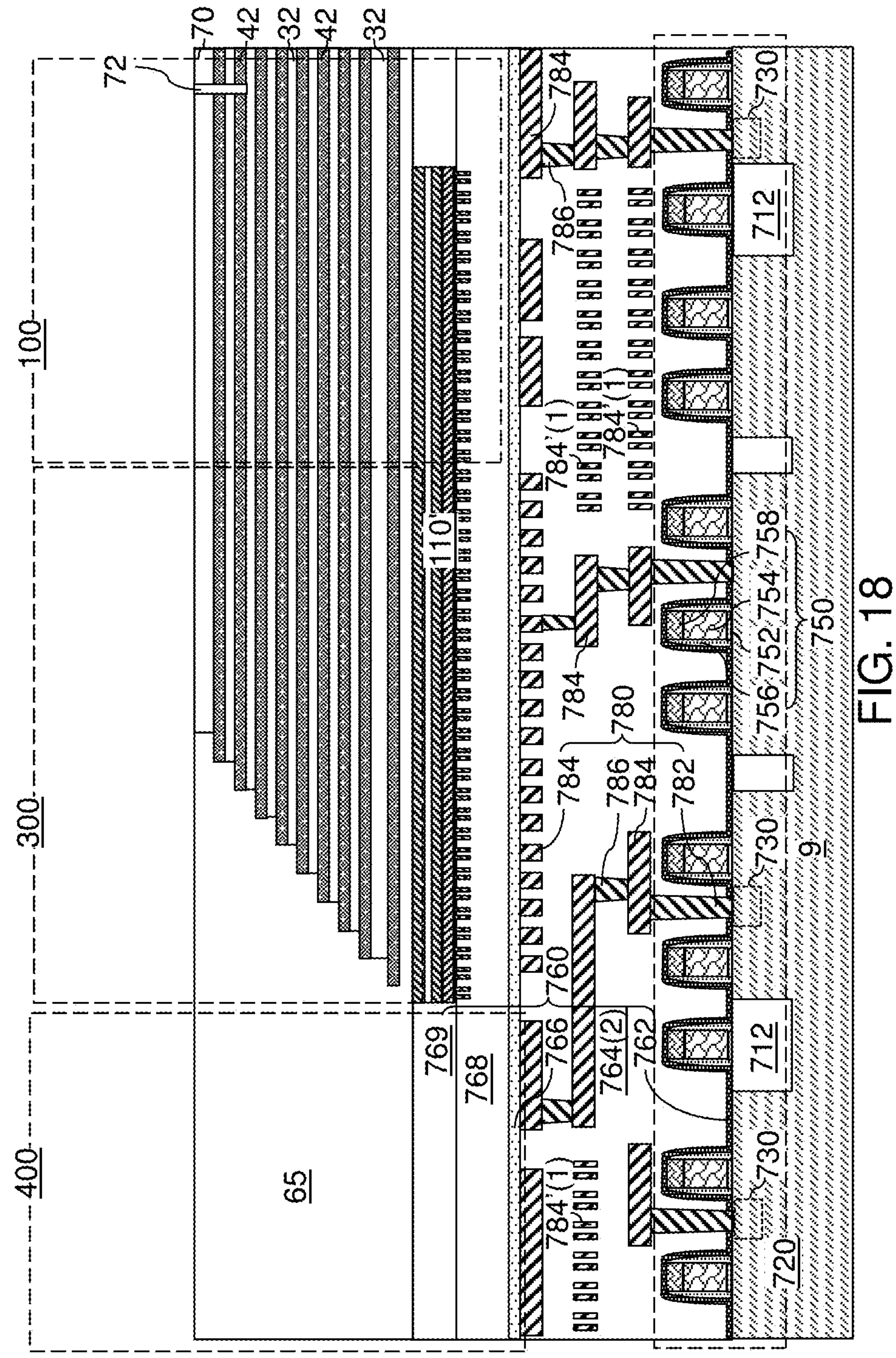
FIG. 18 is a vertical cross-sectional view of the fourth exemplary structure after formation of an alternating stack of insulating layers and sacrificial material layers, stepped surfaces, and a retro-stepped dielectric material potion according to an embodiment of the present disclosure.

Referring to FIG. 18, the processing steps of FIGS. 5 and 6 may be performed to form an alternating stack of insulating layers 32 and sacrificial material layers 42, a retro-stepped dielectric material portion 65, and drain-select-level isolation structures 72.

Figure 19A:
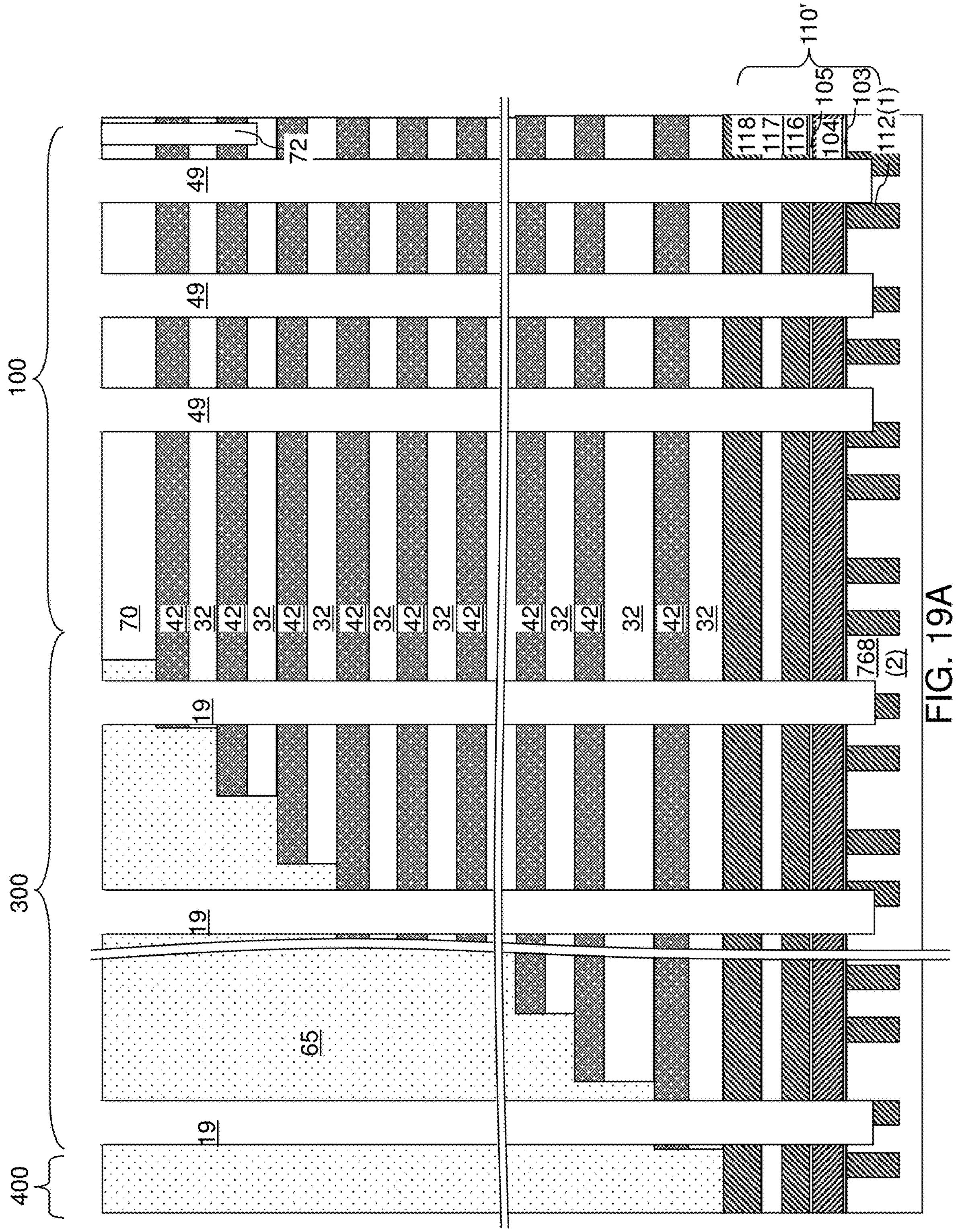
FIG. 19A is a vertical cross-sectional view of a region of the fourth exemplary structure after formation of memory openings and support openings according to an embodiment of the present disclosure.
Figure 19B:
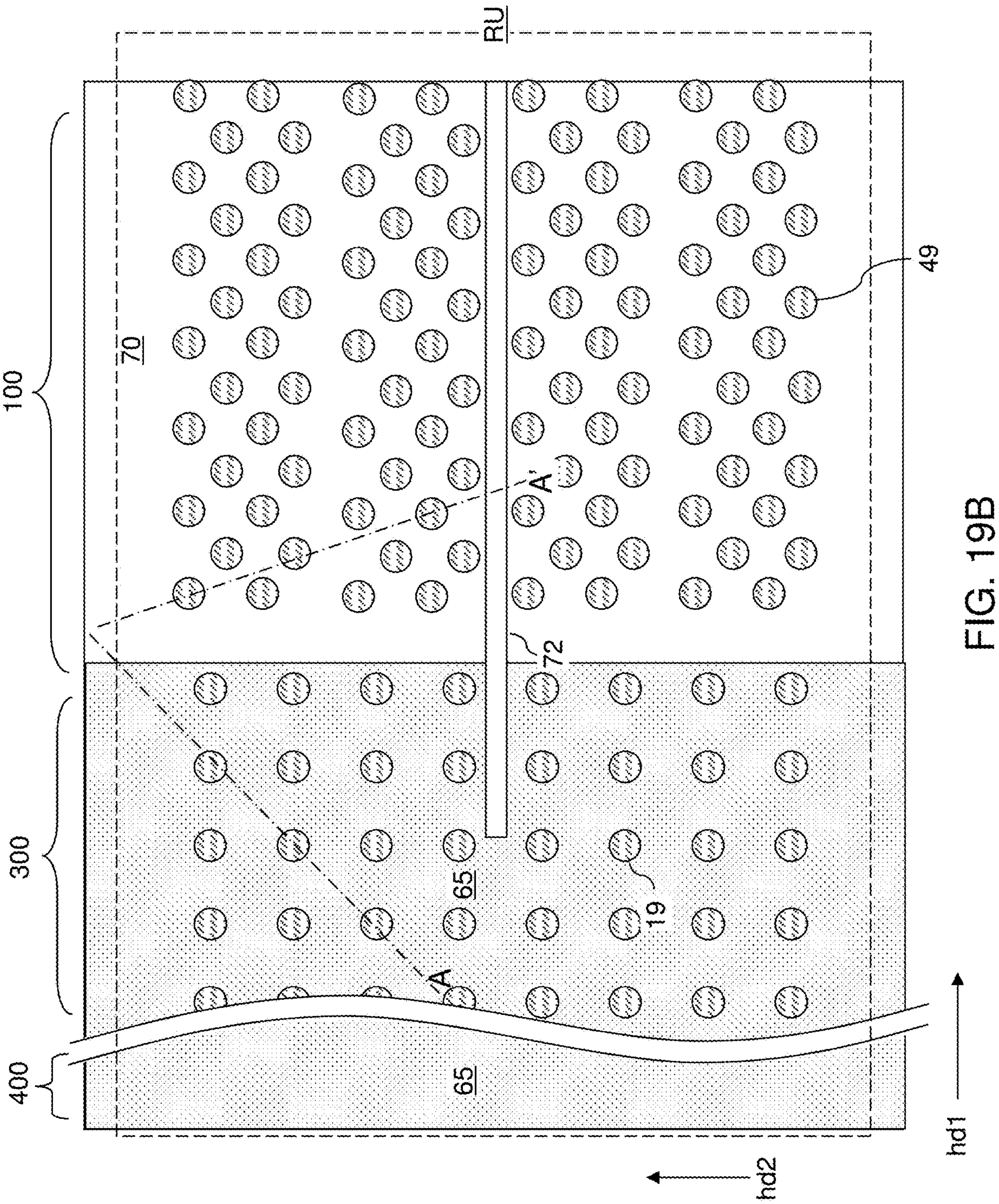
FIG. 19B is a top-down view of the fourth exemplary structure of FIG. 19A.

Referring to FIGS. 19A and 19B, the processing steps of FIGS. 7A and 7B may be performed to form memory openings 49 and support openings 19. In some embodiments, the pattern for the shapes of support openings 19 described with reference to FIGS. 7A and 7B may be employed. In this case, the perforated retro-stepped dielectric material portion 65 and/or the perforated portions of the sacrificial material layers 42 that are perforated by the support openings 19 may function as an additional auxetic matrix 1 as described above.

Figure 20A:
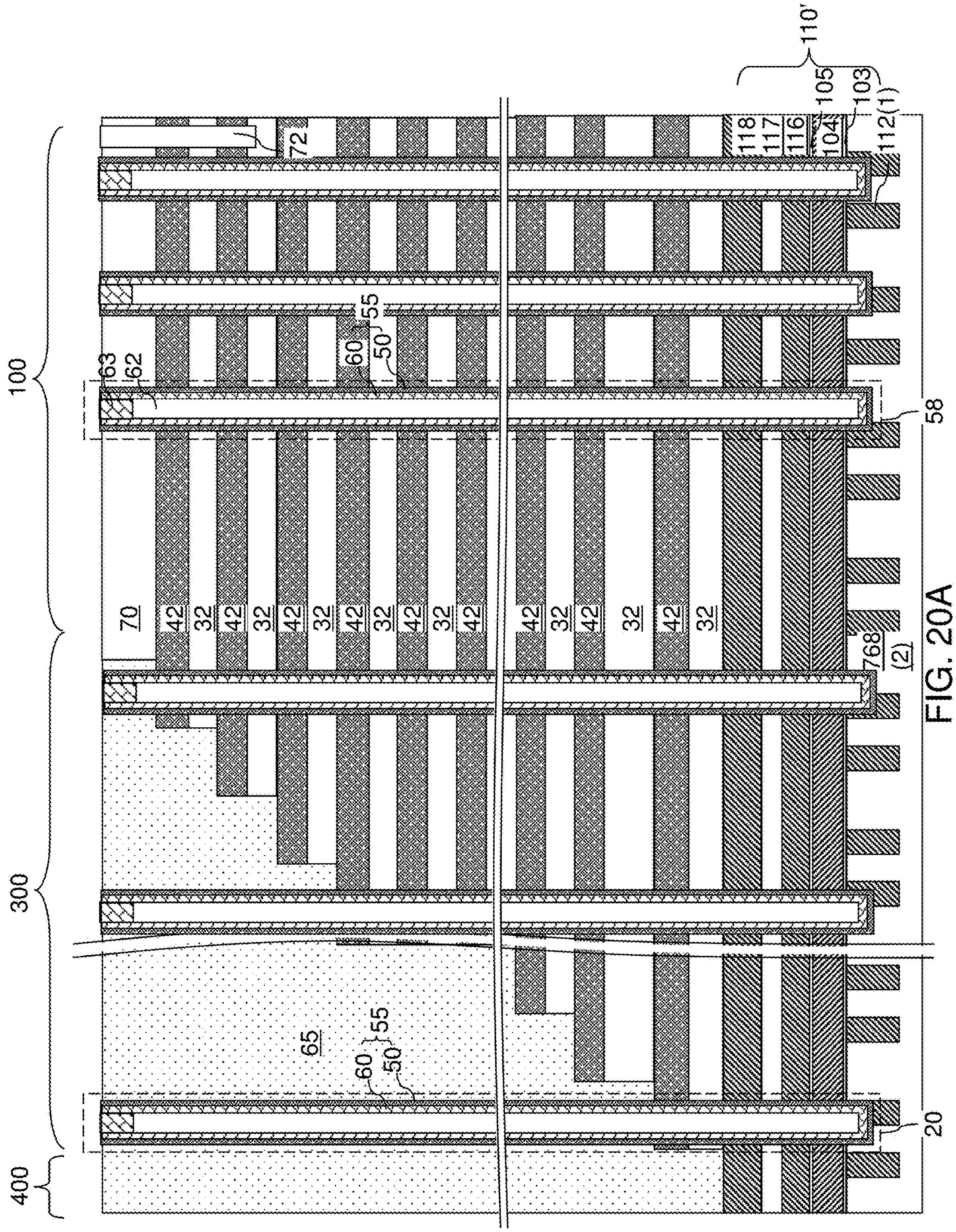
FIG. 20A is a vertical cross-sectional view of a region of the fourth exemplary structure after formation of memory opening fill structures and support pillar structures according to an embodiment of the present disclosure.
Figure 20B:
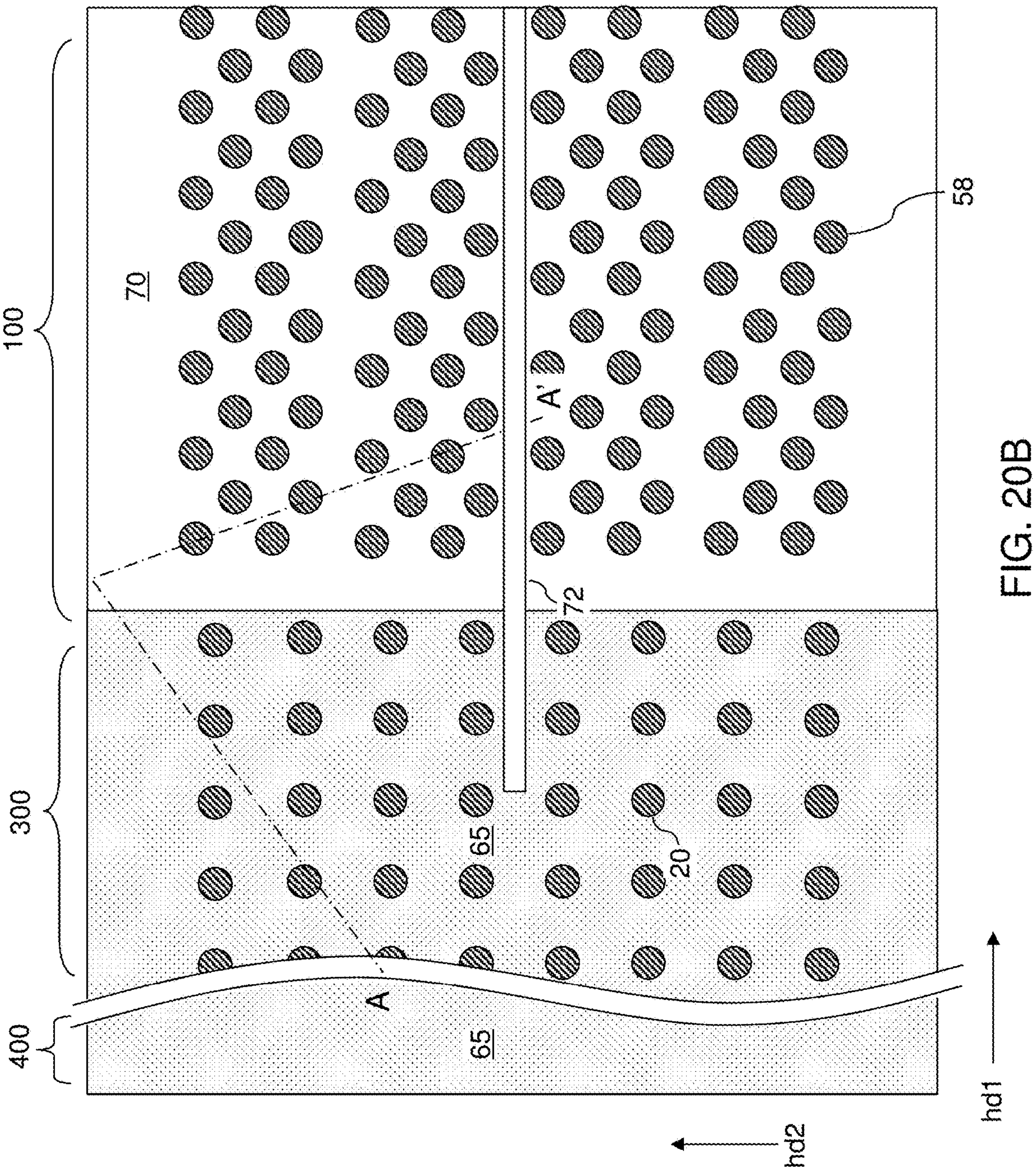
FIG. 20B is a top-down view of the fourth exemplary structure of FIG. 20A.

Referring to FIGS. 20A and 20B, a memory opening fill structure 58 can be formed in each memory opening 49, and a support pillar structure 20 can be formed in each support opening 19. The processing steps described with reference to FIGS. 8A-8H may be employed to form the memory opening fill structures 58 and the support pillar structures 20. As discussed above, pedestal channel portions 11 may, or may not, be omitted. In some embodiments, the memory opening fill structures 58 and the support pillar structures 20 may be formed without the pedestal channel portions 11 and without use of a sacrificial cover material layer 601. Generally, the memory opening fill structures 58 and the support pillar structures 20 may be formed in any configuration known in the art. Generally, bottom regions of the memory opening fill structures 58 contact the perforated doped semiconductor material layer 112.

Figure 21:
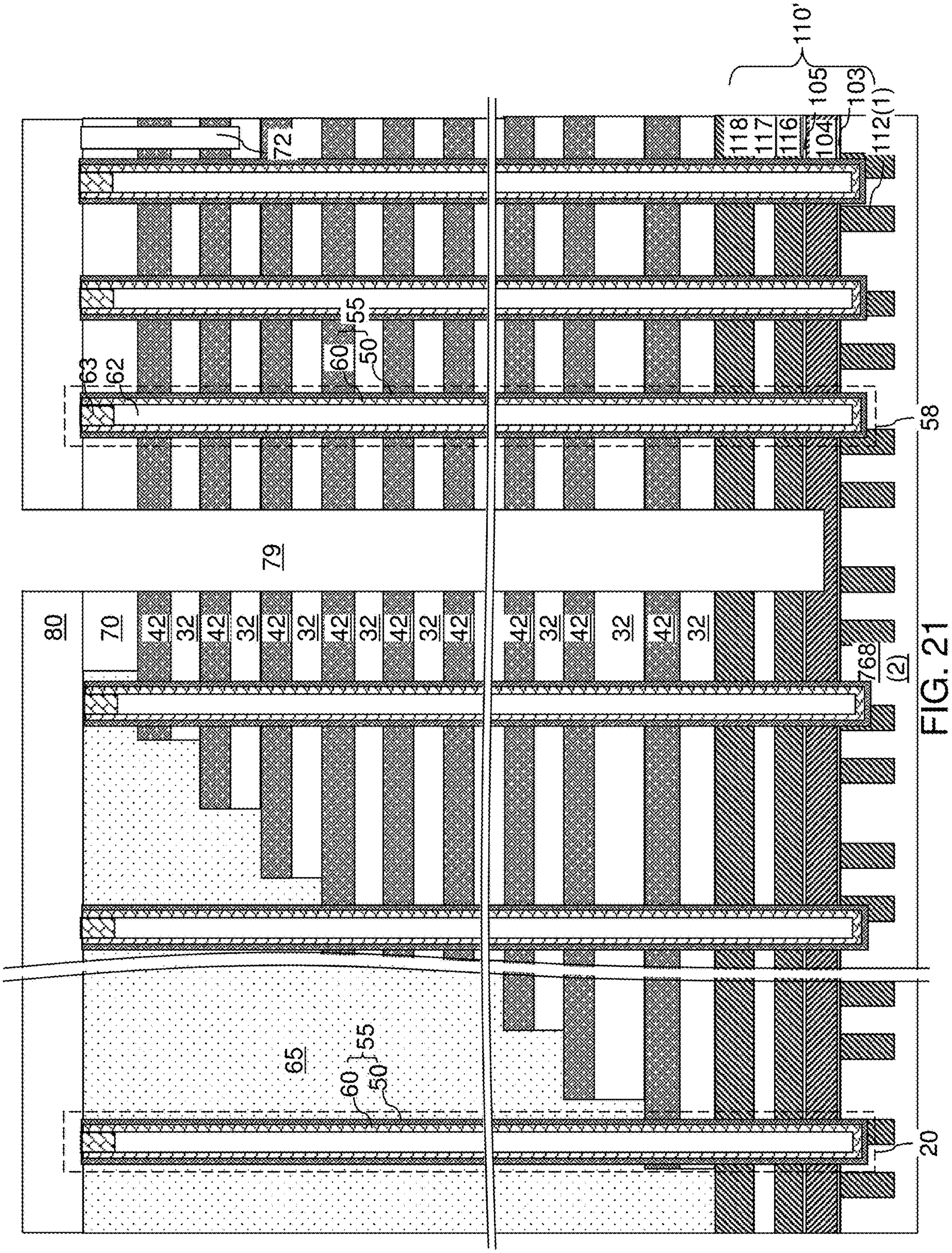
FIG. 21 is a vertical cross-sectional view of a region of the fourth exemplary structure after formation of backside trenches according to an embodiment of the present disclosure.

Referring to FIG. 21, a contact-level dielectric layer 80 can be formed above the alternating stack (32, 42), and backside trenches 79 can be formed through the contact-level dielectric layer 80, the alternating stack (32, 42), the retro-stepped dielectric material portion and through the upper sacrificial liner 105, the upper source-level semiconductor layer 116, the source-level insulating layer 117, and the optional source-select-level conductive layer 118 so that a surface of the source-level sacrificial layer 104 is physically exposed at the bottom of each backside trench 79.

Figure 22:
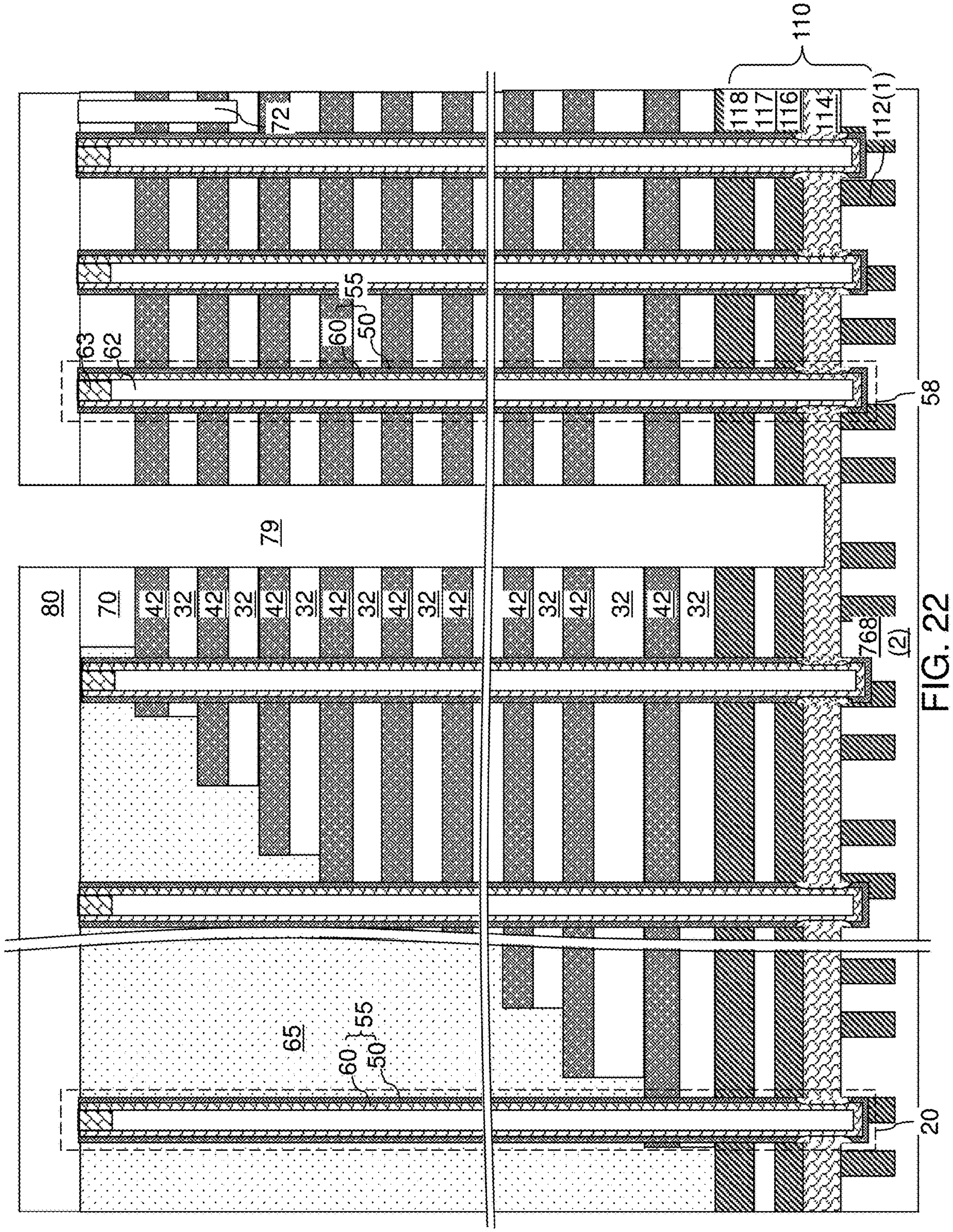
FIG. 22 is a vertical cross-sectional view of a region of the fourth exemplary structure after replacement of a source-level sacrificial layer with a source contact layer according to an embodiment of the present disclosure.

Referring to FIG. 22, the source-level sacrificial layer 104, the lower sacrificial liner 103, the upper sacrificial liner 105, and surface portions of the memory films 50 are removed to form a source cavity to physically expose cylindrical surface segments of the vertical semiconductor channels 60. A doped semiconductor material can be deposited in the source cavity, i.e., in the volumes from which the source-level sacrificial layer 104, the lower sacrificial liner 103, the upper sacrificial liner 105, and surface portions of the memory films are removed. A source contact layer 114 can be formed in the source cavity. The combination of the auxetic lower source-level semiconductor layer 112 (which is a perforated doped semiconductor material layer), the source contact layer 114, the upper source-level semiconductor layer 116, the source-level insulating layer 117, and the optional source-select-level conductive layer 118 constitutes source-level material layers 110.

Figure 23:
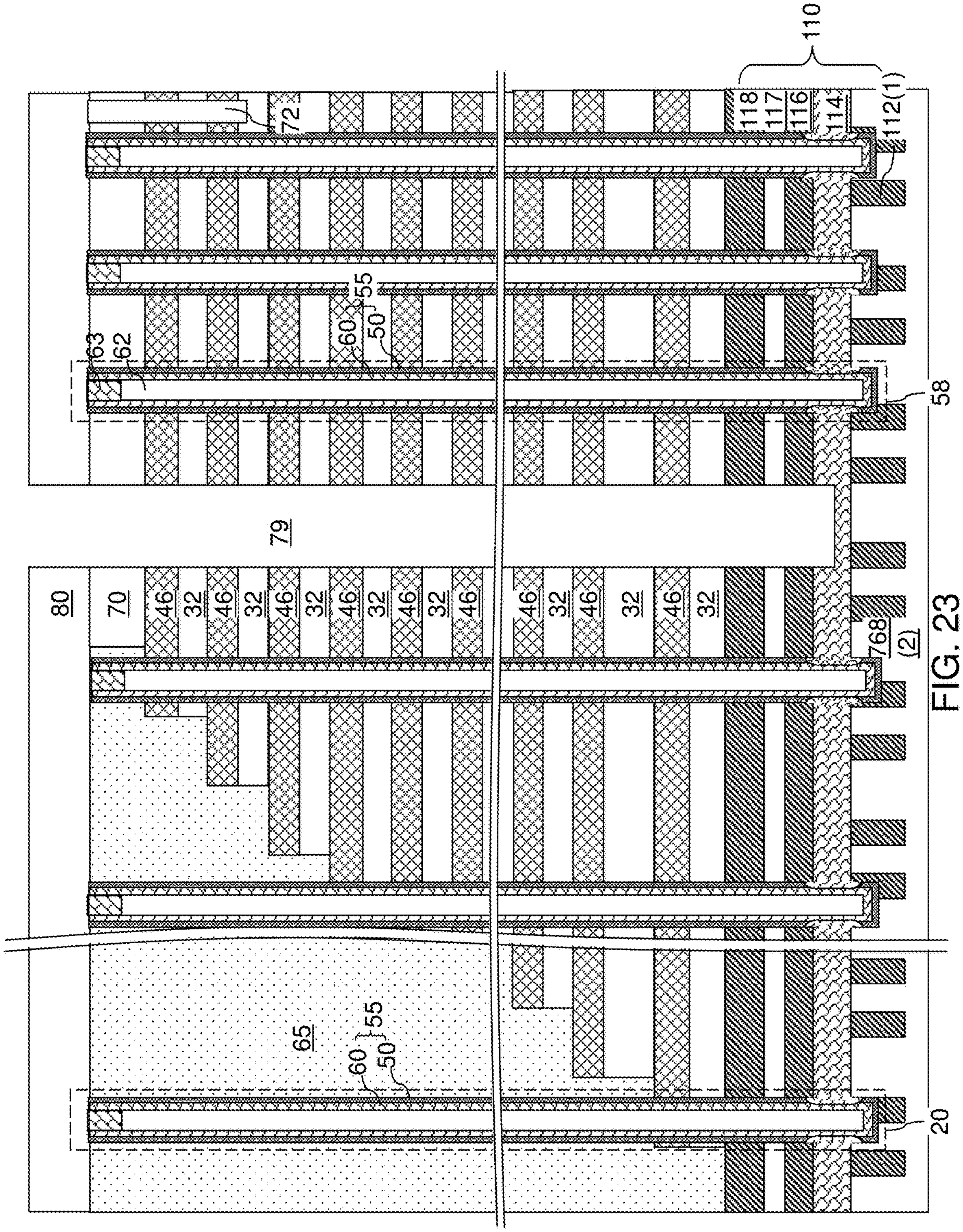
FIG. 23 is a vertical cross-sectional view of a region of the fourth exemplary structure after formation of electrically conductive layers according to an embodiment of the present disclosure.

Referring to FIG. 23, the processing steps described with reference to FIGS. 11 and 12 can be performed to replace the sacrificial material layers 42 with electrically conductive layers 46.

Figure 24A:
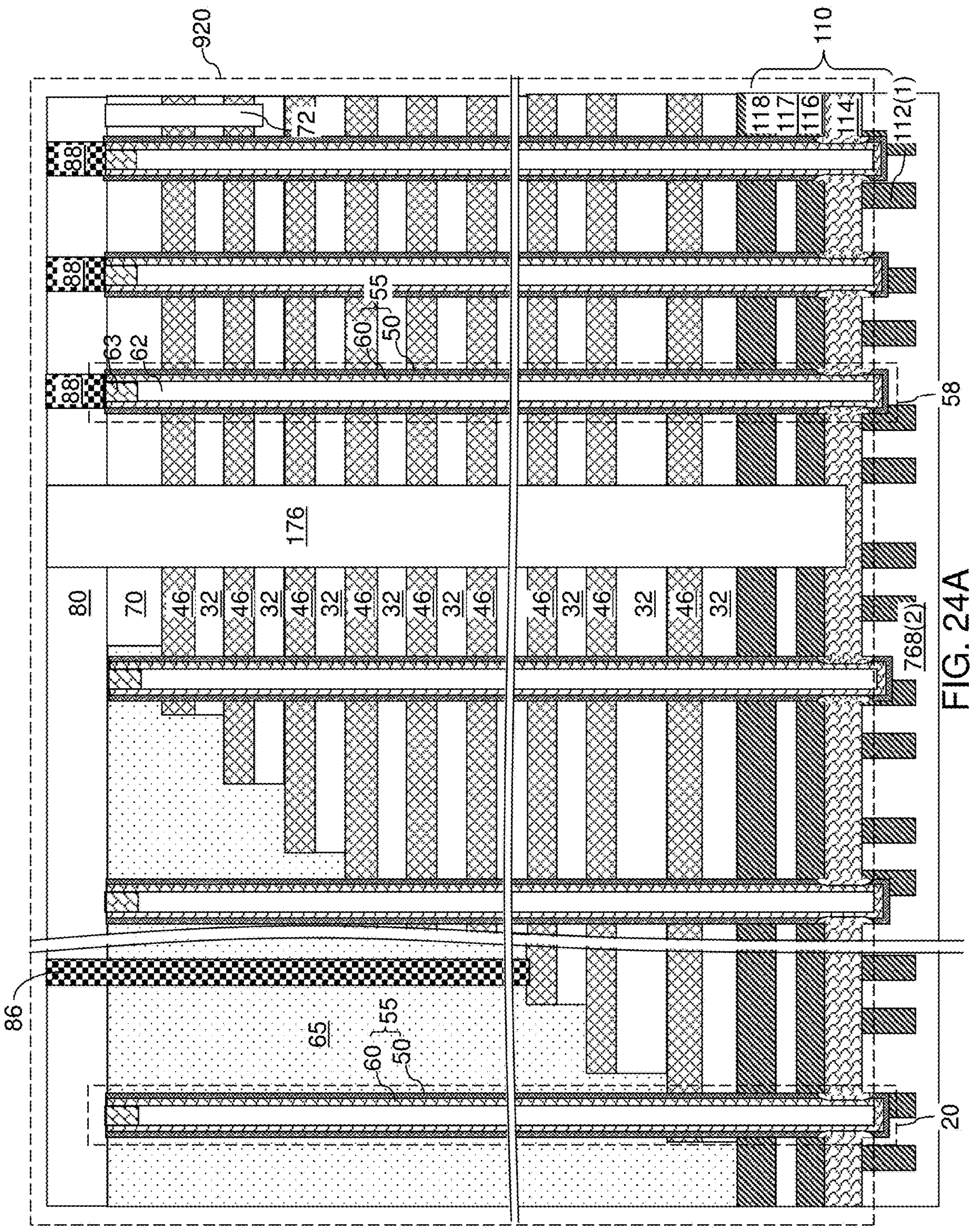
FIG. 24A is a vertical cross-sectional view of a region of the fourth exemplary structure after formation of backside trench fill structures according to an embodiment of the present disclosure.
Figure 24B:
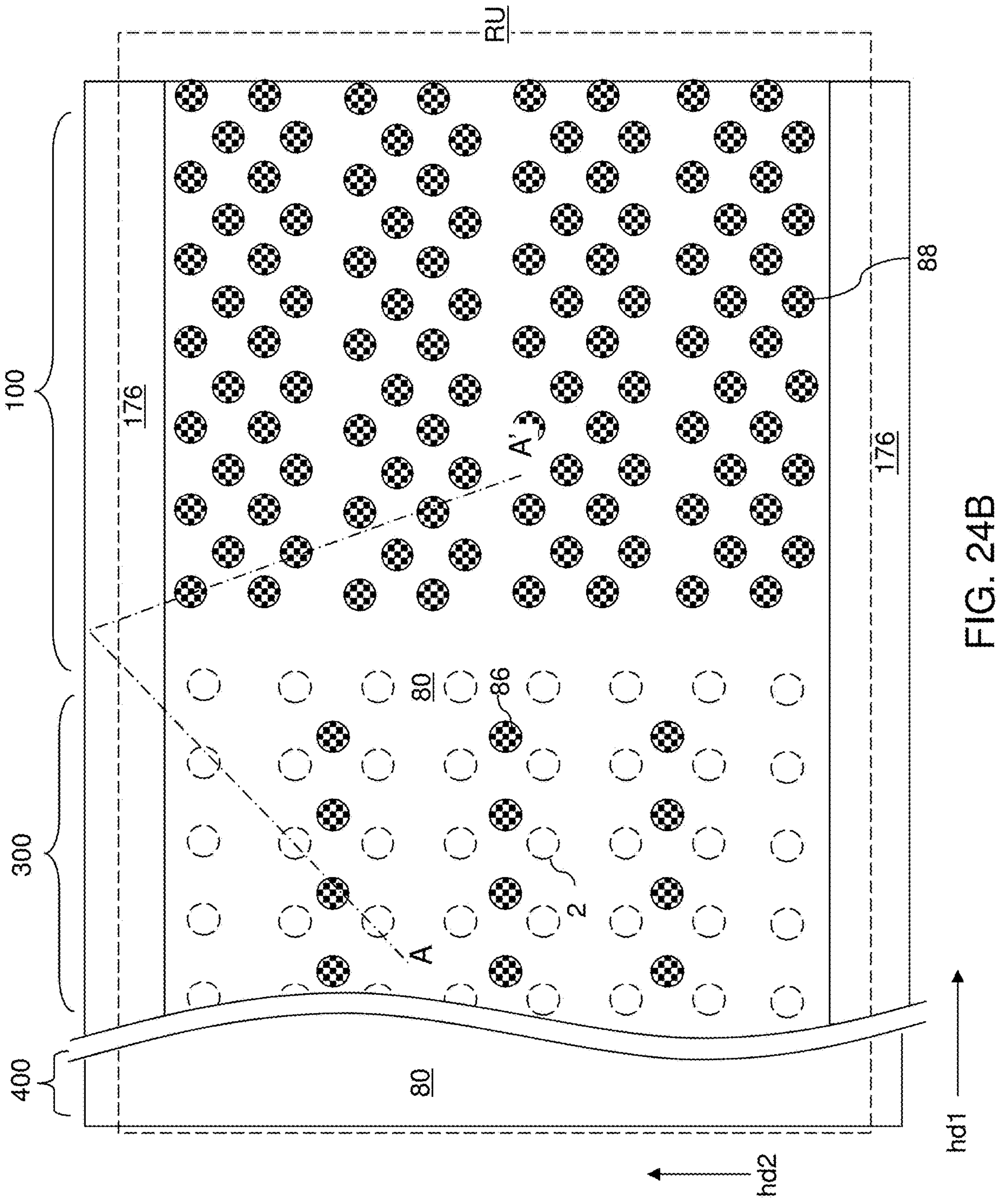
FIG. 24B is a top-down view of the region of the fourth exemplary structure of FIG. 24A.

Referring to FIG. 24, a backside trench fill structure 176 may be formed in each backside trench 79. Various contact via structures described with reference to FIGS. 14A and 14B may be formed. Thus, a three-dimensional memory device 920 is formed over the perforated doped semiconductor material layer 112.

Figure 25:
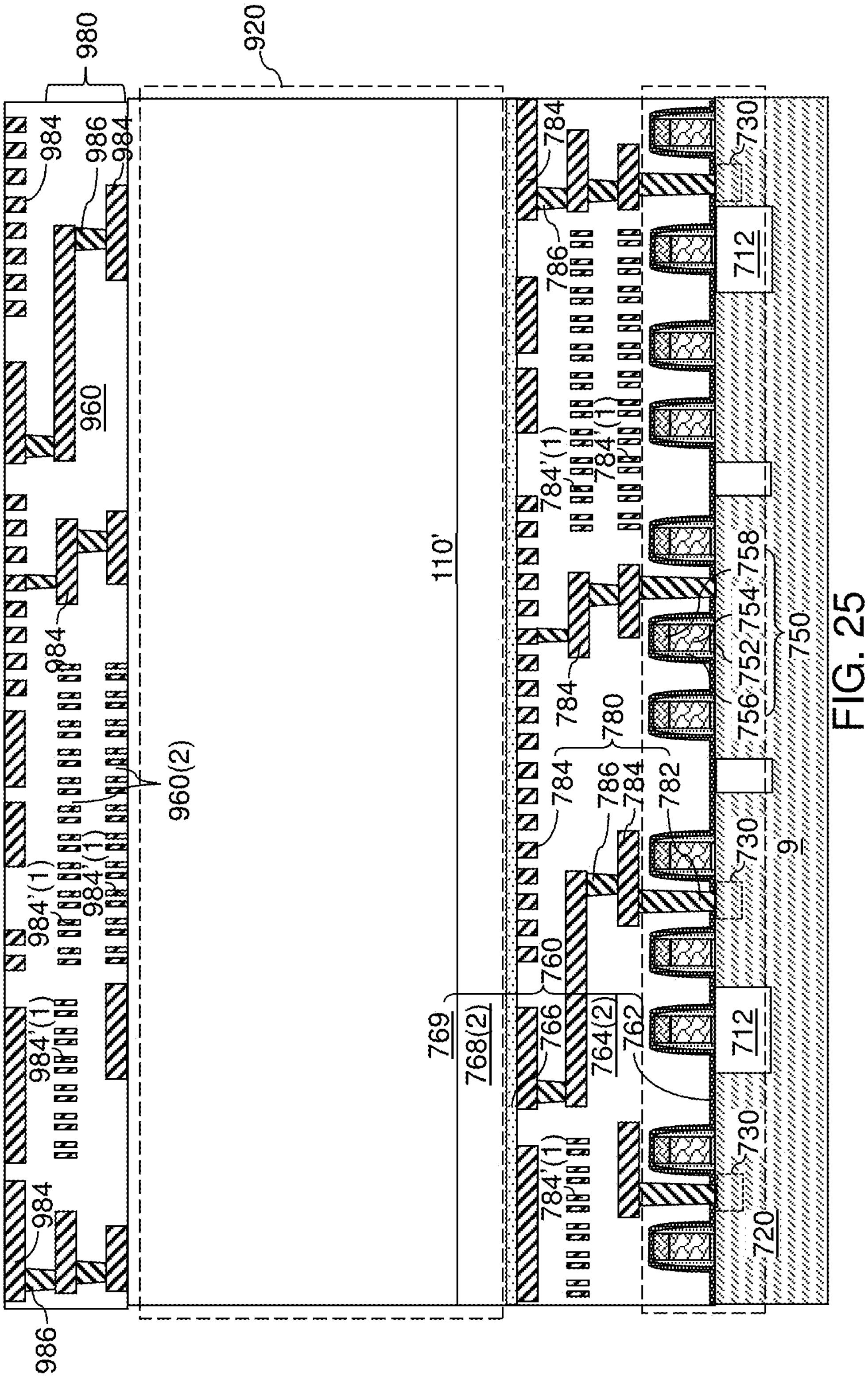
FIG. 25 is a vertical cross-sectional view of a fifth exemplary structure including auxetic dummy metal structures according to an embodiment of the present disclosure.

Referring to FIG. 25, a fifth exemplary structure according to an embodiment of the present disclosure may be derived from the fourth exemplary structure, the third exemplary structure, the second exemplary structure, the first exemplary structure, or any variant therefrom in which one or more of the auxetic structures are omitted. Generally, dielectric material layers are formed over a substrate 9 and over semiconductor devices (such as a three-dimensional memory device 920) overlying the substrate 9.

The dielectric material layers are herein referred to as upper-level dielectric material layers 960. The upper-level dielectric material layers 960 function as a matrix for upper-level metal interconnect structures 980 that provide electrical wiring to and from the various nodes of underlying semiconductor devices. The upper-level metal interconnect structures 980 are formed within the dielectric layer stack of the upper-level dielectric material layers 960, and comprise an upper-level metal line structure.

Each dielectric material layer selected from the upper-level dielectric material layers 760 may include any of doped silicate glass, undoped silicate glass, organosilicate glass, silicon nitride, silicon oxynitride, and dielectric metal oxides (such as aluminum oxide). In one embodiment, the upper-level dielectric material layers 760 may comprise, or consist essentially of, dielectric material layers having dielectric constants that do not exceed the dielectric constant of undoped silicate glass (silicon oxide) of 3.9. The upper-level metal interconnect structures 980 may include upper-level metal line structures 984 (which are also referred to as metal lines), and upper-level metal via structures 986 (which are also referred to as metal via structures).

According to an embodiment of the present disclosure, at least one perforated metal plate 984' may be formed in any of the metal line levels, i.e., at the same vertical distance as a respective one of the upper-level metal line structures 984. Each of the at least one perforated metal plate 984' comprise openings such that each perforated metal plate 984' in one embodiment comprises a continuous material portion that has an auxetic pattern. As such, each perforated metal plate 984' comprises an auxetic matrix 1 having an auxetic pattern. According to an aspect of the present disclosure, the auxetic pattern may be a microauxetic pattern having a first periodicity along a first horizontal direction that is less than 1 mm and having a second periodicity along a second horizontal direction that is less than 1 mm. However, larger dimensions may also be used. Generally, any auxetic pattern, periodic or non-periodic, may be employed for the pattern in each perforated metal plate 984'. The perforated metal plates 984' may have a same material composition as, and may have the same vertical thickness as, the metal lines located at a same level. In this case, portions of the upper-level dielectric material layers 960 that fill the openings in the perforated metal plates 984 constitute fill material portions 2.

In this embodiment, an auxetic matrix 1 comprises a first material (such as an electrically conductive material of the perforated metal plate 984') with a plurality of openings therethrough can be formed over the substrate 9. A predominant fraction (i.e., more than 50%) of the plurality of openings has a respective maximum lateral dimension less than 1 mm. However, larger dimensions may also be used. The auxetic matrix 1 is formed by forming and patterning a material layer (e.g., by depositing and patterning a metal layer) over the substrate 9. A plurality of fill material portions 2 (comprising vertically-extending portions of the upper-level dielectric material layers 960) comprising a second material (such as a dielectric material) can be formed after or prior to formation of the auxetic matrix 1. The plurality of fill material portions 2 are embedded within a respective one of the plurality of openings in the auxetic matrix 1. A Poission's ratio for the auxetic matrix 1 as calculated by a ratio of a negative of a linear deformation distance per unit length along a second horizontal direction to a linear deformation distance per unit length along a first horizontal direction that is perpendicular to the second horizontal direction is negative.

Figure 26A:
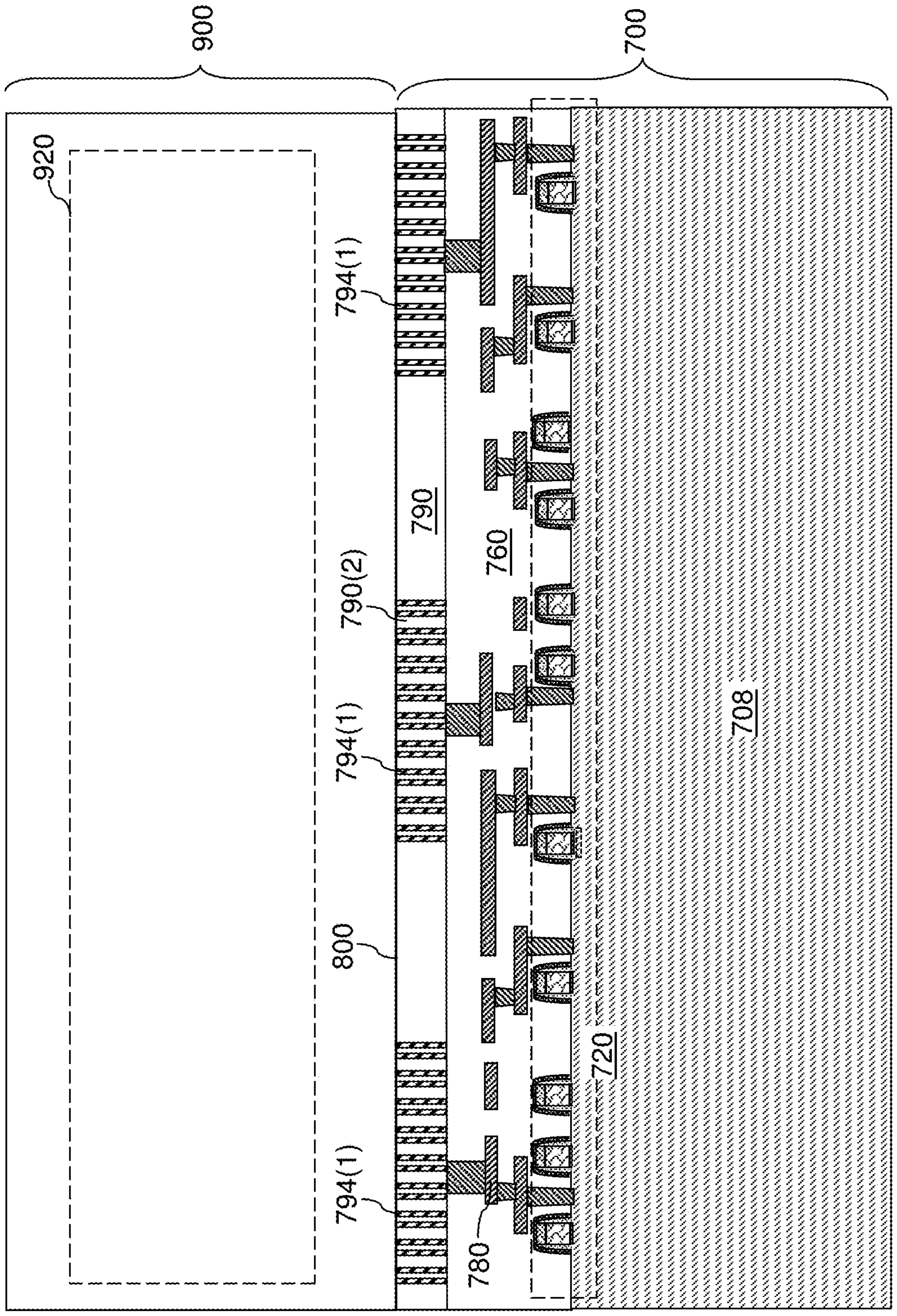
FIG. 26A is a vertical cross-sectional view of a sixth exemplary structure including auxetic bonding pads according to an embodiment of the present disclosure.
Figure 26B:
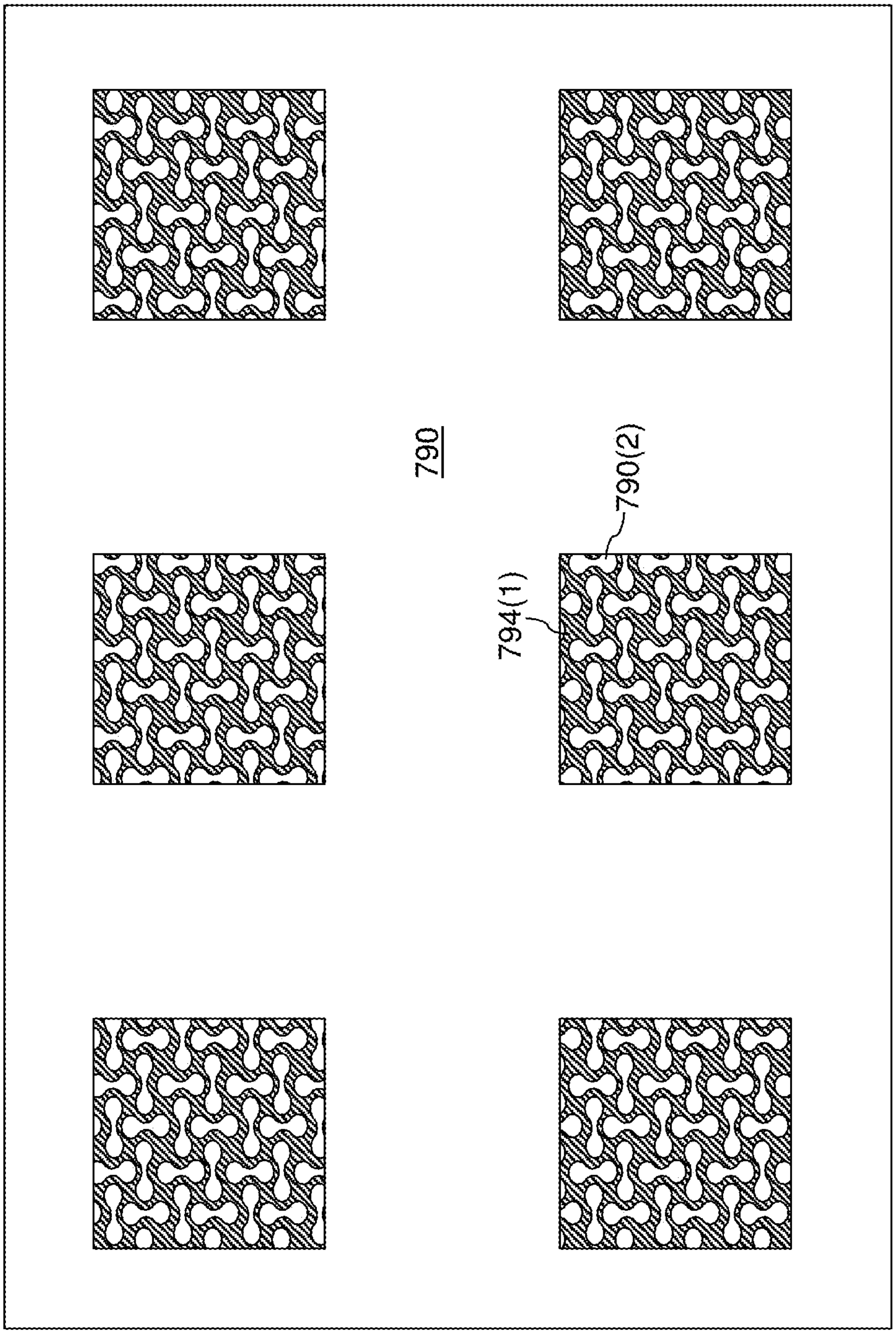
FIG. 26B is a top-down view of the sixth exemplary structure of FIG. 26A.

Referring to FIGS. 26A and 26B, a sixth exemplary structure including a semiconductor die 700 (e.g., a logic die containing peripheral or driver circuit semiconductor devices 720) is illustrated according to an embodiment of the present disclosure. The sixth exemplary structure may be derived from any of the previously described exemplary structures or any derivative from which at least one auxetic structure is omitted by forming auxetic bonding pads embedded within a bonding-level dielectric layer 790.

Generally, semiconductor devices 720 can be formed on the semiconductor substrate 9, and metal interconnect structures 780 can be formed, which are embedded within dielectric material layers 760 that overlie the semiconductor devices 720 and electrically connected to the semiconductor devices 720. Auxetic bonding pads, comprising perforated bonding pads 794 including perforations therein, are formed at a top level of the dielectric material layers 760. The dielectric material layer located at the top level is herein referred to as the bonding-level dielectric layer 790.

According to an embodiment of the present disclosure, at least one perforated bonding pad 794 may be formed at a bonding pad level. Each of the at least one perforated bonding pad 794 comprise openings such that each perforated bonding pad 794 has an auxetic pattern. As such, each perforated bonding pad 794 comprises an auxetic matrix 1 having an auxetic pattern. The perforated bonding pad 794 may comprise a continuous structure. According to an aspect of the present disclosure, the auxetic pattern may be a microauxetic pattern having a first periodicity along a first horizontal direction that is less than 1 mm and having a second periodicity along a second horizontal direction that is less than 1 mm. Generally, any auxetic pattern, periodic or non-periodic, may be employed for the pattern in each perforated bonding pad 794. However, larger dimensions may also be used.

In some embodiments, non-perforated metal bonding pads (not shown) may be formed concurrently with formation of the perforated bonding pads 794. In this case, the non-perforated bonding pads and the perforated bonding pads 794 may have a same material composition (e.g., copper) and a same thickness. The perforated bonding pads 794 may be employed for metal-to-metal bonding with other perforated bonding pads or non-perforated bonding pads provided in another semiconductor die. For example, the bonding pads in the logic die 700 may be bonded at a bonding interface 800 to opposing bonding pads in the memory die 900 containing the three-dimensional memory device 920, as shown in FIG. 26A.

In this embodiment, the auxetic matrix 1 comprises a first material (such as the electrically conductive material (e.g., copper) of the perforated bonding pad 794). The auxetic matrix may comprise a continuously extending structure with a plurality of openings therethrough. A predominant fraction of the plurality of openings has a respective maximum lateral dimension less than 1 mm. However, larger dimensions may also be used. A plurality of fill material portions 2 (comprising vertically-extending discrete portions of the bonding-level dielectric layer 790) comprising a second material are embedded within a respective one of the plurality of openings in the auxetic matrix 1. A substrate 9 underlies the auxetic matrix 1. A Poission's ratio for the auxetic matrix 1 as calculated by a ratio of a negative of a linear deformation distance per unit length along a second horizontal direction to a linear deformation distance per unit length along a first horizontal direction that is perpendicular to the second horizontal direction is negative. In the sixth exemplary structure, an auxetic matrix 1 comprises a perforated bonding pads 794, and a plurality of fill material portions 2 comprises portions of a dielectric material in a topmost one of the dielectric material layers such as the bonding-level dielectric layer 790.

Referring to FIGS. 2A to 26B and to all embodiments, a semiconductor structure comprises a semiconductor device substrate 9 and an auxetic microstructure 3 comprising an auxetic matrix 1 having a negative Poission's ratio.

In one embodiment, the auxetic matrix 1 comprises a continuously extending structure with a plurality of openings (e.g., 99, 19 etc.) therethrough, and a predominant fraction of the plurality of openings has a respective maximum lateral dimension less than 1 mm. However, larger dimensions may also be used. In one embodiment, the semiconductor structure further comprises at least one of a plurality of fill material portions 2 and/or cavities 91 embedded within the plurality of openings in the auxetic matrix 1. In one embodiment, the auxetic matrix 1 comprises a first material and the fill material portions 2 comprise a second material different from the first material.

In the first embodiment illustrated in FIGS. 2A to 3D, the semiconductor device substrate 9 comprises a semiconductor substrate 9S containing the auxetic matrix 1. The auxetic matrix 1 comprises a protruding portion of the semiconductor substrate 9S, and the plurality of fill material portions 2 comprise dielectric material portions 9F located in the openings within the protruding portion of semiconductor substrate 9S.

In the first configuration of the first embodiment of FIGS. 2A to 2H, semiconductor devices (920 and/or 720) are located over a top side 9T of the semiconductor substrate 9S and the auxetic matrix 1 is located in the top side 9T of the semiconductor substrate 9S. In the second configuration of the first embodiment of FIGS. 3A to 3D, the semiconductor devices (920 and/or 720) are located over the top side 9T of the semiconductor substrate 9S, and the auxetic matrix is located in a bottom side 9B of the semiconductor substrate 9S which is opposite to the top side 9T of the semiconductor substrate 9S.

In the second through sixths embodiments of FIGS. 4 to 26B, semiconductor devices (720 or 920) are located over the semiconductor device substrate 9. In the second embodiment of FIGS. 4 to 14B, the auxetic matrix 1 is embedded in the semiconductor devices 920.

In one aspect of the second embodiment, the semiconductor devices 920 comprise a three-dimensional memory array comprising an alternating stack of insulating layers 32 and electrically conductive layers 46, memory openings 49 vertically extending through the alternating stack, and memory opening fill structures 58 located in the memory openings 49. Each of the memory opening fill structures 58 comprises a respective vertical semiconductor channel 60 and a respective vertical stack of memory elements (e.g., portions of the memory film 50). The auxetic matrix 1 comprises a perforated retro-stepped dielectric material portion 65 located over stepped surfaces of the alternating stack, and the plurality of fill material portions 2 comprises support pillar structures 20 vertically extending through the perforated retro-stepped dielectric material portion 65 at least from a horizontal plane including a topmost surface of the alternating stack and at least to a horizontal plane including a bottommost surface of the alternating stack. Optionally, the auxetic matrix 1 further comprises perforated portions of the electrically conductive layers 46 and/or insulating layers 32 that underlie the retro-stepped dielectric material portion 65.

In the third embodiment illustrated in FIGS. 15A and 15B, the auxetic matrix 1 comprises a perforated metal plate 784' embedded within dielectric material layers 780 and located between the semiconductor device substrate 9 and the alternating stack of insulating layers and electrically conductive layers (32, 46).

In the fourth embodiment illustrated in FIGS. 16A to 24B, the auxetic matrix 1 comprises a perforated source-level semiconductor layer 112 located between the semiconductor substrate 9 and the alternating stack (32, 46).

In the fifth embodiment of FIG. 25, the auxetic matrix 1 comprises a perforated metal plate 984' embedded within dielectric material layers 960 and located above the alternating stack of insulating layers and electrically conductive layers (32, 46). Metal interconnect structures 984 are also embedded within the dielectric material layers 960 and electrically connected to a respective one of the semiconductor devices 920, wherein a top surface of the perforated metal plate 984' is located within a same horizontal plane as a top surface of one of the metal interconnect structures 984.

In the sixth embodiment of FIGS. 26A and 26B, the auxetic matrix 1 comprises perforated bonding pads 794 embedded within dielectric material layers 790 located at an bonding interface 800 between the logic die 700 and the memory die 900.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:

a semiconductor device substrate comprising a semiconductor material having electrical conductivity in the range from $1.0\times10^{-6}$ S/cm to $1.0\times10^{5}$ S/cm; and an auxetic microstructure located in or over the semiconductor device substrate and comprising an auxetic matrix having a negative Poisson's ratio;

wherein:

the semiconductor device substrate comprises a semiconductor substrate containing the semiconductor material and the auxetic matrix, and the auxetic matrix comprises a portion of the semiconductor material;

the auxetic matrix comprises a protruding portion of the semiconductor material in the semiconductor substrate; and the plurality of fill material portions comprise dielectric material portions located in the openings within the protruding portion of the semiconductor material in the semiconductor substrate.

2. A semiconductor structure, comprising:

a semiconductor device substrate comprising a semiconductor material having electrical conductivity in the range from $1.0\times10^{-6}$ S/cm to $1.0\times10^{5}$ S/cm;

an auxetic microstructure located in or over the semiconductor device substrate and comprising an auxetic matrix having a negative Poisson's ratio; and semiconductor devices located over a top side of the semiconductor device substrate, wherein the auxetic matrix comprises a portion of the semiconductor material and is located in a bottom side of the semiconductor device substrate which is opposite to the top side of the semiconductor device substrate.

3. A semiconductor structure, comprising:

a semiconductor device substrate comprising a semiconductor material having electrical conductivity in the range from $1.0\times10^{-6}$ S/cm to $1.0\times10^{5}$ S/cm;

an auxetic microstructure located in or over the semiconductor device substrate and comprising an auxetic matrix having a negative Poisson's ratio; and a three-dimensional memory array located on the semiconductor device substrate and comprising:

an alternating stack of insulating layers and electrically conductive layers;

memory openings vertically extending through the alternating stack; and memory opening fill structures located in the memory openings, wherein each of the memory opening fill structures comprises a respective vertical semiconductor channel and a respective vertical stack of memory elements, wherein the auxetic matrix is embedded within the three-dimensional memory array.

4. The semiconductor structure of claim 3, wherein:

the auxetic matrix comprises a perforated retro-stepped dielectric material portion having an auxetic pattern located over stepped surfaces of the alternating stack of insulating layers and electrically conductive layers;

the plurality of fill material portions comprises support pillar structures vertically extending through the perforated retro-stepped dielectric material portion and the alternating stack at least from a horizontal plane including a topmost surface of the alternating stack and at least to a horizontal plane including a bottommost surface of the alternating stack; and the auxetic matrix is configured to reduce saddle-shaped substrate warpage along a vertical direction by providing opposite signs of stresses along a first horizontal direction and a second horizontal direction.

5. The semiconductor structure of claim 4, wherein:

the auxetic matrix further comprises perforated portions of the electrically conductive layers that underlie the retro-stepped dielectric material portion in the alternating stack;

the perforated portions of the electrically conductive layers comprise an auxetic pattern configured to reduce saddle-shaped substrate warpage along a vertical direction by providing opposite signs of stresses along a first horizontal direction and a second horizontal direction; and the support pillar structures vertically extend through the perforated portions of the electrically conductive layers, the perforated retro-stepped dielectric material portion, and the alternating stack at least from a horizontal plane including a topmost surface of the alternating stack and at least to a horizontal plane including a bottommost surface of the alternating stack.

6. The semiconductor structure of claim 3, wherein:

the auxetic matrix comprises a perforated source-level semiconductor layer comprising an auxetic pattern of the semiconductor material and between the semiconductor device substrate and the alternating stack of insulating layers and electrically conductive layers;

the memory openings vertically extend through the perforated source-level semiconductor layer and the alternating stack; and the auxetic matrix is configured to reduce saddle-shaped substrate warpage along a vertical direction by providing opposite signs of stresses along a first horizontal direction and a second horizontal direction.

7. The semiconductor structure of claim 3, wherein:

the auxetic matrix comprises a perforated metal plate comprising a first material with a plurality of openings therethrough and having an auxetic pattern embedded within dielectric material layers comprising a second material different from the first material and located between the semiconductor device substrate comprising the semiconductor material and the alternating stack of insulating layers and electrically conductive layers; and the memory openings vertically extend through the alternating stack located over the auxetic matrix; the auxetic matrix is configured to reduce saddle-shaped substrate warpage along a vertical direction by providing opposite signs of stresses along a first horizontal direction and a second horizontal direction.

8. The semiconductor structure of claim 3, wherein:

the auxetic matrix comprises a perforated metal plate comprising a first material with a plurality of openings therethrough and having an auxetic pattern embedded within dielectric material layers comprising a second material different from the first material and located above the alternating stack of insulating layers and electrically conductive layers;

metal interconnect structures are embedded within the dielectric material layers and electrically connected to a respective one of the semiconductor devices;

a top surface of the perforated metal plate is located within a same horizontal plane as a top surface of one of the metal interconnect structures; and the auxetic matrix is configured to reduce saddle-shaped substrate warpage along a vertical direction by providing opposite signs of stresses along a first horizontal direction and a second horizontal direction.

9. The semiconductor structure of claim 3, wherein:

the auxetic matrix comprises perforated bonding pads comprising a first material with a plurality of openings therethrough and having an auxetic pattern embedded within dielectric material layers comprising a second material different from the first material located at a bonding interface between a logic die and a memory die containing the three-dimensional memory array; the perforated bonding pads are electrically connected to a respective one of the semiconductor devices in the memory die; and the auxetic matrix is configured to reduce saddle-shaped substrate warpage along a vertical direction by providing opposite signs of stresses along a first horizontal direction and a second horizontal direction.

10. The semiconductor structure of claim 3, wherein:

the auxetic matrix comprises a continuously extending structure with a plurality of openings therethrough and having an auxetic pattern located in or over the semiconductor device substrate comprising the semiconductor material;

the auxetic matrix is configured to reduce saddle-shaped substrate warpage along a vertical direction by providing opposite signs of stresses along a first horizontal direction and a second horizontal direction; and the alternating stack of insulating layers and electrically conductive layers is located over the auxetic matrix, and the memory openings vertically extend through the alternating stack.

11. The semiconductor structure of claim 3, wherein:

the auxetic matrix comprises a continuously extending structure with a plurality of openings therethrough and having an auxetic pattern located over the semiconductor device substrate;

a plurality of fill material portions comprising a material different from a material of the continuously extending structure are embedded within the plurality of openings;

the alternating stack of insulating layers and electrically conductive layers is located over the auxetic matrix, and the memory openings vertically extend through the alternating stack; and the auxetic matrix is configured to reduce saddle-shaped substrate warpage along a vertical direction by providing opposite signs of stresses along a first horizontal direction and a second horizontal direction.

* * * * *